(12) United States Patent
Hara et al.

(10) Patent No.: US 7,781,964 B2
(45) Date of Patent: Aug. 24, 2010

(54) ORGANIC ELECTROLUMINESCENT DEVICE AND ELECTRONIC APPARATUS

(75) Inventors: Hiroyuki Hara, Chino-shi (JP); Sumio Utsunomiya, Suwa (JP); Daisuke Abe, Suwa (JP); Masayoshi Todorokihara, Suwa-gun (JP); Kazuyuki Miyashita, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 834 days.

(21) Appl. No.: 11/684,944

(22) Filed: Mar. 12, 2007

(65) Prior Publication Data

US 2007/0216280 A1    Sep. 20, 2007

(30) Foreign Application Priority Data

| Mar. 14, 2006 | (JP) | 2006-069827 |
| Mar. 16, 2006 | (JP) | 2006-072040 |
| Apr. 21, 2006 | (JP) | 2006-118220 |
| Dec. 27, 2006 | (JP) | 2006-352679 |

(51) Int. Cl.
*H01J 1/62* (2006.01)

(52) U.S. Cl. .................. 313/509; 313/505; 313/504

(58) Field of Classification Search ......... 313/498–512; 315/169.1, 169.3; 427/58, 64, 66, 532–535, 427/539; 428/690–691, 917; 438/26–29, 438/34, 82; 257/40, 72, 98–100, 642–643, 257/759

See application file for complete search history.

(56) References Cited

U.S. PATENT DOCUMENTS

2005/0116237 A1 * 6/2005 Voutsas .................. 257/79

(Continued)

FOREIGN PATENT DOCUMENTS

JP    A 2002-189429    7/2002

(Continued)

OTHER PUBLICATIONS

Shin, Hyun Soo et al. "54.4: 4.1 inch Top-Emission AMOLED on Flexible Metal Foil," SID 05 Digest, pp. 1642-1645 (2005).

(Continued)

*Primary Examiner*—Peter J Macchiarolo
*Assistant Examiner*—Donald L Raleigh
(74) *Attorney, Agent, or Firm*—Oliff & Berridge, PLC

(57) ABSTRACT

An organic electroluminescent device includes a substrate that is conductive at least on a first surface; a first insulating film located on the first surface of the substrate and including a portion of a first opening, a portion of a second opening, and a portion of a third opening; a semiconductor film located on the first insulating film and receiving a current from the first surface of the substrate via the portion of a first opening; a second insulating film located on the semiconductor film and in contact with the substrate via the portion of a second opening; a capacitance electrode located on the second insulating film; a gate electrode located on the second insulating film and overlapping the semiconductor film; an intermediate insulating film located on the gate electrode and capacitance electrode; a pixel electrode located on the intermediate insulating film and receiving a current via the semiconductor film; a light-emitting layer located on the pixel electrode; a common electrode located on the light-emitting layer; and a power supply section located on the first insulating film and supplying a current to the first surface of the substrate via the portion of a third opening. The second insulating film is interposed between the capacitance electrode and the substrate via the portion of a second opening.

16 Claims, 30 Drawing Sheets

U.S. PATENT DOCUMENTS

2006/0102900 A1 * 5/2006 Shin et al. .................. 257/59

FOREIGN PATENT DOCUMENTS

| | | |
|---|---|---|
| JP | A 2005-292580 | 10/2005 |
| JP | A 2005-294629 | 10/2005 |

OTHER PUBLICATIONS

Wu, Ming et al. "Complementary Metal-Oxide-Semiconductor Thin-Film Transistor Circuits From a High-Temperature Polycrystalline Silicon Process on Steel Foil Substrates," IEEE Trans. Electron Devices, vol. 49, No. 11, pp. 1993-2000 (Nov. 2002).

Serikawa, Tadashi et al. "High-Quality Polycrystalline Si TFTs Fabricated on Stainless-Steel Foils by Using Sputtered Si Films," IEEE Trans. Electron Devices, vol. 49, No. 5, pp. 820-825 (May 2002).

* cited by examiner

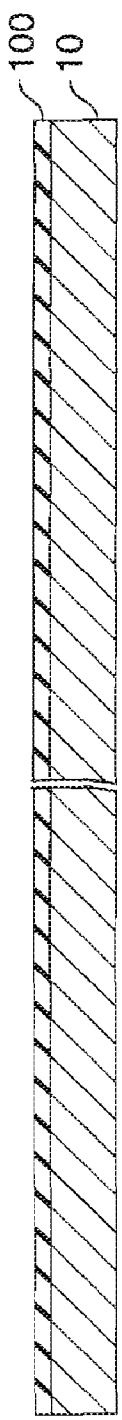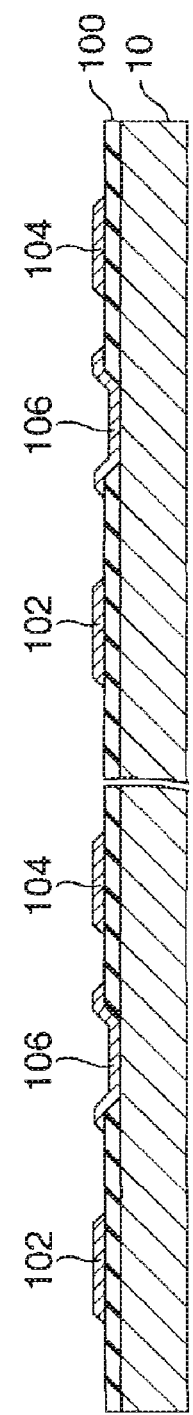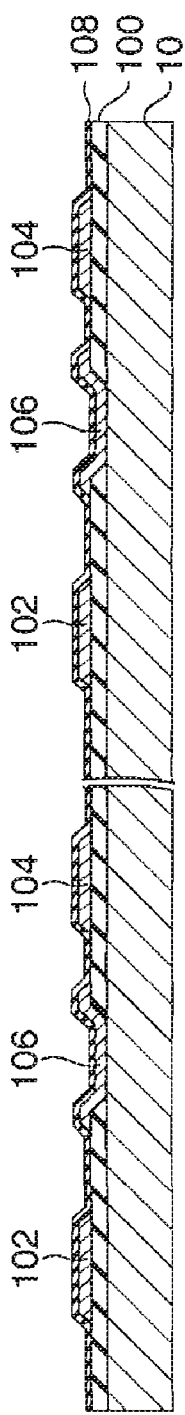

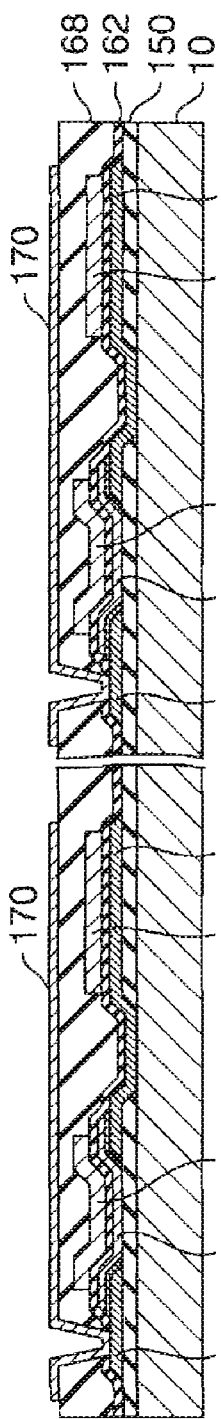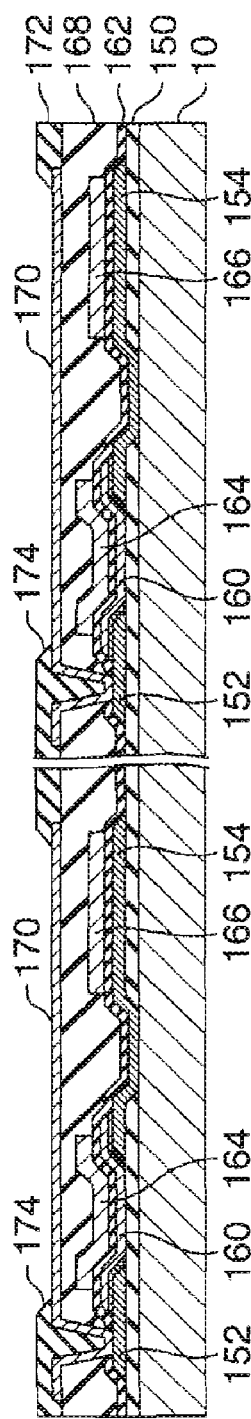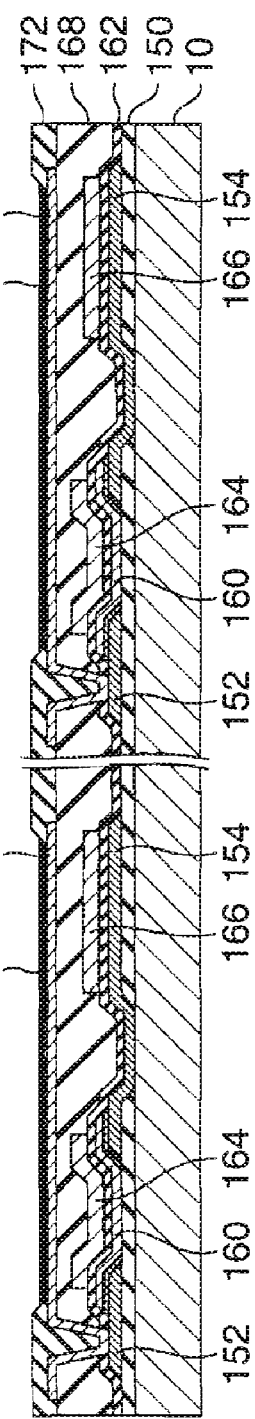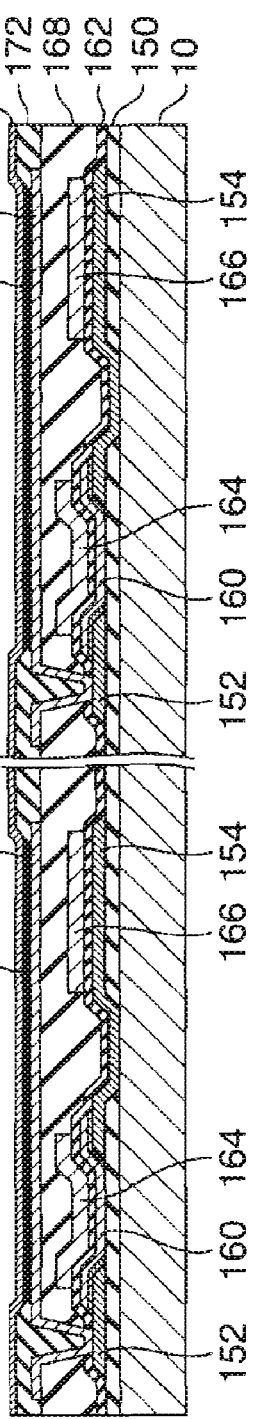

ORGANIC ELECTROLUMINESCENT DEVICE AND ELECTRONIC APPARATUS

TECHNICAL FIELD

Several aspects of the present invention relate to an organic electroluminescent (hereinafter referred to as "EL") device having a plurality of organic EL elements formed on a substrate, a manufacturing method thereof, and an electronic apparatus.

RELATED ART

An organic EL device principally includes a circuit element substrate and an organic EL element (for example, see JP-A-2005-294629). The circuit element substrate includes a substrate, such as a glass substrate, wiring formed on this substrate, and a pixel circuit coupled to the wiring. The pixel circuit includes a plurality of pixel circuits. The wiring includes, for example, a plurality of scan lines, and a plurality of signal lines and a plurality of power supply lines arranged so as to intersect these scan lines. The "power supply lines" here are wiring for supplying power to the organic EL elements. The pixel circuits are disposed at intersections of the scan lines and signal lines. The pixel circuits serve to make the organic EL elements emit light by a voltage applied between the power supply lines and the electrodes of the organic EL elements (anode or cathode). Specifically, transistors included in the pixel circuits are coupled in series to the organic EL elements between the power supply lines and the electrodes of the organic EL elements. Adjusting a current to be supplied to the organic EL elements by means of these transistors allows the organic EL elements to emit light with desired brightness.

1. In many of the organic EL devices as described above, the pixel circuits include holding capacitance for holding a voltage to be applied to the transistors. One of the methods for forming such holding capacitance is disclosed in JP-A-2002-189429. Disclosed in JP-A-2002-189429 is a semiconductor device that includes a substrate having a metal surface, an insulating film formed on the substrate having a metal surface, and a pixel section formed on the insulating film. In this semiconductor device, the pixel section includes a TFT and wiring coupled to the TFT, and holding capacitance is formed by the substrate having a metal surface, the insulating film, and the wiring.

As methods for increasing the holding capacitance, JP-A-2002-189429 presents a reduction in the thickness of the insulating film serving as a dielectric material and securing of a wide capacitance forming region (area). However, the region where the capacitance can be formed is limited within the range surrounded by a scan line (gate wiring) and a signal line (source wiring). Therefore, an effective means for increasing the holding capacitance is to reduce the thickness of the insulating film. On the other hand, thinning the insulating film causes a non-negligible, substantial amount of parasitic capacitance between the conductive substrate and the wiring or the like disposed on the insulating film. To avoid this happening, it is desirable that a thicker insulating film lie between the substrate and the wiring or the like. Therefore, it is difficult to simultaneously satisfy two requirements: an increase in the holding capacitance and a reduction in the parasitic capacitance.

2. Moreover, in the organic EL device having the above described structure, multiple organic EL elements are coupled to one power supply line, so a relatively large current flows through the power supply line and thus the fall of potential occurs at various positions of the power supply line. This is because the organic EL element is of current drive type. For example, when power is supplied from one end of the power supply line, the fall of potential occurs due to wiring resistance in the power supply line. Therefore, a much less voltage is supplied to the organic EL elements at greater distances from the end of the power supply line. This fall of potential in the power supply line causes unevenness in the in-plane distribution of the luminescent brightness of the organic EL element. Such a disadvantage becomes more remarkable in an organic EL device with a larger area.

SUMMARY

An advantage of the invention is (1) to provide an organic EL device that achieves both an increase in holding capacitance and a reduction in parasitic capacitance, and a method for manufacturing the organic EL device.

Another advantage of the invention is (2) to provide an organic EL device that makes the in-plane distribution of the luminescent brightness of an organic EL element more even, and a method for manufacturing the organic EL device.

An organic electroluminescent device according to a first aspect of the invention includes a substrate that is conductive at least on a first surface thereof; a first insulating film located on the first surface of the substrate and including a portion of a first opening, a portion of a second opening, and a portion of a third opening; a semiconductor film located on the first insulating film and receiving a current from the first surface of the substrate via the portion of a first opening; a second insulating film located on the semiconductor film and in contact with the substrate via the portion of a second opening; a capacitance electrode located on the second insulating film, the capacitance electrode sandwiching the second insulating film with the substrate via the portion of a second opening; a gate electrode located on the second insulating film and overlapping the semiconductor film; an intermediate insulating film located on the gate electrode and capacitance electrode; a pixel electrode located on the intermediate insulating film and receiving a current via the semiconductor film; a light-emitting layer located on the pixel electrode; a common electrode located on the light-emitting layer; and a power supply section located on the first insulating film and supplying a current to the first surface of the substrate via the portion of a third opening.

1-1 An EL device according to a second aspect of the invention includes a substrate that is conductive at least on a first surface thereof; a first insulating film that is formed on the first surface of the substrate and includes an opening for partially exposing the first surface of the substrate; a semiconductor film that is formed on the first insulating film and covers a part of the first insulating film; a second insulating film that is formed on the first insulating film, covers the semiconductor film, and is in contact with the first surface of the substrate via the opening; a capacitance electrode that is formed above the opening and opposed to the substrate with the second insulating film therebetween; a gate electrode that is formed above the semiconductor film with the second insulating film therebetween; and an organic EL element that is formed on the second insulating film and electrically coupled to the semiconductor film.

1-2 An EL device according to a third aspect of the invention includes a substrate that is conductive at least on a first surface thereof; a first insulating film that is formed on the first surface of the substrate and includes an opening for partially exposing the first surface of the substrate; a gate electrode that is formed on the first insulating film and covers a part of the first insulating film; a second insulating film that is formed on the first insulating film, covers the gate electrode, and is in contact with the first surface of the substrate via the opening; a capacitance electrode that is formed above the opening and opposed to the substrate with the second insulating film therebetween; a semiconductor film that is formed on the gate electrode with the second insulating film therebetween; and an organic EL element that is formed on the second insulating film and electrically coupled to the semiconductor film.

According to these features, combining the first and second insulating films allows the functions required for the insulating film to be separated. Specifically, as for the first insulating film, it is possible to select the condition on the film thickness, dielectric constant, or the like suitable for reducing the parasitic capacitance while securing insulation between the substrate, and the transistors, organic EL elements, and the like. As for the second insulating film, it is possible to select the condition on the film thickness, dielectric constant, or the like suitable for increasing the capacitance when forming a capacitance element with the capacitance element between the conductive substrate and the capacitance electrode. Therefore, it is possible to achieve both an increase in the holding capacitance of the capacitance element and a reduction in the parasitic capacitance caused between the substrate, and the circuit element and the like.

In each aspect described above, the thickness of the second insulating film is preferably smaller than that of the first insulating film. Moreover, the dielectric constant of the second insulating film is preferably larger than that of the first insulating film.

These features make it possible to increase the capacitance of the capacitance element while securing sufficient insulation between the substrate, and the transistors and organic EL elements.

In each aspect describe above, the substrate preferably includes a conductive substrate (for example, stainless steel substrate).

As a result, a substrate suitable for this invention can be obtained. A conductive substrate has the advantages of relative flexibility and excellent mechanical strength.

As a substrate, an insulating substrate on whose first surface (or both surfaces) a conductive film is formed may be used.

As a result, it is possible to obtain a substrate suitable for the invention using an insulating substrate such as a glass substrate or a resin substrate.

1-3 A method for manufacturing an EL device according to a fourth aspect of the invention includes a first step for forming a first insulating film on a first surface of a conductive substrate; a second step for forming an opening for partially exposing the first surface of the substrate on the first insulating film; a third step for forming a semiconductor film for covering a part of the first insulating film on the first insulating film; a fourth step for forming a second insulating film on the first insulating film for covering the semiconductor film and making contact with the first surface of the substrate via the opening; a fifth step for forming a capacitance electrode above the opening so as to be opposed to the substrate with the second insulating film therebetween; a sixth step for forming a gate electrode on the second insulating film so as to be disposed above the semiconductor film with the second insulating film therebetween; and a seventh step for forming an organic EL element on the second insulating film so as to be electrically coupled to the semiconductor film.

According to this manufacturing method, it is possible to preferably manufacture the organic EL device in the aspect shown in 1-1.

1-4 A method for manufacturing an EL device according to a fifth aspect of the invention includes a first step for forming a first insulating film on a first surface of a conductive substrate; a second step for forming an opening for partially exposing the first surface of the substrate on the first insulating film; a third step for forming a gate electrode on the first insulating film so as to cover a part of the first insulating film; a fourth step for forming a second insulating film on the first insulating film so as to cover the gate electrode and to make contact with the first surface of the substrate via the opening; a fifth step for forming a semiconductor film on the second insulating layer so as to be disposed above the gate electrode with the second insulating film therebetween, a sixth step for forming a capacitance electrode above the opening so as to be opposed to the substrate with the second insulating film therebetween; and a seventh step for forming an organic EL element on the second insulating film so as to be electrically coupled to the semiconductor film.

According to this manufacturing method, it is possible to preferably manufacture the organic EL device in the aspect shown in 1-2.

2-1 An EL device according to a sixth aspect of the invention includes a substrate that is conductive at least on a first surface thereof, an insulating film that is formed on the first surface of the substrate; a plurality of drive circuits that include p-channel transistors whose source is coupled to the substrate and are formed on the insulating layer; and a plurality of organic EL elements that are formed on the substrate so as to correspond to the drive circuits, whose first terminal is coupled to the drain of the transistor, and whose second terminal is coupled to a common ground.

These features make it possible to use the conductive substrate as a part of a route through which power is supplied to the organic EL elements and drive circuits. As a result, wherever on the substrate the organic EL elements are disposed, power can be supplied to the organic EL elements via the substrate, thereby eliminating unevenness in the power potential in the plane of the substrate. Therefore, it is possible to obtain an organic EL device that makes the in-plane distribution of the luminescent brightness of the organic EL element more even.

The substrate preferably includes a conductive substrate (for example, stainless steel substrate).

As a result, a substrate suitable for this invention can be obtained. A conductive substrate has the advantages of relative flexibility and excellent mechanical strength.

As a substrate, an insulating substrate on whose first surface (or both surfaces) a conductive film is formed may be used.

Therefore, it is possible to obtain a substrate suitable for the invention using an insulating substrate such as glass substrate or a resin substrate.

When using a conductive substrate as a substrate, a power supply is preferably coupled to the second surface of the substrate. Note that the power supply may be coupled to the first surface of the substrate.

As a result, it is possible to determine the coupling position between power supply and the substrate regardless of the layout of the organic EL elements or drive circuits on the first surface of the substrate.

When coupling the power supply to the second surface of the substrate, the power supply is preferably coupled to a plurality of positions scattered on the second surface of the substrate. More preferably, the coupling positions between the substrate and power supply are disposed at equal intervals.

These make it possible to more surely eliminate unevenness in the power potential in the plane of the substrate.

The sources of the transistors are preferably coupled to the substrate via wiring penetrating the insulating film.

Interposing the wiring ensures electrical coupling between the sources of the transistors and the substrate without substantially changing the conventional structure or layout of the transistors.

2-2 An EL device according to a seventh aspect of the invention includes a substrate that is conductive at least on a first surface thereof; an insulating film that is formed on the first surface of the substrate; a plurality of drive circuits that include n-channel transistors whose drain is coupled to the substrate and are formed on the insulating layer; and a plurality of organic EL elements that are formed on the substrate so as to correspond to the drive circuits and whose first terminal is coupled to the source of the transistor and whose second terminal is coupled to a power supply.

These features also make it possible to use the conductive substrate as a part of a route through which power is supplied to the organic EL elements and drive circuits. As a result, wherever on the substrate the organic EL elements are disposed, power can be supplied to the organic EL elements via the substrate, thereby eliminating unevenness in the power potential in the plane of the substrate. Therefore, it is possible to obtain an organic EL device that makes the in-plane distribution of the luminescent brightness of the organic EL element more even.

The substrate preferably includes a conductive substrate (for example, stainless steel substrate).

As a result, a substrate suitable for this invention can be obtained. A conductive substrate has the advantages of relative flexibility and excellent mechanical strength.

As a substrate, an insulating substrate on whose first surface (or both surfaces) a conductive film is formed may be used.

As a result, it is possible to obtain a substrate suitable for the invention using an insulating substrate such as glass substrate or a resin substrate.

When using a conductive substrate as a substrate, a common ground is preferably coupled to the second surface of the substrate. Note that the first surface of the substrate and the common ground may be coupled to each other.

As a result, it is possible to determine the coupling position between the common ground and substrate regardless of the layout of the organic EL elements or drive circuits on the first surface of the substrate.

When coupling the common ground to the second surface of the substrate, the common ground is preferably coupled to a plurality of positions scattered on the second surface of the substrate. More preferably, the coupling positions between the substrate and common ground are disposed at equal intervals.

As a result, it is possible to more surely eliminate unevenness in the power potential in the plane of the substrate.

The drains of the transistors are preferably coupled to the substrate via wiring penetrating the insulating film.

Interposing the wiring ensures electrical coupling between the drains of the transistors and the substrate without substantially changing the conventional structure or layout of the transistors.

2-3 A method for manufacturing an EL device according to an eighth aspect of the invention includes a first step for forming an insulating film on a first surface of a substrate that is conductive at least on the first surface; a second step for forming on the insulating film a plurality of drive circuits each including at least one transistor; a third step for forming wiring for coupling the source of the transistor and the substrate; and a fourth step for forming on the substrate a plurality of organic EL elements whose first terminal is coupled to the drain of the transistor and whose second terminal is coupled to the common ground so as to correspond to the drive circuits.

According to this manufacturing method, it is possible to manufacture the organic EL device in the aspect shown in 2-1.

2-4 A method for manufacturing an EL device according to a ninth aspect of the invention includes a first step for forming an insulating film on a first surface of a substrate that is conductive at least on the first surface; a second step for forming on the insulating film a plurality of drive circuits each including at least one transistor; a third step for forming wiring for coupling the drain of the transistor and the substrate; and a fourth step for forming on the substrate a plurality of organic EL elements whose first terminal is coupled to the source of the transistor and whose second terminal is coupled to a power supply so as to correspond to the drive circuits.

According to this manufacturing method, it is possible to manufacture the organic EL device in the aspect shown in 2-2.

3-1 An EL device according to a tenth aspect of the invention includes a substrate that is conductive at least on a first surface thereof; an insulating film that is formed on the first surface of the substrate; a pixel region that includes a plurality of pixels having a transistor formed on the insulating film and an organic EL element that are both coupled to the substrate; and a power supply section that is a conductivity section located on the periphery of the pixel region and coupled to the substrate via an opening in the insulating film.

These features make it possible to use the conductive substrate as a part of a route through which power is supplied to the pixels. Moreover, it is possible to apply the power to the conductive substrate via the power supply section. As a result, wherever on the substrate the organic EL elements are disposed, power can be supplied to the organic EL elements via the substrate, thereby eliminating unevenness in the power potential in the plane of the substrate. Therefore, it is possible to obtain an organic EL device that makes the in-plane distribution of the luminescent brightness of the organic EL element more even. Moreover, there is no need to route wiring for power supply on the substrate, so size-reduction or high integration of the device can be achieved. Coming up with the positions where the power supply sections are disposed reduces in-plane unevenness in the potential of the conductive substrate, thereby making the in-plane distribution of the luminescent brightness of the organic EL element more even.

More preferably the transistor is a p-channel transistor. As a result, it is possible to drive the transistor while using a saturation region of the p-channel transistor, which is more stable, thereby improving the device characteristics.

More preferably a first terminal of the transistor is coupled to the substrate via a conductive film disposed in an opening in the insulating layer. This feature makes it possible to supply power to each pixel via the conductive substrate with a simpler device structure.

More preferably the pixel includes a capacitor whose first end is coupled to the transistor. This feature makes it possible to apply the power supply to the first end of the capacitor, thereby simplifying the pixel structure.

More preferably the EL device further includes a plurality of drivers for driving the pixels and the drivers are disposed on the periphery of the pixel region. This feature makes it possible to drive the pixel circuits by various types of drivers.

More preferably the power supply section includes a plurality of power supply sections. The plurality of power supply sections are disposed on the periphery of the pixel region. Disposing the plurality of power supply sections allows the in-plane unevenness in the potential of the conductive substrate to be reduced, thereby making the in-plane distribution of the luminescent brightness of the organic EL element more even.

It is more preferable that the organic EL device further include a signal line coupled to the gate of the transistor and a potential supply section to the signal line and that the power supply section be disposed side-by-side with the potential supply section to the signal line. Disposing the power supply line side-by-side with the potential supply section to the signal line in this manner facilitates coupling or mounting to an external terminal.

For example, the substrate is approximately rectangular, and the power supply sections are disposed at four corners of the substrate. Disposing the power supply sections at the four corners of the substrate in this manner allows the in-plane unevenness in the potential of the conductive substrate to be reduced, thereby making the in-plane distribution of the luminescent brightness of the organic EL element more even.

3-2 An EL device according to an eleventh aspect of the invention includes a conductive substrate; an insulating film formed on a first surface of the conductive substrate; a pixel region that includes a plurality of pixels having a transistor formed on the insulating film and an organic EL element that are both coupled to the substrate; and a power supply section located on a second surface of the conductive substrate.

These features make it possible to use the conductive substrate as a part of a route through which power is supplied to the pixels. Moreover, it is possible to apply the power supply to the second surface (surface remote from the surface on which the pixels are formed, back side) of the conductive substrate. As a result, wherever on the substrate the organic EL elements are disposed, power can be supplied to the organic EL elements via the substrate, thereby eliminating unevenness in the power potential in the plane of the substrate. Therefore, it is possible to obtain an organic EL device that makes the in-plane distribution of the luminescent brightness of the organic EL element more even. Moreover, there is no need to route wiring for power supply on the substrate, so size-reduction or high integration of the device can be achieved.

3-3 A method for manufacturing an EL device according to a twelfth aspect of the invention includes a first step for forming an insulating film on a first surface of a substrate that is conductive at least on the first surface; a second step for forming on the insulating film a plurality of drive circuits each including at least one transistor; a third step for forming wiring for coupling first ends of the transistors and the substrate; and a fourth step for forming on the substrate a plurality of organic EL elements coupled to second ends of the transistors so as to correspond to the drive circuits; and a fifth step for forming a power supply section coupled to the first surface of the substrate on the periphery of a pixel region including the plurality of drive circuits and the plurality of organic EL elements.

According to this method, it is possible to form the organic EL device that includes a conductive substrate serving as a part of a route through which power is supplied to the pixels and in which the power supply is applied to the conductive substrate via the power supply section.

3-4 A method for manufacturing an EL device according to a thirteenth aspect of the invention includes a first step for forming an insulating film on a first surface of a conductive substrate; a second step for forming on the insulating film a plurality of drive circuits each including at least one transistor; a third step for forming wiring for coupling first ends of the transistors and the conductive substrate; and a fourth step for forming on the conductive substrate a plurality of organic EL elements coupled to second ends of the transistors so as to correspond to the drive circuits; and a fifth step for coupling a part of the second surface of the conductive substrate and the wiring for power supply.

According to this method, it is possible to form the organic EL device that includes a conductive substrate serving as a part of a route through which power is supplied to the pixels and in which the power supply is applied to the second surface (surface remote from the surface on which the pixels are formed, back side) of the conductive substrate.

4. An electronic apparatus according to a fourteenth aspect of the invention includes the organic EL device described above. Specifically, the electronic apparatus according to the fourteenth aspect of the invention includes the above-described organic EL device as a display. The "electronic apparatus" here includes displays, television sets, electronic paper, clocks, electronic calculators, cellular phones, portable data terminals, and the like. Moreover, for example, an exposure head for exposing a photo conductor of a printer may include the abovedescribed organic EL device. In this case, the organic EL device is used as a light source for emitting light for exposure.

BRIEF DESCRIPTION OF THE DRAWINGS

The invention will be described with reference to the accompanying drawings, where like numbers reference like elements.

FIGS. 24A to 24D are process step sectional views showing an example of a method for manufacturing an organic EL device according to the second embodiment.

FIGS. 29A to 29D are process step sectional views showing the example of a method for manufacturing an organic EL device according to the second embodiment.

DESCRIPTION OF EXEMPLARY EMBODIMENTS

Embodiments of the invention will now be described.

First Embodiment

Figure 1:
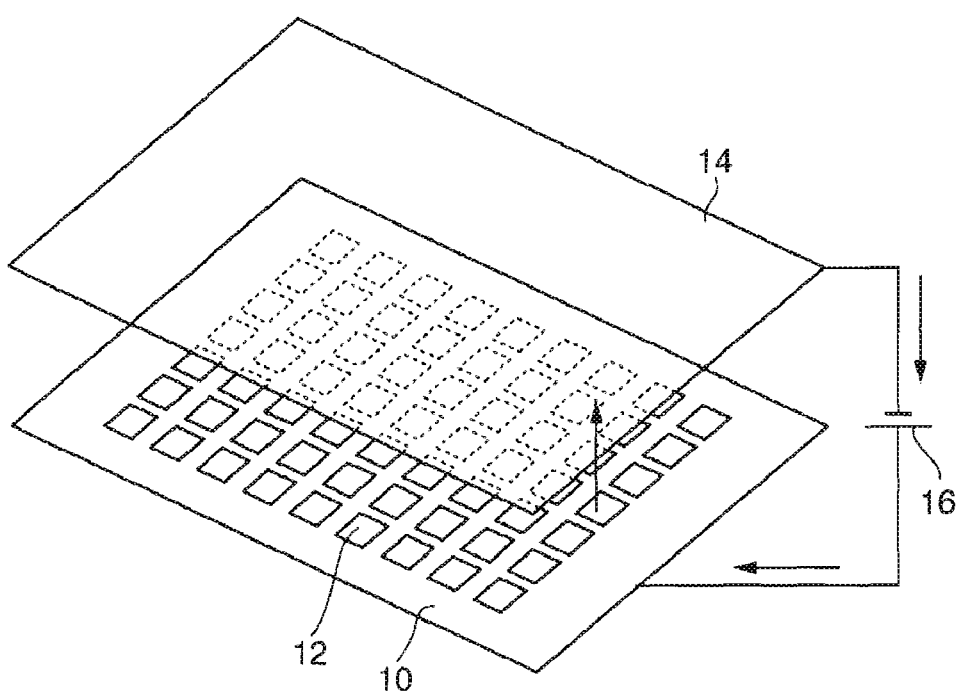
FIG. 1 is a schematic view showing the basic structure of an organic EL device.

FIG. 1 is a schematic view showing the basic structure of an organic EL device according to this embodiment. The organic EL device according to this embodiment includes a conductive substrate 10, a plurality of pixel parts 12 formed on a first surface of this substrate 10, and a common electrode 14 shared by the plurality of pixel parts. As shown in the drawing, a power supply 16 is coupled between the substrate 10 and common electrode 14.

The substrate 10 is required to be conductive at least on a first surface thereof, but it is more preferable that the entire substrate is formed of a conductor. Examples of the former type of the substrate 10 include one obtained by making a metal film formed of aluminum or the like, or a conductive film, such as an indium tin oxide film (ITO film), on a first surface of an insulator substrate, such as a glass substrate, a quartz substrate, or a ceramics substrate. Among examples of the latter type of the substrate 10 is a stainless steel substrate. The substrate 10 is preferably a stainless steel substrate in terms of the requirements, such as heat resistance. It is also possible to use, as the substrate 10, one obtained by providing a conductive film on both sides of an insulator substrate and then coupling electrically between those conductive films. In this embodiment, such a substrate has a function similar to a conductive substrate.

The pixel parts 12 each include an organic EL element and a drive circuit for driving the organic EL element. The common electrode 14 is shared by the organic EL elements in the pixel parts 12, and functions as first electrodes of the organic EL elements. These will be described in detail later. In the organic EL device according to this embodiment, conductivity of the substrate 10 is used to supply power to each pixel part 12 via the substrate 10.

Figure 2:
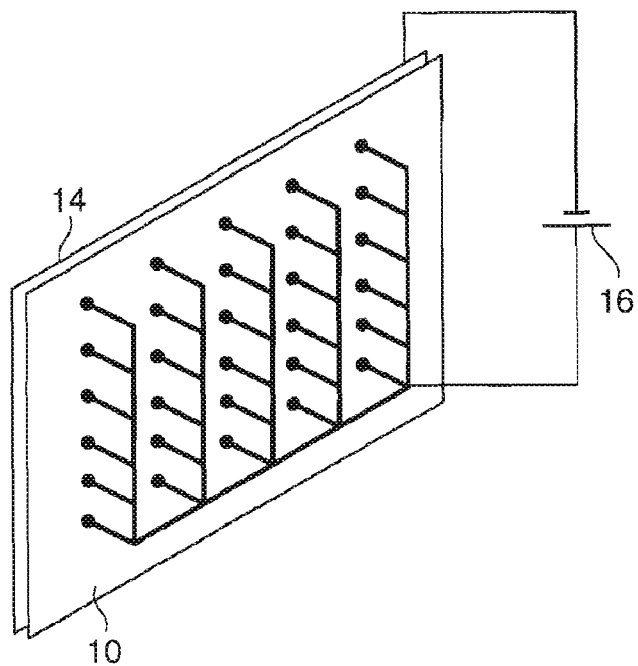
FIG. 2 is a schematic view showing the basic structure of the organic EL device.

In the configuration shown in FIG. 1, coupling between the substrate 10 and power supply 16 is made at one position of the substrate 10. If the substrate 10 is conductive on a first surface thereof, the power supply 16 is coupled to the first surface of the substrate 10. If the substrate 10 is a conductive substrate, the power supply 16 can also be coupled to the second surface of the substrate 10. This increases flexibility in the position of the substrate 10 to which the power supply 16 is coupled. The substrate 10 and power supply 16 are preferably coupled to each other at a plurality of positions. For example, as shown in FIG. 2, the substrate 10 and power supply 16 are preferably coupled at a plurality of positions scattered on the second surface of the substrate 10. Moreover, as illustrated in FIG. 2, the substrate 10 and power supply 16 are preferably coupled at a plurality of positions arranged in an orderly fashion (for example, at equal intervals). These allow a voltage drop in the plane of the substrate 10 to be suppressed more effectively. Here, the high potential terminal or low potential terminal (generally, ground terminal) of the power supply 16 is coupled to the substrate 10. FIGS. 1 and 2 show examples in which the high potential terminal of the power supply 16 is coupled to the substrate 10.

Figure 3:
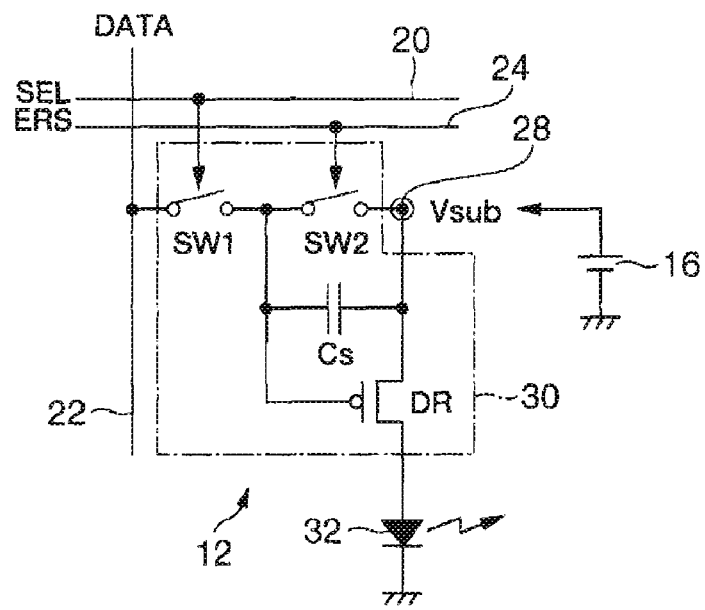
FIG. 3 is a diagram showing an example of the circuit configuration of the organic EL device.

FIG. 3 is a diagram showing an example of the circuit configuration of the organic EL device according to this embodiment. As shown in the diagram, the organic EL device includes a plurality of scan lines 20 and a plurality of reset lines 24 that extend in the horizontal direction (first direction) of the diagram, a plurality of signal lines 22 arranged so as to intersect these scan lines 20 and the like, and a pixel circuit (drive circuit) 30 and an organic EL element 32 disposed at intersections of the scan lines 20 and signal lines 22. As shown in the diagram, the pixel circuit 30 receives a voltage Vsub from the power supply 16 via a node 28. The node 28 is electrically coupled to the conductive substrate 10 described above. That is, in this embodiment, the substrate 10 functions as a part of a power supply route. The abovedescribed pixel part 12 includes the pixel circuit 30 and organic EL element 32.

The pixel circuit 30 shown in FIG. 3 includes a transistor DR for controlling current, a transistor SW1 for writing data, a transistor SW2 for easing data, and holding capacitance Cs. The transistor DR is a p-channel field-effect transistor, and its source is coupled to the node 28 (coupling point to the substrate 10) and its drain is coupled to a first terminal of the organic EL element 32. The first terminal of the organic EL element 32 provided so as to correspond to this drive circuit 30 is coupled to the drain of the transistor DR, and a second terminal thereof is coupled to a common ground. The gate of the transistor SW1 is coupled to the scan line 20, its source is coupled to the signal line 22, and its drain is coupled to the gate of the transistor DR. The gate of the transistor SW2 is coupled to the reset line 24, its source is coupled to the drain of the transistor SW1, and its drain is coupled to the node 28. The holding capacitance Cs is coupled in parallel between the gate and source of the transistor DR.

The operations of the pixel circuit 30 shown in FIG. 3 are as follows. A scan signal SEL is supplied via the scan line 20, and while the transistor SW1 is selected, a data signal DATA is written to the gate of the transistor DR via the signal line 22. A current depending on the magnitude of the data signal DATA is supplied from the power supply 16 to the organic EL element 32 via the node 28 and the source/drain routes of the transistor DR. This causes the organic EL element 32 to emit light with a level of brightness depending on the magnitude of the data signal DATA. On the other hand, a reset signal ERS is supplied via the reset line 24, and while the transistor SW2 is selected, the potential of the gate of the transistor DR is maintained at Vsub and the potential between the source and drain of the transistor DR becomes zero volts. Thus the transistor DR is turned off. This prevents the organic EL element 32 from receiving a current, putting the organic EL element 32 into a non-light-emitting state. In the circuit configuration shown in FIG. 3, the source of transistor DR that is a p-channel transistor is coupled to the node 28, and receives the voltage Vsub. These features stabilize the potential of the source of the transistor.

Figure 4:
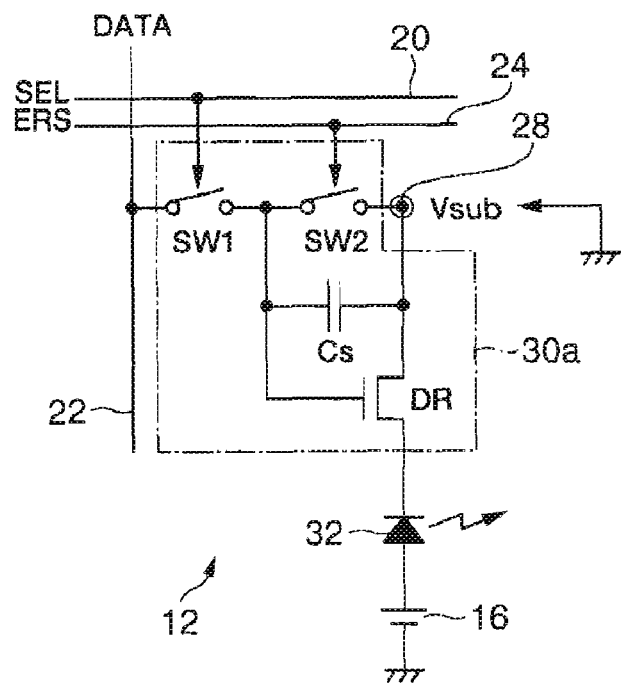
FIG. 4 is a diagram showing another example of the circuit configuration of the organic EL device.

FIG. 4 is another example of the circuit configuration of the organic EL device. Like reference numerals are given to elements common to those in the circuit shown in FIG. 3. Detailed description on those elements will be omitted. The pixel circuit 30a in this example includes an n-channel transistor, so the coupling relations among the pixel circuit 30a, organic EL element 32, power supply 16, and a ground are different from those in the circuit shown in FIG. 3. As shown in the diagram, the pixel circuit 30a is coupled to the common ground via each node 28. The node 28 is electrically coupled to the abovedescribed conductive substrate 10. In other words, the substrate 10 functions as a part of a power supply route. The voltage Vsub is supplied to a first terminal of each organic EL element 32 from the power supply 16. The pixel circuit 30a and organic EL element 32 form the pixel part 12.

The structure of the organic EL device will now be described referring to the sectional views.

Figure 5:
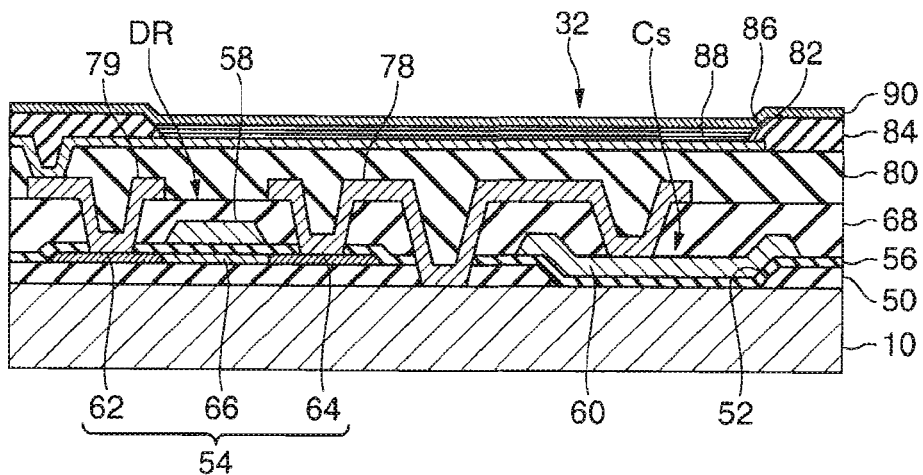
FIG. 5 is a sectional view showing the structure of the organic EL device.
Figure 6:
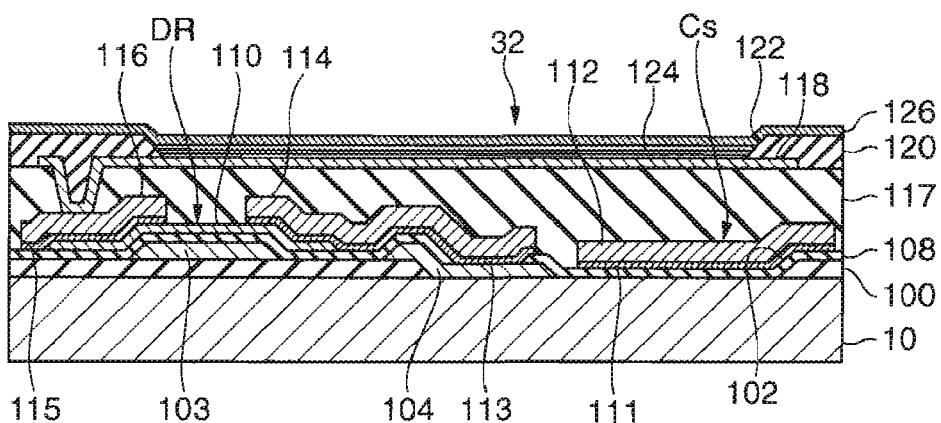
FIG. 6 is a sectional view showing the structure of the organic EL device.
Figure 7:
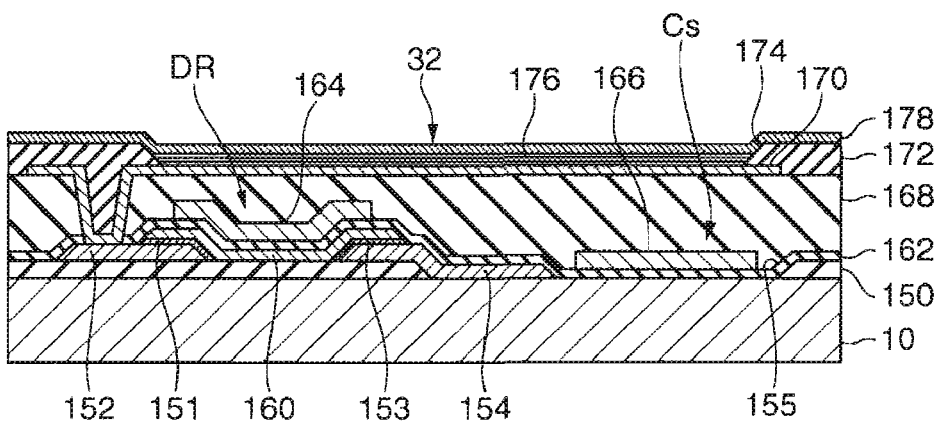
FIG. 7 is a sectional view showing the structure of the organic EL device.

FIGS. 5 to 7 are sectional views showing the structure of each organic EL device. Specifically, FIG. 5 shows an example of the structure of an organic EL device adopting a coplanar transistor, FIG. 6 shows an example of the structure of an organic EL device adopting an inverted staggered transistor, and FIG. 7 shows an example of the structure of an organic EL device adopting a staggered transistor.

In the organic EL device shown in FIG. 5, circuit elements, such as the transistor DR and the holding capacitance Cs included in the pixel circuit 30 or 30a, are provided on a first surface of the conductive substrate 10. The organic EL element 32 is provided above those circuit elements. The transistors SW1 and SW2 are not shown for the sake of clarity. The structure of this organic EL element will be described in detail below.

A first insulating film 50 is formed on a first surface of the substrate 10, and has an opening 52 for partially exposing this first surface of the substrate 10. As the first insulating film 50, insulating films such as a silicon oxide (SiOx) film, a silicon nitride (SiN) film, a silicon oxide nitride (SiON) film, and a ceramics thin film are used.

A semiconductor film 54 is formed at a predetermined position on the first insulating film 50 so as to cover a part of the first insulating film 50. As the semiconductor film 54, generally known semiconductor films such as an amorphous silicon film, a poly silicon film, a monocrystal silicon film, an oxide semiconductor film, and an organic semiconductor film are used. This semiconductor film 54 includes a channel forming region 66 and source/drain regions 62 and 64 disposed on both sides of the channel forming region 66.

The second insulating film 56 is formed on the first insulating film 50 so as to cover the semiconductor film 54. The second insulating film 56 is in contact with the first surface of the substrate 10 via an opening 52 provided on the first insulating film 50. In the illustrated example, the second insulating film 56 covers the opening 52, as well as is buried in the opening 52. As the second insulating film 56, insulating films such as a silicon oxide (SiO2) film, a silicon nitride (SiN) film, a silicon oxide nitride (SiON) film, an aluminum oxide (Al2O3) film, a hafnium oxide (HfO) film are used.

Here, the relations between the first and second insulating films 50 and 56 are described. With regard to the film thickness, the thickness of the second insulating film 56 is preferably smaller than that of the first insulating film 50. For example, it is preferable that the first insulating film 50 have a thickness of approximately 200 to 500 nm and the second insulating film 56 have a thickness of approximately 50 to 100 nm. As for the dielectric constant, the dielectric constant (relative pemittivity) of the second insulating film 56 is preferably larger than that of the first insulating film 50. In other words, the second insulating film 56 is preferably made of a high-K material, and the first insulating film 50 is preferably made of a low-K material. In these regards, it is particularly preferable that the first insulating film 50 be a silicon oxide (SiOx) film, a BSG (SiO2-B2O3) film, or the like and the second insulating film 56 be an aluminum oxide (Al2O3) film, a hafnium oxide (HfO) film, a tantalum oxide (Ta2O5) film, a zirconium oxide (ZrO2) film, or the like.

A gate electrode 58 is formed above the semiconductor film 54 with the second insulating film 56 therebetween. In the illustrated example, the gate electrode 58 is disposed almost directly above the channel forming region 66 of the semiconductor film 54. This gate electrode 58 is obtained by making a conductive film such as an aluminum film on the second insulating film 56, and then patterning the conductive film. This gate electrode 58, the semiconductor film 54, and a part of the second insulating film 56 (a portion between the gate electrode 58 and semiconductor film 54) form the transistor DR.

A capacitance electrode 60 is formed in the upper part of the opening 52, and opposed to the substrate 10 with the second insulating film 56 therebetween. This capacitance electrode 60 is obtained by making a conductive film such as an aluminum film on the second insulating film 56 and then patterning the conductive film. This capacitance electrode 60, the substrate 10, and a part of the second insulating film 56 (a portion between the capacitance electrode 60 and substrate 11) form the holding capacitance Cs.

A first intermediate insulating film 68 is formed above the substrate 10 so as to cover the second insulating film 56, gate electrode 58, and capacitance electrode 60. As this first intermediate insulating film 68, it is possible to use an insulating film made of a material similar to that for the insulating film 50 described above, as well as a silicon oxide film (SOG film) to be made by coating, an organic insulating film made of polyimide, acrylic, or the like.

Wiring 78 and 79 include the abovedescribed pixel circuits, scan lines, signal lines and the like. The wiring 78 and 79 is obtained by making a conductive film such as an aluminum film on the first intermediate insulating film 68, and then patterning the conductive film. The wiring 78 is electrically coupled to the substrate 10 via an opening that penetrates the first insulating film 50, second insulating film 56, and the first intermediate insulating film 68. The wiring 78 is also electrically coupled to the source/drain region 64 via an opening that penetrates the second insulating film 56 and first intermediate insulating film 68, as well as coupled to the capacitance electrode 60 via an opening that penetrates the first intermediate insulating film 68. This causes the pixel circuit including the thin film transistor and capacitance element to be electrically coupled to the substrate 10. More specifically, when the thin film transistor is of p-channel type, the source of the thin film transistor and substrate 10 are coupled to each other via the wiring 78. When the thin film transistor is of n-channel type, the drain of the thin film transistor and the substrate are coupled to each other via the wiring 78. The wiring 79 is electrically coupled to the source/drain region 62 via the openings of the second insulating film 56 and first intermediate insulating film 68.

A second intermediate insulating film 80 is formed above the substrate 10 (on the first intermediate insulating film 68) so as to cover the wiring 78 and 79. As this second intermediate insulating film 80, it is possible to use an insulating film made of a material similar to that for the first intermediate insulating film 68 described above.

A pixel electrode (individual electrode) 82 is formed at a predetermined position on the second intermediate insulating film 80. Moreover, the pixel electrode 82 is electrically coupled to the wiring 79 via an opening formed on the second intermediate insulating film 80. In this embodiment, the organic EL device is assumed to be of top emission type, so the pixel electrode 82 is formed at a position that overlaps the thin film transistor and capacitance element vertically, in order to obtain a larger aperture ratio. The pixel electrode 82 is obtained by making a conductive film such as an aluminum film on the second intermediate insulating film 80, and then patterning the conductive film.

A partition wall layer 84 is formed on the second intermediate insulating film 80, and has an opening 86 for exposing the pixel electrode 82. This partition wall layer 84 is obtained by making a resin film such as a polyimide film or an acrylic film on the second intermediate insulating film 80, and then patterning the resin film.

A light-emitting layer 88 is provided inside the opening 86 of the partition wall layer 84 and formed on the pixel electrode 82 described above. In order to form this light-emitting layer 88, any of a low molecular material or a high molecular material may be used. The light-emitting layer 88 may be provided with various functional layers, such as an electron injection layer, an electron carrying layer, a positive hole injection layer, and a positive hole carrying layer.

A common electrode 90 is formed on the partition wall layer 84 so as to cover the light-emitting layer 88. In this embodiment, the organic EL device has a top emission structure, so the common electrode 90 is formed using a light-transmissive or semi-light transmissive conductive layer so as to take out light emitted from the light-emitting layer 88 toward an upper part of the drawing (direction opposite to the substrate 10). As such a conductive film, for example, an indium tin oxide (ITO) film is used. This common electrode 90 and the abovedescribed pixel electrode 82 and light-emitting layer 88 make up the organic EL element 32. When the thin film transistor DR is of p-channel type, the pixel electrode 82 serving as a first terminal of this organic EL element 32 is coupled to the drain of the thin film transistor DR via the wiring 79, and the common electrode 90 serving as a second terminal of the organic EL element 32 is coupled to a common ground (not shown). When the thin film transistor DR is of n-channel type, the pixel electrode 82 serving as the first terminal of this organic EL element 32 is coupled to the source of the thin film transistor DR via the wiring 79, and the common electrode 90 serving as the second terminal of the organic EL element 32 is coupled to the power supply 16 (not shown).

An organic EL device shown in FIG. 6 uses an inverted staggered thin film transistor as the transistor DR. The structure of this organic EL device will now be described in detail below. Also in FIG. 6, the transistors SW1 and SW2 are omitted for the sake of clarity.

A first insulating film 100 is formed on a first surface of the substrate 10, and has an opening 102 for partially exposing the first surface of the substrate 10. This first insulating film 100 is formed of an insulating film similar to that for the abovedescribed first insulating film 50.

A gate electrode 103 is formed on the first insulating film 100, and covers a part of this first insulating film 100. This gate electrode 103 is formed of a material similar to that for the abovedescribed gate electrode 58.

A part of wiring 104 (electrode) is formed inside an opening 102, and its another part is formed on the first insulating film 100 so as to electrically couple wiring 114 and the substrate 10. This wiring 104 is made of a material similar to that for the abovedescribed gate electrode 58.

The second insulating film 108 is formed on the first insulating film 100 so as to cover the gate electrode 103 and wiring 104. Moreover, the second insulating film 108 is in contact with the first surface of the substrate 10 via an opening 102. The portion of this second insulating film 108 corresponding to the gate electrode 103 will function as the gate insulating film for the thin film transistor, and its portion corresponding to electrode 112 functions as a dielectric material layer that is a component of the capacitance element. The second insulating film 108 is formed of a material similar to that for the abovedescribed second insulating film 56.

Also in this organic EL device, the preferable conditions on the film thickness and dielectric constant between the first insulating film 100 and the second insulating film 108 are similar to those between the first insulating film 50 and the second insulating film 56 describes above.

A semiconductor film 110 is formed so as to cover the gate electrode 103 with the second insulating film 108 therebetween. This semiconductor film 110 becomes an active layer of the thin film transistor (channel forming region). The semiconductor film 110 is formed of a material similar to that for the semiconductor film 54 described above.

A capacitance electrode 112 is formed above the opening 102, and opposed to the substrate 10 with the second insulating film 108 therebetween. This electrode 112 is formed of a conductive material similar to that for the abovedescribed gate electrode 58. In the example shown in the drawing, a good ohmic contact between the capacitance electrode 112 and the second insulating film 108 is secured by interposing a doped semiconductor film 111 therebetween. This capacitance electrode 112, the substrate 10, and a part of the second insulating film 108 (portion between the capacitance electrode 112 and substrate 10) form the holding capacitance Cs.

A source/drain electrode 114 is formed on the second insulating film 108 so that a part thereof comes into contact with the semiconductor film 110 and another part thereof comes into contact into the wiring 104. A source/drain electrode 116 is formed on the second insulating film 108 so that a part thereof comes into contact with the semiconductor film 110. These source/drain electrodes 114 and 116 are each formed of a material similar to that for the abovedescribed capacitance electrode 112. In the example shown in the drawing, a good ohmic contact between the source/drain electrode 114 and semiconductor film 110 and that between the source/drain electrode 114 and wiring 104 are secured by interposing a doped semiconductor film 113 between the source/drain electrode 114 and semiconductor film 110 and between the source/drain electrode 114 and wiring 104, respectively. Similarly, a good ohmic contact between the source/drain electrode 116 and semiconductor film 110 is secured by interposing a doped semiconductor film 115 therebetween.

An intermediate insulating film 117 is formed above the substrate 10 (on the second insulating film 108) so as to cover the source/drain electrodes 114 and 116. This intermediate insulating film 117 is formed of a material similar to that for the first intermediate insulating film 68 described above.

A pixel electrode 118 is formed at a predetermined position on the intermediate insulating film 117. Moreover, the pixel electrode 118 is electrically coupled to the source/drain electrode 116 via an opening formed on the intermediate insulating film 117. In this embodiment, the organic EL device is assumed to be of top emission type, so the pixel electrode 118 is formed at a position that overlaps the thin film transistor and capacitance element vertically, in order to obtain a larger aperture ratio. The pixel electrode 118 is obtained by making a conductive film such as an aluminum film on the intermediate insulating film 117, and then patterning the conductive film.

A partition wall layer 120 is formed on the intermediate insulating film 117, and has an opening 122 for exposing the pixel electrode 118. This partition wall layer 120 is formed of a material similar to that for the partition wall layer 84 described above.

A light-emitting layer 124 is provided inside an opening 122 of the partition wall layer 120 and formed on the pixel electrode 118 described above. This light-emitting layer 124 is formed of a material similar to that for the light-emitting layer 88 described above.

A common electrode 126 is formed on the partition wall layer 120 so as to cover the light-emitting layer 124. In this embodiment, the organic EL device has a top emission structure, so the common electrode 126 is formed using a light-transmissive or semi-light transmissive conductive layer so as to take out light emitted from the light-emitting layer 124 toward an upper part of the drawing (direction opposite to the substrate 10). The common electrode 126 is formed of a material similar to that for the common electrode 90. This common electrode 126 and the abovedescribed pixel electrode 118 and light-emitting layer 124 form the organic EL element 32. When the thin film transistor DR is of p-channel type, the pixel electrode 118 serving as a first terminal of this organic EL element 32 is coupled to the drain of the thin film transistor DR via the source/drain electrode 115, and the common electrode 126 serving as a second terminal of the organic EL element 32 is coupled to a common ground (not shown). When the thin film transistor DR is of n-channel type, the pixel electrode 118 serving as the first terminal of this organic EL element 32 is coupled to the source of the thin film transistor DR via the source/drain electrode 116, and the common electrode 126 serving as the second terminal of the organic EL element 32 is coupled to the power supply 16 (not shown).

An organic EL device shown in FIG. 7 uses a staggered thin film transistor as the transistor DR. The structure of this organic EL device will now be described in detail below. Also in FIG. 7, the transistors SW1 and SW2 are omitted for the sake of clarity.

A first insulating film 150 is formed on a first surface of the substrate 10, and has an opening 155 for partially exposing the first surface of the substrate 10. This first insulating film 150 is formed of a material similar to that for the abovedescribed first insulating film 50.

A source/drain electrode 152 is formed on the first insulating film 150 so that a part thereof comes into contact with the semiconductor film 160. A source/drain electrode 154 is formed on the first insulating film 150 so that a part thereof comes into contact with the semiconductor film 160 and another part thereof comes into contact with the first surface of the substrate 10. These source/drain electrodes 152 and 154 are each formed of a material similar to that for the abovedescribed capacitance electrode 112. In the example shown in the drawing, a good ohmic contact between the source/drain electrode 152 and semiconductor film 160 is secured by interposing a doped semiconductor film 151 therebetween. Similarly, a good ohmic contact between the source/drain electrode 154 and semiconductor film 160 is secured by interposing a doped semiconductor film 153 therebetween.

The semiconductor 160 is formed on the first insulating film 150 so as to extend onto the source/drain electrodes 152 and 154. This semiconductor film 160 becomes an active layer of the thin film transistor (channel forming region). The semiconductor film 160 is formed of a material similar to that for the semiconductor film 54 described above.

The second insulating film 162 is formed on the first insulating film 100 so as to cover the source/drain electrodes 152 and 154 and semiconductor film 160. Moreover, the second insulating film 162 is in contact with the first surface of the substrate 10 via an opening 155. The portion of this second insulating film 162 corresponding to the gate electrode 164 will function as the gate insulating film for the thin film transistor, and its portion corresponding to the electrode 166 will function as a dielectric material layer that is a component of the capacitance element. The second insulating film 162 is formed of a material similar to that for the abovedescribed second insulating film 56.

Also in this organic EL device, the preferable conditions on the film thickness and dielectric constant between the first insulating film 150 and the second insulating film 162 are similar to those between the first insulating film 50 and the second insulating film 56 describes above.

A gate electrode 164 is formed above the semiconductor film 160 with the second insulating film 162 therebetween. This gate electrode 164 is formed of a material similar to that for the abovedescribed gate electrode 58. This gate electrode 164, the semiconductor film 160, and a part of the second insulating film 162 (portion between the gate electrode 164 and semiconductor film 160) form the transistor DR.

A capacitance electrode 166 is formed above an opening 155, and opposed to the substrate 10 with the second insulating film 162 therebetween. This electrode 166 is formed of a material similar to that for the abovedescribed gate electrode 58. This capacitance electrode 166, the substrate 10, and a part of the second insulating film 162 (portion between the capacitance electrode 166 and substrate 10) form the holding capacitance Cs.

An intermediate insulating film 168 is formed above the substrate 10 (on the second insulating film 162) so as to cover the semiconductor film 164 and capacitance electrode 166. This intermediate insulating film 168 is formed of a material similar to that for the first intermediate insulating film 68 described above.

A pixel electrode 170 is formed at a predetermined position on the intermediate insulating film 168. Moreover, the pixel electrode 170 is electrically coupled to the source/drain electrode 152 via an opening formed on the intermediate insulating film 168. In this embodiment, the organic EL device is assumed to be of top emission type, so the pixel electrode 170 is formed at a position that overlaps the thin film transistor and capacitance element vertically, in order to obtain a larger aperture ratio. The pixel electrode 170 is obtained by making a conductive film such as an aluminum film on the intermediate insulating film 168, and then patterning the conductive film.

A partition wall layer 172 is formed on the intermediate insulating film 168, and has an opening 174 for exposing the pixel electrode 170. This partition wall layer 172 is formed of a material similar to that for the partition wall layer 84 described above.

A light-emitting layer 176 is provided inside an opening 174 of the partition wall layer 174 and formed on the pixel electrode 170 described above. This light-emitting layer 176 is formed of a material similar to that for the light-emitting layer 88.

A common electrode 178 is formed on the partition wall layer 172 so as to cover the light-emitting layer 176. In this embodiment, the organic EL device has a top emission structure, so the common electrode 178 is formed using a light-transmissive or semi-light transmissive conductive film so as to take out light emitted from the light-emitting layer 176 toward an upper part of the drawing (direction opposite to the substrate 10). The common electrode 178 is formed of a material similar to that for the common electrode 90. This common electrode 178 and the abovedescribed pixel electrode 170 and light-emitting layer 176 form the organic EL element 32. When the thin film transistor DR is of p-channel type, the pixel electrode 170 serving as a first terminal of this organic EL element 32 is coupled to the drain of the thin film transistor DR via the source/drain electrode 152, and the common electrode 178 serving as a second terminal of the organic EL element 32 is coupled to a common ground (not shown). When the thin film transistor DR is of n-channel type, the pixel electrode 178 serving as the first terminal of this organic EL element 32 is coupled to the source of the thin film transistor DR via the wiring 79, and the common electrode 178 serving as the second terminal of the organic EL element 32 is coupled to the power supply 16 (not shown).

The organic EL devices according to this embodiment have the features described above. A method for manufacturing these organic EL devices according to this embodiment will now be described in detail.

FIGS. 8A to 8D, FIGS. 9A to 9D, and FIGS. 10A to 10C are process step sectional views showing an example of a method for manufacturing the organic EL device. In this example, a case in which the pixel circuit includes a coplanar transistor (see FIG. 5).

Figure 8A:
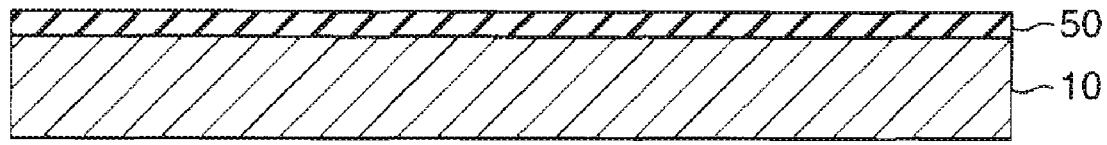
FIGS. 8A to 8D are process step sectional views showing an example of a method for manufacturing an organic EL device.

First, the first insulating layer 50 is formed on a first surface of the conductive substrate 10 (FIG. 8A). As the first insulating film 50, insulating films such as a silicon oxide (SiOx) film, a silicon nitride (SiN) film, a silicon oxide nitride (SiON) film, and a ceramics thin film are used. As a method for forming the first insulating film 50, known techniques may be selected as appropriate. For example, chemical vapor deposition (CVD), sputtering, or the like is used. It is also possible to use, as the first insulating film 50, an insulating film obtained on a surface of the substrate 10 by performing annealing or anodizing on the conductive substrate 10 in an oxidizing atmosphere. In particular, when a stainless steel substrate is adopted as the substrate 10, a passive film made of chromium oxide formed on the substrate surface also is preferably used as the first insulating film 50.

Figure 8B:
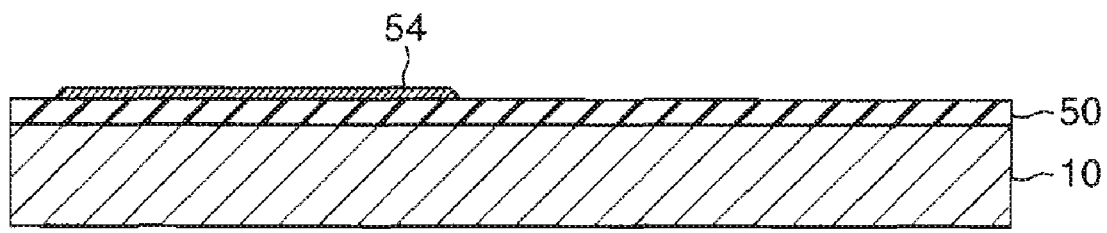
Figure 8C:
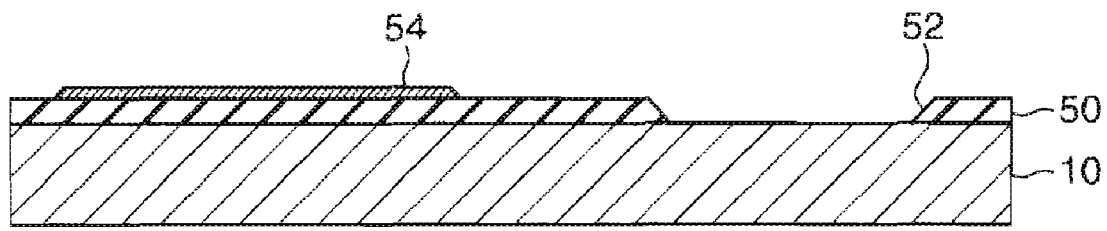

Next, the semiconductor film 54 patterned into a predetermined shape (for example, island-shaped) is formed (FIG. 8B). As the semiconductor film 54, generally known semiconductor films such as an amorphous silicon film, a poly silicon film, a monocrystal silicon film, an oxide semiconductor film, and an organic semiconductor film are used. A method for forming these semiconductor films may be selected from known techniques as appropriate. For example, chemical vapor deposition (CVD), sputtering, coating, or the like is used. In this embodiment, the semiconductor film 54 is formed using, for example, a poly silicon film.

Next, the opening 52 is formed at a predetermined position (position close to the semiconductor film 54 in the illustrated example) on the substrate 10 (FIG. 5C). More specifically, the opening 52 is formed by removing the first insulating film 50 so that the first surface of the substrate 10 is exposed.

Figure 8D:
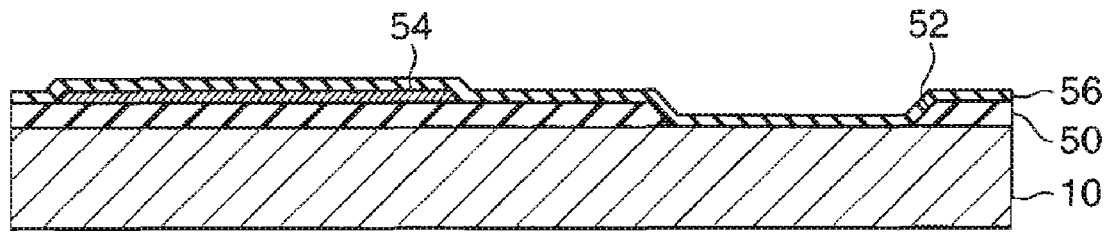

Next, the second insulating film 56 for covering the semiconductor film 54 is formed on the substrate 10 (FIG. 8D). This second insulating film 56 is formed so as to come into contact with the first surface of the substrate 10 via the opening 52 provided on the first insulating film 50. In the illustrated example, the second insulating film 56 covers the opening 52, as well as is buried in the opening 52. As the second insulating film 56, insulating films such as a silicon oxide (SiO2) film, a silicon nitride (SiN) film, a silicon oxide nitride (SiON) film, an aluminum oxide (Al2O3) film, a hafnium oxide (HfO) film are used.

Figure 9A:
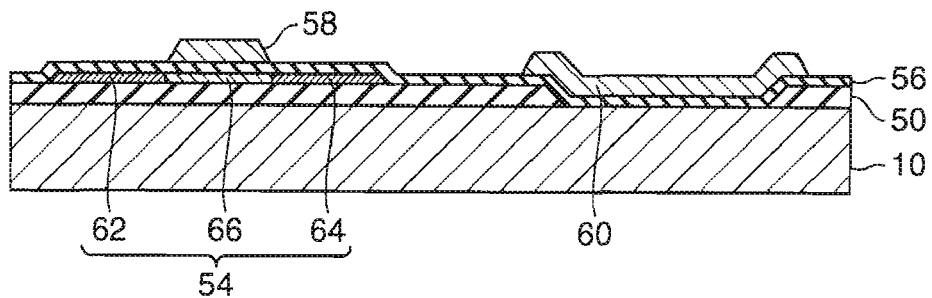
FIGS. 9A to 9D are process step sectional views showing the example of a method for manufacturing the organic EL device.

Next, the gate electrode 58 and capacitance electrode 60 are formed (FIG. 9A). Moreover, other electrodes and wiring not shown are formed in this step. Those electrodes and wiring are included in the pixel circuits, scan lines, signal lines, or the like described above. The gate electrode 58 and capacitance electrode 60 are obtained by making a conductive film such as an aluminum film on the second insulating film 56, and then patterning the conductive film. Moreover, after the gate electrode 58 and capacitance electrode 60 are formed, the semiconductor film 54 is subjected to ion-implantation (so-called "self-aligning ion implantation") with the gate electrode 58 used as a mask. Thus, a self-aligning source/drain region is formed on the semiconductor film 54. Specifically, the channel forming region 66 is formed right below the gate electrode 58 of the semiconductor film 54, and the source/drain regions 62 and 64 are formed on both sides of this channel forming region 66. As a result, a coplanar thin film transistor as shown in the drawing is completed. This thin film transistor will function as the transistor DR (see FIG. 4, etc.) described above. Though not shown, other thin film transistors are formed in the similar fashion, and will function as the transistors SW1, SW2, SW3, and SW4 described above. Moreover, the capacitance electrode 60, substrate 10, and second insulating film 56 interposed therebetween make up a capacitance element. This capacitance element will function as the holding capacitance Cs described above.

Figure 9B:
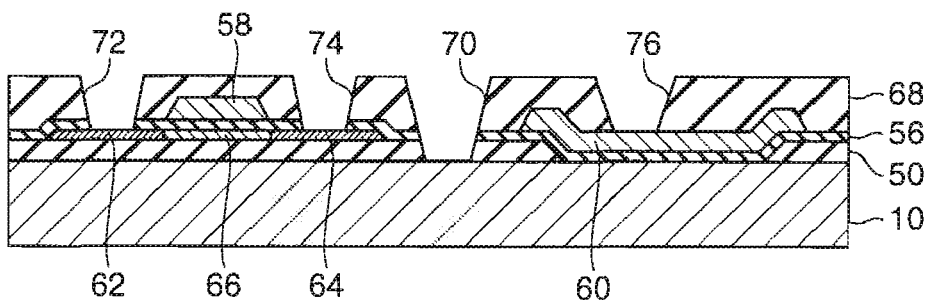

Next, the first intermediate insulating film 68 for forming the gate electrode 58 and capacitance electrode 60 is formed on the substrate 10 (FIG. 9B). As the first intermediate insulating film 68, it is possible to use an insulating film made of a material similar to the insulating film 50 described above, as well as to use a silicon oxide film (SOG film) to be made by coating, an organic insulating film made of polyimide or acrylic, or the like. It is preferable to use these SOG films and organic insulating films because those films can be made by a simple method such as coating.

Next, openings 70, 72, 74, and 76 are formed at predetermined positions on the substrate 10 (FIG. 9B). More specifically, the opening 70 is formed at a position close to the thin film transistor including the gate electrode 58, and the like by removing the first insulating film 50, second insulating film 56, and first intermediate insulating film 68 so as to expose the first surface of the substrate 10. The opening 72 is formed by removing the second insulating film 56 and first intermediate insulating film 68 so as to expose a first side of the source/drain region 62. The opening 74 is formed by removing the second insulating film 56 and first intermediate insulating film 68 so as to expose a first side of the source/drain region 64. The opening 76 is formed by removing the first intermediate insulating film 68 so as to expose a first side of the capacitance electrode 60.

Figure 9C:
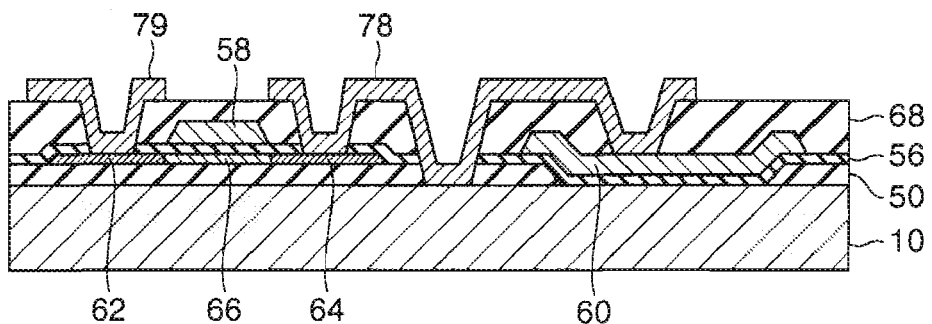

The wiring 78 and 79 and not shown other electrodes and wiring are formed (FIG. 9C). Those electrodes and wiring make up the abovedescribed pixel circuits, scan lines, signal lines, and the like. The wiring 78 and 79, and the like are obtained by making a conductive film such as an aluminum film on the first intermediate insulating film 68, and then patterning the conductive film. As shown in the drawing, the wiring 78 extends to the openings 70, 74, and 76 as well as are buried in these openings. The wiring 78 is electrically coupled to the substrate 10 via the opening 70, to the source/drain region 64 via the opening 74, and to the capacitance electrode 60 via the opening 76. Thus, the pixel circuit including the thin film transistor and capacitance element is electrically coupled to the substrate 10. More specifically, when the thin film transistor is of p-channel type, the source of the thin film transistor and substrate 10 are coupled to each other via the wiring 78. When the thin film transistor is of n-channel type, the drain of the thin film transistor and the substrate are coupled to each other via the wiring 78.

As shown in the drawing, the wiring 79 is buried in the opening 72 so as to be electrically coupled to the source/drain region 62. When a stainless steel substrate is used as the substrate 10, exposure of the portion of the substrate 10 where the opening 70 is formed to an atmosphere causes formation of a passive film on the substrate surface. Therefore, caution must be used. Specifically, this passive film may cause loose connection between the substrate 10 and wiring 78. In this case, the passive film is preferably eliminated by exposing the surface of the substrate 10 to plasma in a vacuum prior to forming the wiring 78.

Figure 9D:
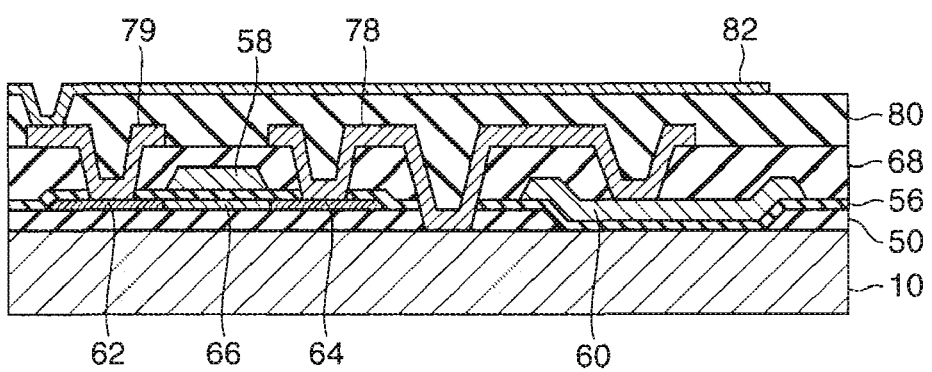

Next, the second intermediate insulating film 80 for covering the wiring 78 and 79 is formed on the substrate 10 (FIG. 9D). The second intermediate insulating film 80 may be formed in a similar fashion to the first intermediate insulating film 68 described above. Then, an opening for exposing a part of the wiring 79 is formed. Moreover, the pixel electrode 82 (anode) to be electrically coupled to the wiring 79 via this opening is formed on the second intermediate insulating film 80. The pixel electrode 82 is obtained by making a conductive film such as an aluminum film on the second intermediate insulating film 80, and then patterning the conductive film.

Figure 10A:
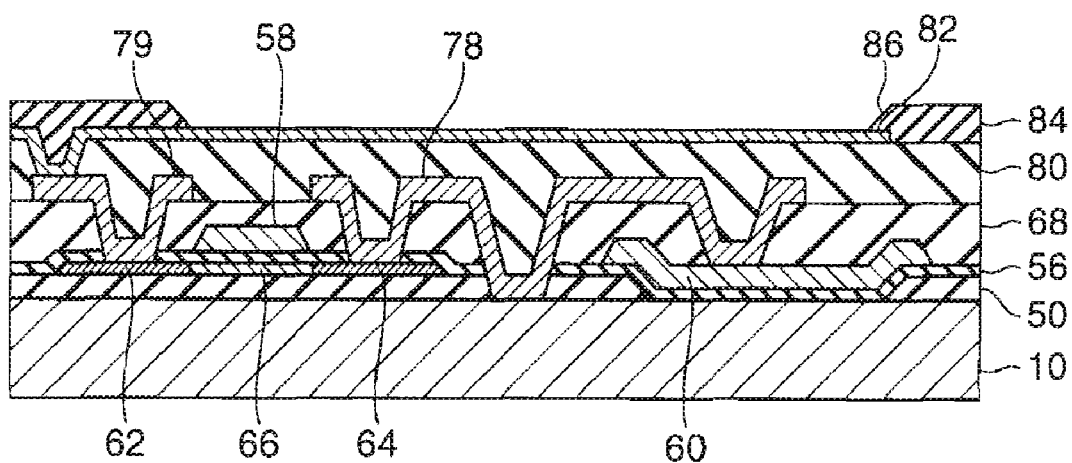
FIGS. 10A to 10C are process step sectional views showing the example of a method for manufacturing an organic EL device.
Figure 10B:
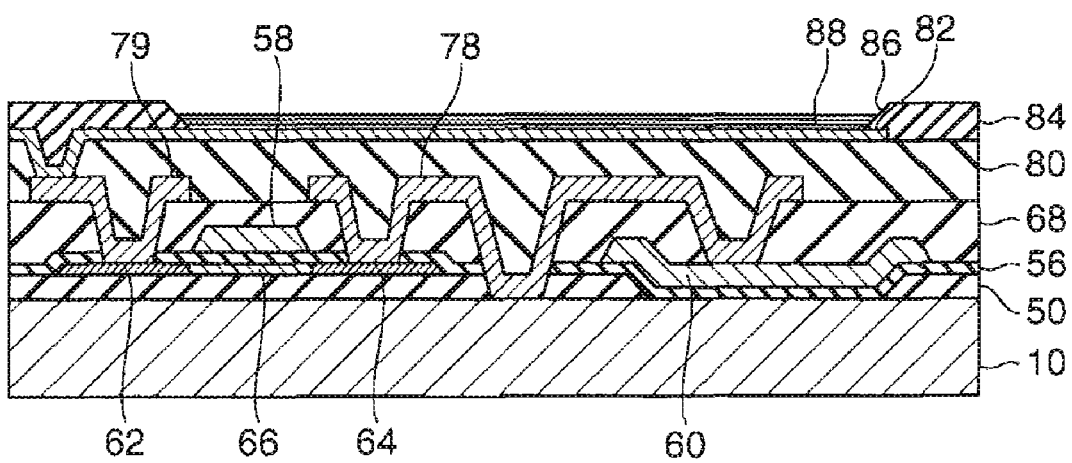

Next, the partition wall layer 84 that has the opening 86 for exposing the pixel electrode 82 is formed on the second intermediate insulating film 80 (FIG. 10A). This partition wall layer 84 is obtained by making a resin film such as a polyimide film or an acrylic film on the second intermediate insulating film 80, and then patterning the resin film.

Next, the light-emitting layer 88 is formed on the pixel electrode 82 inside the opening 86. This light-emitting layer 88 may be formed using any of a low molecular material or a high molecular material. Moreover, various known techniques such as vapor deposition, coating, and droplet ejection (inkjet) may be used to form the light-emitting layer 88. The light-emitting layer 88 may also be provided with various functional layers, such as an electron injection layer, an electron carrying layer, a positive hole injection layer, and a positive hole carrying layer.

Figure 10C:
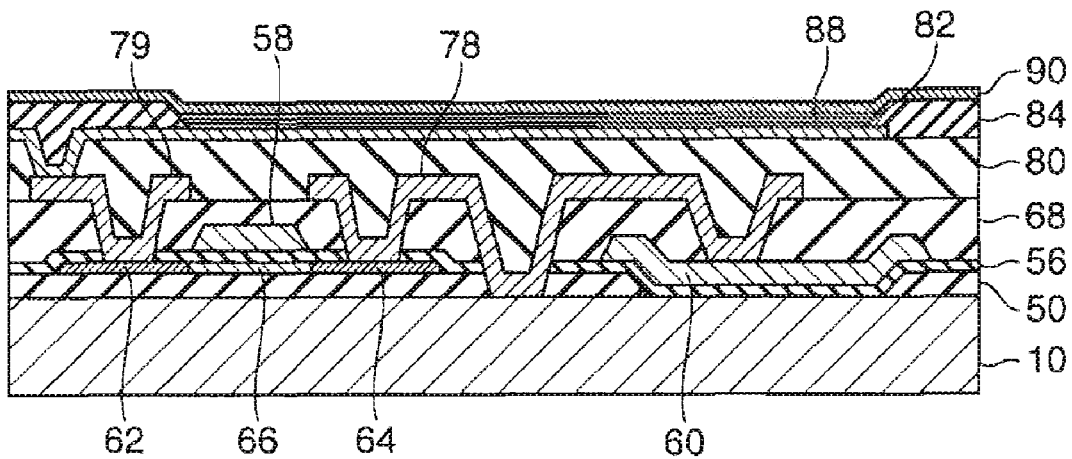

Next, the common electrode (cathode) 90 is formed on the partition wall layer 84 so as to extend to each light-emitting layer 88 (FIG. 10C). In this embodiment, the common electrode 90 is formed using a light-transmissive or semi-light transmissive conductive film. Among such conductive films is an indium tin oxide (ITO) film. The pixel electrode 82, light-emitting layer 88, and common electrode 90 form the organic EL element.

As described above, the organic EL device shown in FIG. 5 can be manufactured.

Now, as another example of the method for manufacturing an organic EL device according to this embodiment, a case (see FIG. 6) in which the pixel circuit includes an inverted staggered transistor will be described.

FIGS. 11A to 11D, FIGS. 12A to 12D, and FIGS. 13A to 13C are process step sectional views showing an example of the method for manufacturing an organic EL device.

Figure 11A:
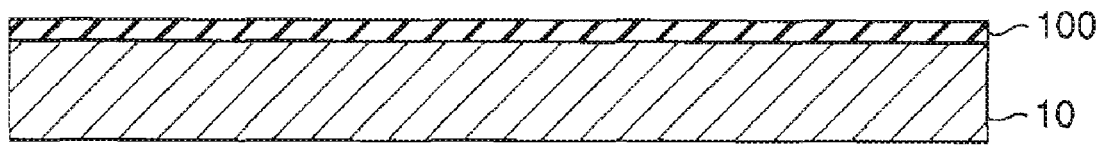
FIGS. 11A to 11D are process step sectional views showing an example of a method for manufacturing an organic EL device.

First, a first insulating film 100 is formed on a first surface of the substrate 10 (FIG. 11A). This first insulating film 100 is formed in a similar fashion to the first insulating film 50 described above.

Figure 11B:
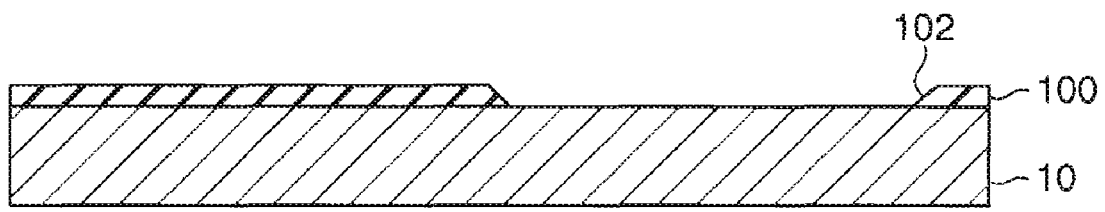

Next, the opening 102 is formed at a predetermined position of the insulating film 100 (FIG. 11B). As shown in the drawing, this opening 102 is formed so as to expose the first surface of the substrate 10.

Figure 11C:
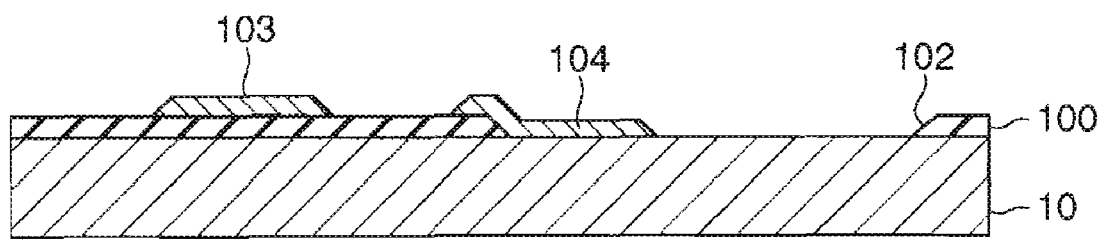

Next, the gate electrode 103 and wiring 104 are formed (FIG. 11C). The gate electrode 103 is formed at a predetermined position on the first insulating film 100. The wiring 106 is formed so that a part thereof comes into contact with the first surface of the substrate 10 inside the opening 102.

Figure 11D:
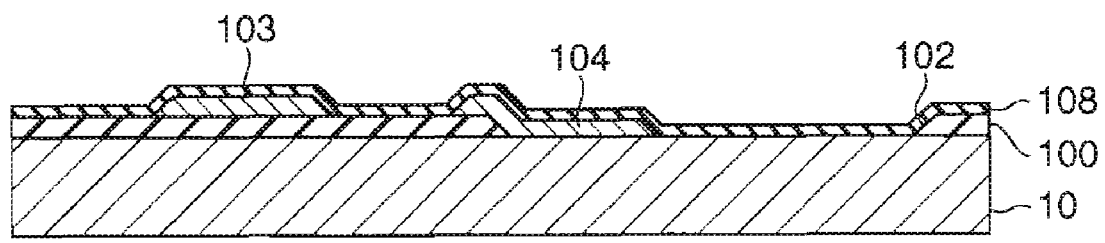

Next, the second insulating film 108 for covering the gate insulating electrode 103 and wiring 104 is formed on the substrate 10 (FIG. 11D). The second insulating film 108 is formed in a similar fashion to the second insulating film 56.

Figure 12A:
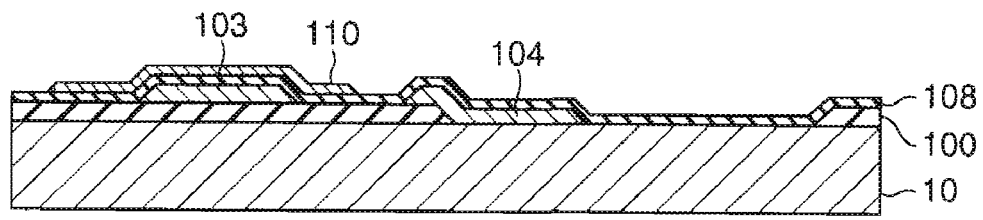
FIGS. 12A to 12D are process step sectional views showing the example of a method for manufacturing an organic EL device.

Next, the semiconductor film 110 patterned into a predetermined shape (for example, island-shape) is formed (FIG. 12A). The semiconductor film 110 will become an active layer of the thin film transistor (channel forming region) later. The semiconductor film 110 can be formed in a similar fashion to the semiconductor film 54 described above.

Figure 12B:
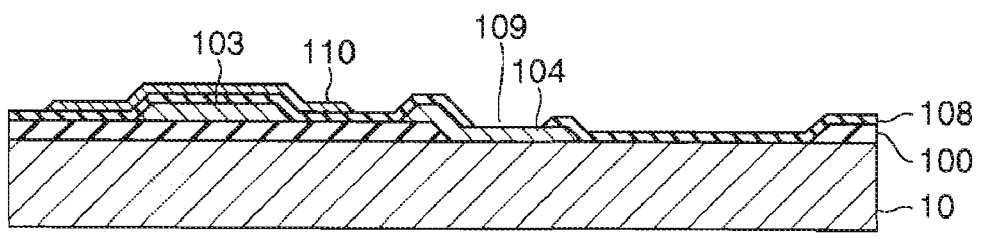

Next, the opening 109 is formed to a predetermined position above the substrate 10 (FIG. 12B). More specifically, the opening 109 is formed at a position close to the thin film transistor including the gate electrode 103 and the like by removing the second insulating film 108 so as to expose a first side of the wiring 104.

Figure 12C:
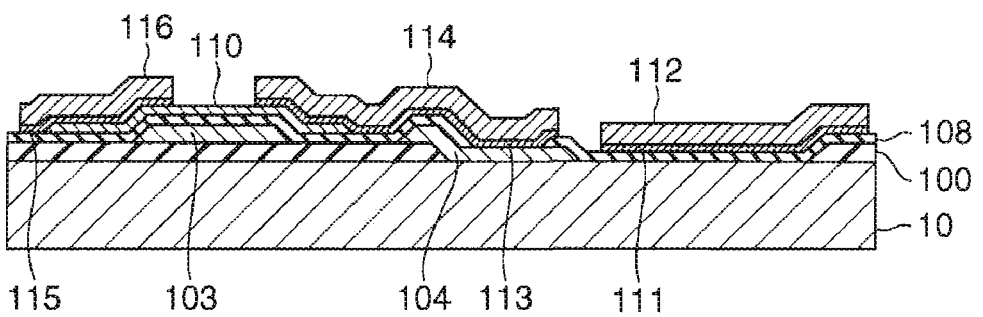

Next, the capacitance electrode 112 and source/drain electrodes 114 and 116 are formed (FIG. 12C). At the same time, the doped semiconductor films 111, 113, and 115 are also formed. Specifically the capacitance electrode 112 and source/drain electrodes 114 and 116 are formed by continuously making doped semiconductor films and conductive films on the second insulating film 108, and patterning those films into predetermined shapes. More specifically, the doped semiconductor film 111 and capacitance electrode 112 are formed so as to be opposed to the substrate 10 with the second insulating film 108 therebetween. The doped semiconductor film 113 and source/drain electrodes 114 are formed so as to extend from the semiconductor film 110 to the wiring 104 and to come into contact with the wiring 104 via the opening 109. The doped semiconductor film 115 and source/drain electrode 116 are formed so as to come into contact with the semiconductor film 110.

Figure 12D:
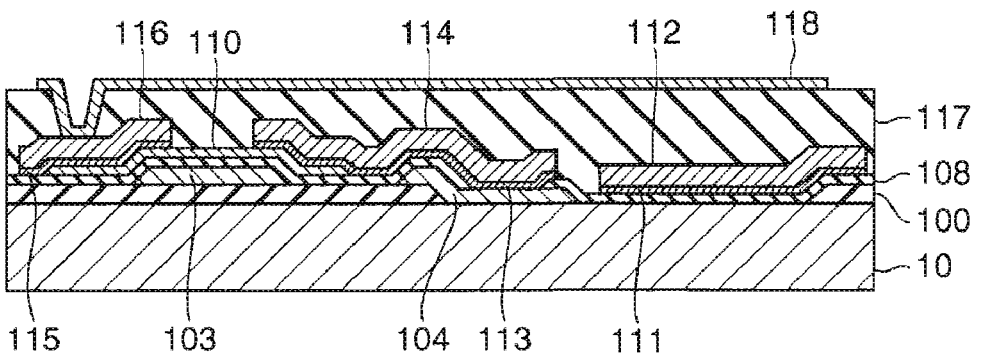

Next, the intermediate insulating film 117 for covering the capacitance electrode 112 and source/drain electrodes 114 and 116 is formed on the substrate 10 (FIG. 12D). The intermediate insulating film 117 can be formed in a similar fashion to the second intermediate insulating film 80 described above. Then, an opening for exposing a part of the source/drain electrode 116 is formed. Moreover, the pixel electrode 118 to be electrically coupled to the source/drain electrode 116 via this opening is formed on the second intermediate insulating film 117.

Figure 13A:
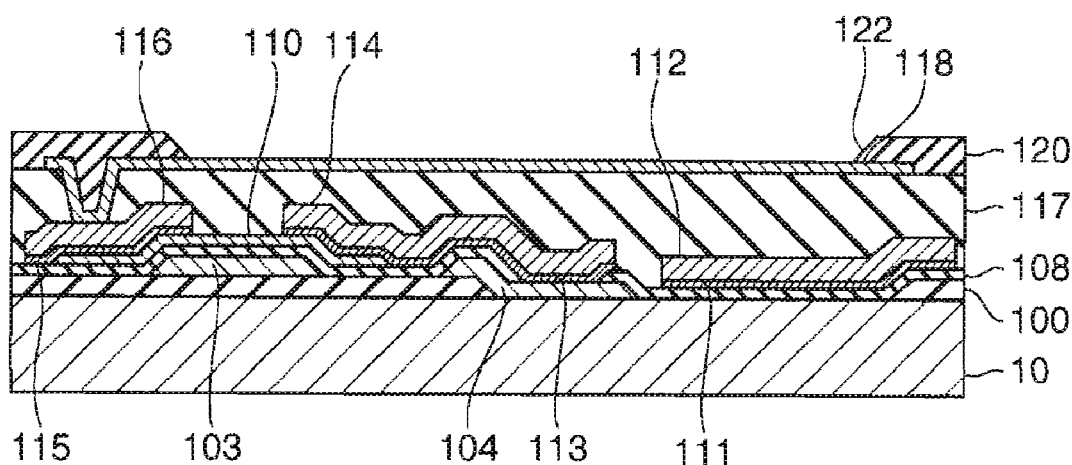
FIGS. 13A to 13C are process step sectional views showing the example of a method for manufacturing an organic EL device.

Next, the partition wall layer 120 that has the opening 122 for exposing the pixel electrode 118 is formed on the intermediate insulating film 117 (FIG. 13A). This partition wall layer 120 can be formed in a similar fashion to the partition wall layer 84 described above.

Figure 13B:
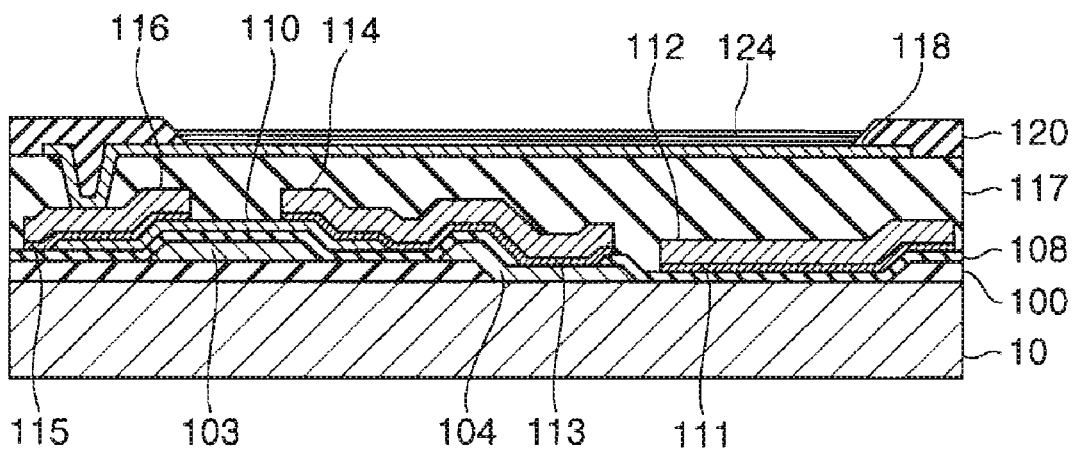

Next, the light-emitting layer 124 is formed on the pixel electrode 118 inside the opening 122 (FIG. 13B). This light-emitting layer 124 can be formed in a similar fashion to the light-emitting layer 88 described above.

Figure 13C:
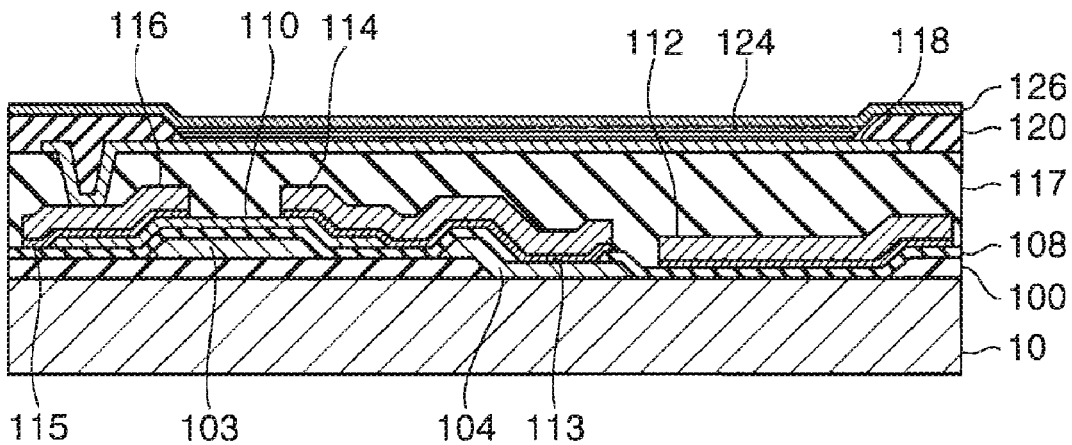

Next, the common electrode 126 is formed on the partition wall layer 120 so as to extend to each light-emitting layer 124 (FIG. 13C). This common electrode 126 can be formed in a similar fashion to the common electrode 90 described above.

As described above, the organic EL device shown in FIG. 6 can be manufactured.

Now, as another example of the method for manufacturing an organic EL device according to this embodiment, a case (see FIG. 7) in which the pixel circuit includes a staggered transistor will be described.

FIGS. 14A to 14D, FIGS. 15A to 15D, and FIGS. 16A to 16D are process step sectional views showing an example of the method for manufacturing an organic EL device.

Figure 14A:
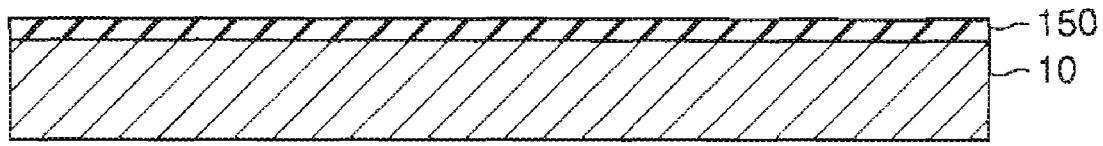
FIGS. 14A to 14D are process step sectional views showing an example of a method for manufacturing an organic EL device.

First, an insulating film 150 is formed on a first surface of the substrate 10 (FIG. 14A). This insulating film 150 is formed in a similar fashion to the first insulating film 50 described above.

Figure 14B:
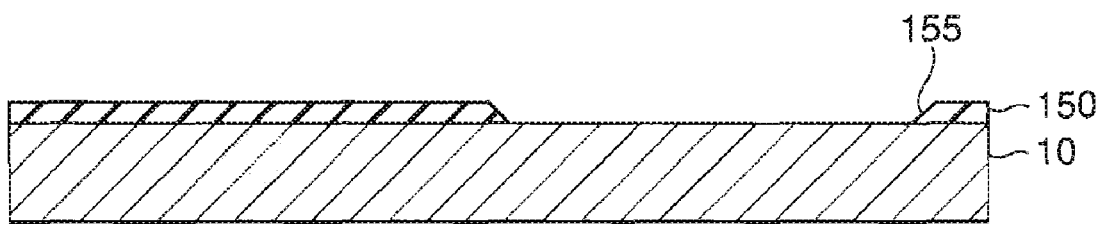

Next, the opening 155 is formed at a predetermined position of the insulating film 150 (FIG. 14B). As shown in the drawing, this opening 155 is formed so as to expose the first surface of the substrate 10.

Figure 14C:
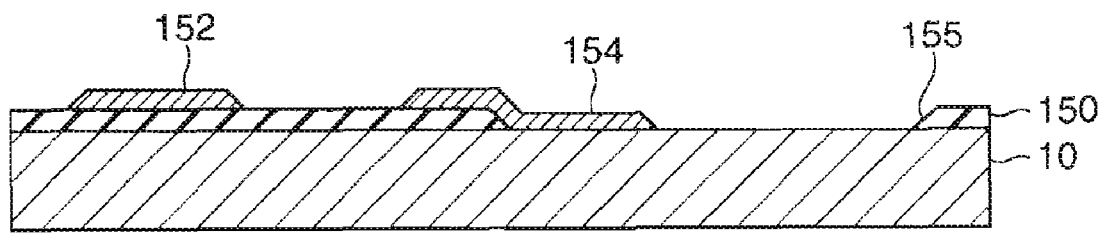

Next, the source/drain electrodes 152 and 154 are formed (FIG. 14C). The source/drain electrode 154 is formed so that a part thereof comes into contact with a first side of the substrate 10 via the opening 155.

Figure 14D:
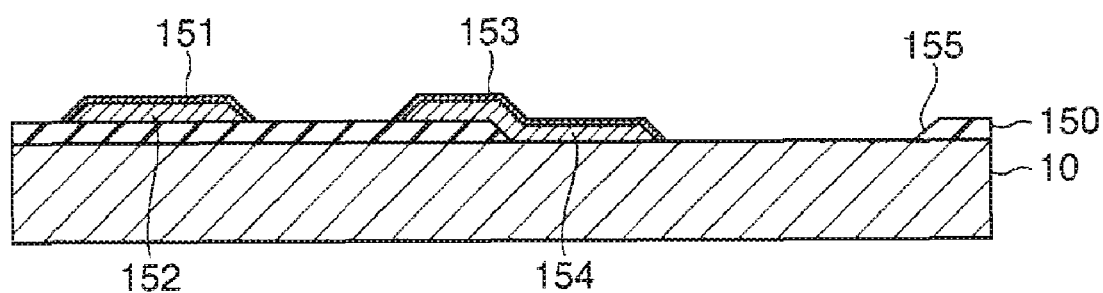

Next, the doped semiconductor films 151 and 153 shaped so as to cover the source/drain electrodes 152 and 1154 are formed (FIG. 14D). Specifically, the doped semiconductor films 151 and 153 are obtained by making a semiconductor film on the substrate 10, for example, by a film-making method such as chemical vapor deposition (CVD) or sputtering, and then patterning the semiconductor film so as to correspond to the shapes of the source/drain electrodes 152 and 154. It is also possible to make the doped semiconductor films 151 and 153 by applying a liquid material to the surfaces of the source/drain electrodes 152 and 154 by droplet ejection.

Figure 15A:
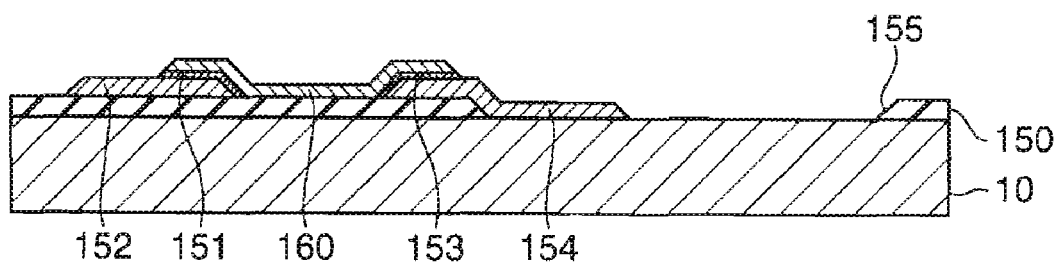
FIGS. 15A to 15D are process step sectional views showing the example of a method for manufacturing an organic EL device.

Next, the semiconductor film 160 patterned into a predetermined shape (for example, island-shape) is formed (FIG. 15A). The semiconductor film 160 will become an active layer of the thin film transistor (channel forming region) later. The semiconductor film 160 can be formed in a similar fashion to the semiconductor film 54 described above. In this embodiment, the semiconductor film 160 is formed so as to extend from the source/drain electrode 152 to the source/drain electrode 154. There remain portions of the doped semiconductor films 151 and 153 covered with the semiconductor film 160, and other portions thereof are removed when the semiconductor film 160 is formed (at the time of patterning). As a result, the doped semiconductor film 151 lies between the semiconductor film 160 and source/drain electrode 152, and the doped semiconductor film 153 lies between the semiconductor film 160 and source/drain electrode 154.

Figure 15B:
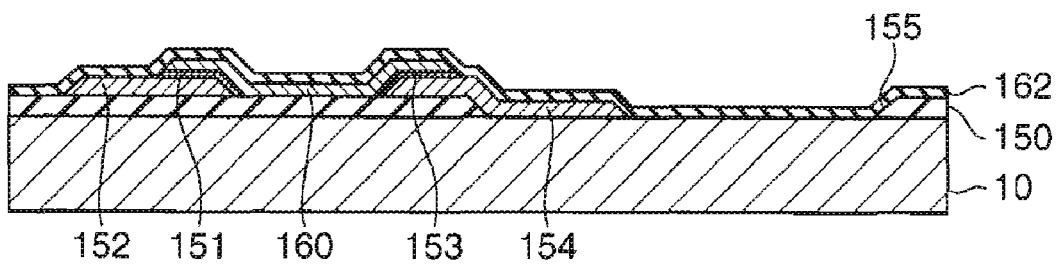

Next, the second insulating film 162 for covering the source/drain electrodes 152 and 154 and semiconductor film 160 is formed above the substrate 10 (FIG. 15B). The second insulating film 162 can be formed in a similar fashion to the second insulating film 56 described above.

Figure 15C:
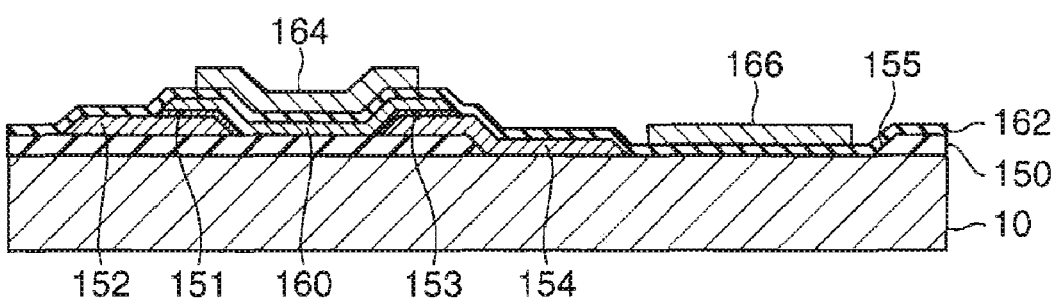

Next, the gate electrode 164 and capacitance electrode 166 are formed (FIG. 15C). Specifically, the gate electrode 164 is formed at a position that overlaps the semiconductor film 160 with the second insulating film 162 therebetween. The capacitance electrode 166 is formed at a position that is opposed to the substrate 10 with the second insulating film 162 therebetween.

Figure 15D:
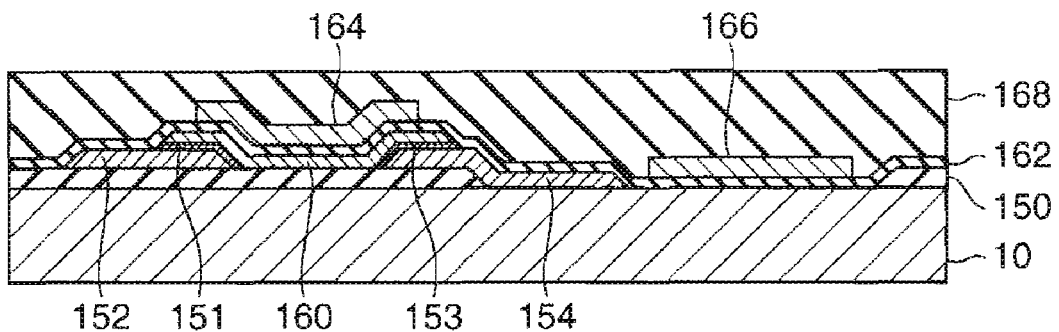

Next, the intermediate insulating film 168 for covering the gate electrode 164 and capacitance electrode 166 is formed on the substrate 10 (FIG. 15D). The intermediate insulating film 168 can be formed in a similar fashion to the second intermediate insulating film 80 described above.

Figure 16A:
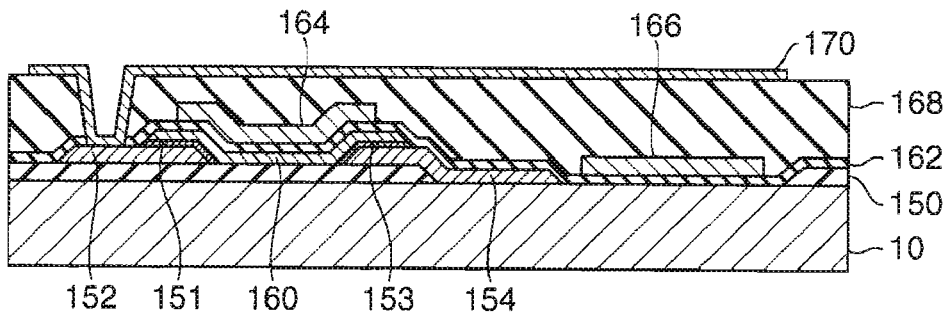
FIGS. 16A to 16D are process step sectional views showing the example of a method for manufacturing an organic EL device.

Next, an opening for exposing a part of source/drain electrode 152 is formed. Moreover, the pixel electrode 170 to be electrically coupled to the source/drain electrode 152 via this opening is formed on the intermediate insulating film 168 (FIG. 16A).

Figure 16B:
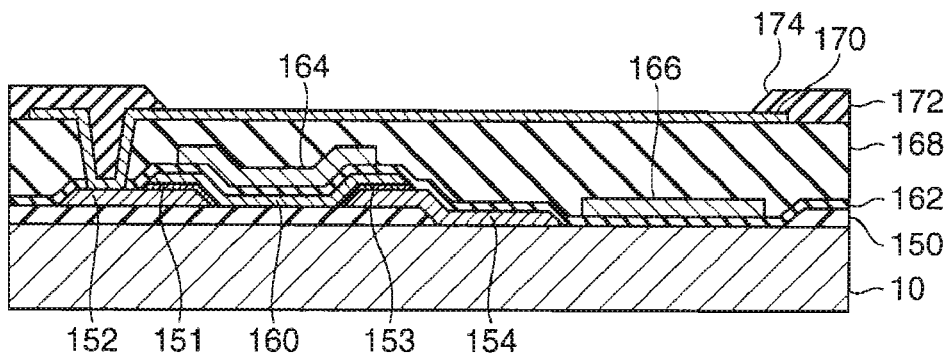

Next, the partition wall layer 172 that has an opening 174 for exposing pixel the electrode 170 is formed on the intermediate insulating film 168 (FIG. 16B). This partition wall layer 172 can be formed in a similar fashion to the partition wall layer 84 described above.

Figure 16C:
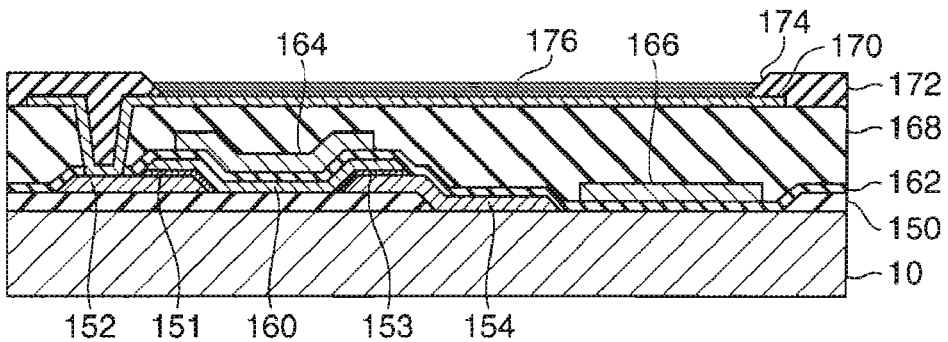
Figure 16D:
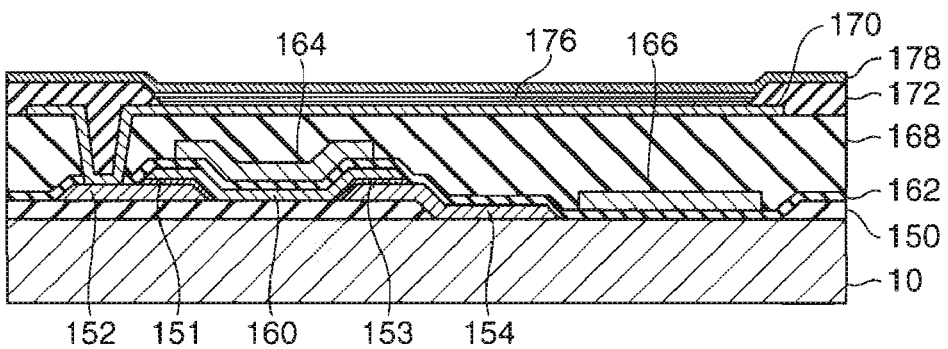

Next, the light-emitting layer 176 is formed on the pixel electrode 170 inside the opening 174 (FIG. 16C). This light-emitting layer 176 can be formed in a similar fashion to the light-emitting layer 88 described above.

Next, the common electrode 178 is formed on the partition wall layer 172 so as to extend to each light-emitting layer 176 (FIG. 17D). This common electrode 178 can be formed in a similar fashion to the common electrode 90 described above.

As described above, the organic EL device shown in FIG. 7 can be manufactured.

As described above, according to the abovedescribed embodiment combining the first insulating film with the second insulating film allows the functions required for an insulating film to be separated. Specifically, with regard to the first insulating film, it is possible to select the condition on the thickness, dielectric constant, or the like suitable for reducing the parasitic capacitance while securing the insulation between the substrate, and the transistor, organic EL element, and the like provided on this substrate. With regard to the second insulating film, it is possible to select the condition on the thickness, dielectric constant, or the like suitable for obtaining a larger capacitance when forming a capacitance element with the capacitance element interposed between the conductive substrate and capacitance electrode. Therefore, it is possible to achieve both an increase in the holding capacitance of the capacitance element and a reduction in the parasitic capacitance caused between the substrate and the circuit element or the like.

Second Embodiment

Now a second embodiment of the invention will be described.

As in FIG. 1 of the first embodiment, an organic EL device according to this embodiment includes a conductive substrate 10, a plurality of pixel parts 12 formed on a first surface of this substrate 10, and the common electrode 14 shared by the plurality of pixel parts 12. As shown in FIG. 1, the power supply 16 is coupled between the substrate 10 and common electrode 14.

The substrate 10 is required to be conductive at least on a first surface thereof, but it is more preferable that the entire substrate is formed of a conductor. Examples of the former type of the substrate 10 include one obtained by making a metal film such as an aluminum film, or a conductive film such as an indium tin oxide film (ITO film), on a first surface of an insulator substrate, such as a glass substrate, a quartz substrate, or a ceramics substrate. Among examples of the latter type of the substrate 10 is a stainless steel substrate. The substrate 10 is preferably a stainless steel substrate in terms of the requirements, such as heat resistance. It is also possible to use, as the substrate 10, one obtained by providing a conductive film on both sides of an insulator substrate and then coupling electrically between those conductive films. In this embodiment, such a substrate has a function similar to a conductive substrate.

The pixel parts 12 each include an organic EL element and a drive circuit for driving the organic EL element. The common electrode 14 is shared by the organic EL elements in the pixel parts 12, and functions as first electrodes of the organic EL elements. These will be described in detail later. In the organic EL device according to this embodiment, conductivity of the substrate 10 is used to supply power to each pixel part 12 via the substrate 10.

In the configuration shown in FIG. 1, connection between the substrate 10 and power supply 16 is made at one position of the substrate 10. If the substrate 10 is conductive only on a first surface thereof, the power supply 16 is coupled to the first surface of the substrate 10. If the substrate 10 is a conductor substrate, the power supply 16 can also be coupled to the second surface of the substrate 10. This increases flexibility in the position of the substrate 10 to which the power supply 16 is coupled. It is also preferable that the substrate 10 and power supply 16 be coupled at a plurality of positions. For example, as in FIG. 2 of the first embodiment, the substrate 10 and power supply 16 are preferably coupled at a plurality of positions widely scattered on the second surface of the substrate 10. Moreover, as illustrated in FIG. 2, the substrate 10 and power supply 16 are preferably coupled at a plurality of positions arranged in an orderly fashion (for example, at equal intervals). These allow a voltage drop in the plane of the substrate 10 to be suppressed more effectively. Here, the high potential terminal or low potential terminal (generally, ground terminal) of the power supply 16 is coupled to the substrate 10. FIG. 2 shows an example in which the high potential terminal of the power supply 16 is coupled to the substrate 10. Connection between the substrate 10 and power supply 16 will be described in detail also in third to fifth embodiments and the like.

Figure 17:
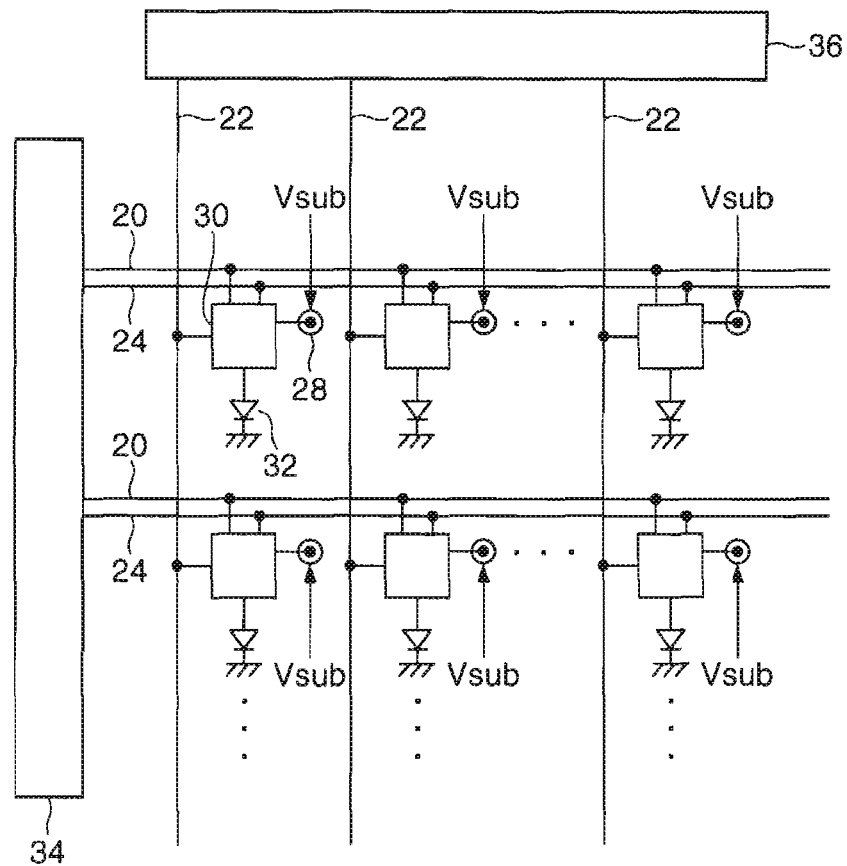
FIG. 17 is a diagram showing the circuit configuration of an organic EL device according to a second embodiment.

FIG. 17 is a diagram showing the circuit configuration of the organic EL device according to this embodiment. As shown in the diagram, the organic EL device includes a plurality of scan lines 20 and a plurality of reset lines 24 that extend in the horizontal direction (first direction) of the diagram, a plurality of signal lines 22 arranged so as to intersect these scan lines 20 and the like, a pixel circuit (drive circuit) 30 and an organic EL element 32 arranged at intersections of the scan lines 20 and signal lines 22, a driver 34 for supplying a control signal to the scan lines 20 and reset lines 24, and a driver 36 for supplying a control signal to the signal lines 22. As shown in the diagram, the pixel circuits 30 receive a voltage Vsub from the power supply 16 via each node 28. Each node 28 is electrically coupled to the conductive substrate 10 described above. That is, in this embodiment, the substrate 10 functions as a part of a power supply route.

Now an example of the configuration of the pixel circuit 30 will be described. As in FIG. 3 of the first embodiment, the pixel circuit 30 includes a transistor DR for controlling current, a transistor SW1 for writing data, a transistor SW2 for easing data, and holding capacitance Cs. The transistor DR is a p-channel field-effect transistor, and its source is coupled to the node 28 (connection point to the substrate 10) and its drain is coupled to a first terminal of the organic EL element 32. A first terminal of the organic EL element 32 provided so as to correspond to this drive circuit 30 is coupled to the drain of the transistor DR, and a second terminal thereof is coupled to a common ground. The gate of the transistor SW1 is coupled to the scan line 20, its source is coupled to the signal line 22, and its drain is coupled to the gate of the transistor DR. The gate of the transistor SW2 is coupled to the reset line 24, its source is coupled to the drain of the transistor SW1, and its drain is coupled to the node 28. The holding capacitance Cs is coupled in parallel between the gate and source of the transistor DR.

The operations of the pixel circuit 30 (see FIG. 3) is as follows a scan signal SEL is supplied via the scan line 20, and while the transistor SW1 is selected, a data signal DATA is written to the gate of the transistor DR via the signal line 22. A current depending on the magnitude of the data signal DATA is supplied from the power supply 16 to the organic EL element 32 via the node 28 and the source/drain routes of the transistor DR. This causes the organic EL element 32 to emit light with a level of brightness depending on the magnitude of the data signal DATA. A reset signal ERS is supplied via the reset line 24, and while the transistor SW2 is selected, the potential of the gate of the transistor DR is maintained at Vsub and the potential between the source and drain of the transistor DR becomes zero volts. Thus the transistor DR is turned off. This prevents the organic EL element 32 from receiving a current, putting the organic EL element 32 into a non-light-emitting state. In the circuit configuration shown in FIG. 3, the source of transistor DR that is a p-channel transistor is coupled to the node 28, and receives the voltage Vsub. These features stabilize the potential of the source of the transistor.

Figure 18:
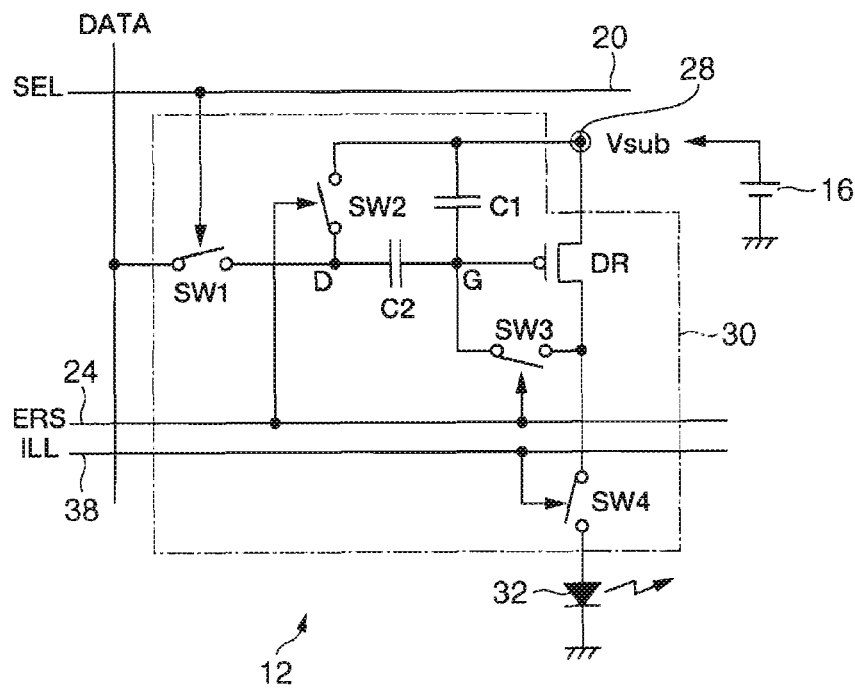
FIG. 18 is a diagram showing another example of the configuration of a pixel circuit according to the second embodiment.

FIG. 18 is another example of the configuration of the pixel circuit 30. Specifically, the pixel circuit 30 shown in FIG. 18 is configured such that compensation can be made for unevenness in the threshold voltage of the transistor DR. Like reference numerals are given to elements common to those in the pixel circuit 30 shown in FIG. 3, and detailed description on those elements will be omitted. The pixel circuit 30 illustrated in FIG. 18 receives a reset signal ERS via the reset line 24, and while the transistors SW2 and SW3 are selected, the threshold voltage of the transistor DR is written to the a node G. At this time, the transistor DR is turned off, so the organic EL element 32 is put into a non-light emitting state (lights-out state). While a scan signal SEL is supplied via the scan line 20 and the transistor SW1 is selected, the potential of the data signal DATA is written to a node D. At this time, the potential of the node G is determined depending on the capacitive coupling of the holding capacitance C2 and C1, putting the organic EL element into a light-emitting state (lighting state). When the organic EL element 32 is put into a non-light emitting state according to a control signal ILL supplied via the wiring 38, the transistor SW4 is turned off, serving to shut off power supply to the organic EL element 32. Note that the transistor SW4 and the wiring 38 may be omitted.

Figure 19:
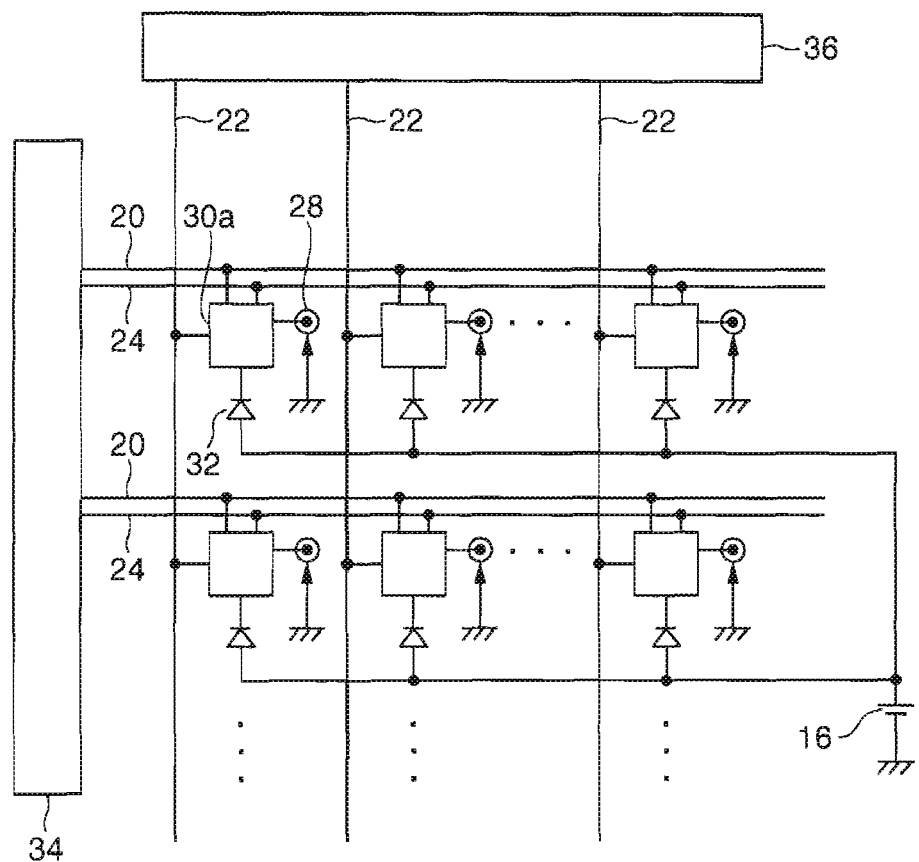
FIG. 19 is a diagram showing another example of the circuit configuration of the organic EL device according to the second embodiment.

FIG. 19 is a diagram showing another example of the circuit configuration of the organic EL device. Like reference numerals are given to elements common to those in the circuit shown in FIG. 17 described above, and detailed description on those elements will be omitted. The pixel circuit 30a in this example includes an n-channel transistor. Therefore, the connecting relations among the pixel circuit 30a, organic EL element 32, power supply 16, and a ground are different from those in the circuit shown in FIG. 17. As shown in the diagram, each pixel circuit 30a is coupled to the common ground via each node 28. Each node 28 is electrically coupled to the abovedescribed conductive substrate 10. In other words, the substrate 10 functions as a part of a power supply route. The voltage Vsub is supplied to a first terminal of each organic EL element 32 from the power supply 16.

Now an example of the configuration of the pixel circuit 30a will be described. This pixel circuit is similar to that shown in FIG. 4 of the first embodiment. Like reference numerals are given to elements common to those in the pixel circuit 30 shown in FIG. 3 described above, and detailed description on those elements will be omitted. The pixel circuit 30a illustrated in FIG. 4 includes an n-channel field effect transistor as the transistor DR. Therefore, the connecting relations among the power supply 16, transistor DR, organic EL element 32, and a ground are different from those in the pixel circuit 30 described above. Specifically, the source of the transistor DR is coupled to a first terminal of the organic EL element 32, and its drain is coupled to the node 28. A second terminal of the organic EL element 32 is coupled to the high potential terminal of the power supply 16.

Figure 20:
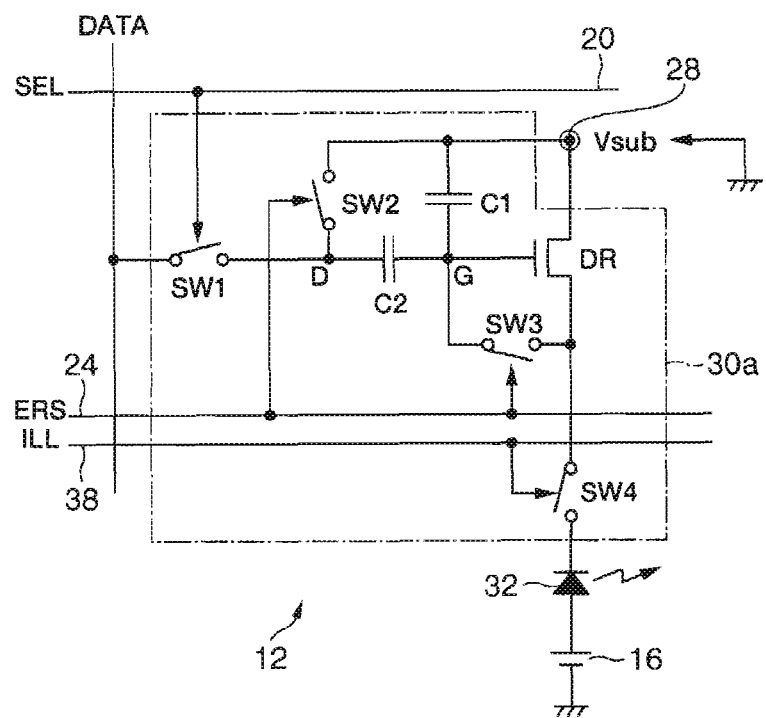
FIG. 20 is a diagram showing another example of the configuration of the pixel circuit according to the second embodiment.

FIG. 20 is a diagram showing another example of the configuration of the pixel circuit 30a. As with the pixel circuit 30 shown in FIG. 18, the pixel circuit 30a is configured such that compensation can be made for unevenness in the threshold voltage of the transistor DR. Like reference numerals are given to elements common to those in the pixel circuit 30 shown in FIG. 18, and detailed description on those elements will be omitted. Also in the pixel circuit 30a illustrated in FIG. 20, an n-channel transistor is used as the transistor DR. Therefore, the connecting conditions among the power supply 16, transistor DR, organic EL element 32, and a ground are different from those in the pixel circuit 30 shown in FIG. 18. Specifically, the source of the transistor DR is coupled to a first terminal of the organic EL element 32, and its drain is coupled to the node 28. A second terminal of the organic EL element 32 is coupled to the high potential terminal of the power supply 16.

Now the method for manufacturing an organic EL device according to this embodiment will be described.

FIGS. 21A to 21D, FIGS. 22A to 22D, and FIGS. 23A to 23C are process step sectional views showing an example of the method for manufacturing the organic EL device. In this example, a case in which the pixel circuit includes a coplanar transistor will be described.

Figure 21A:
FIGS. 21A to 21D are process step sectional views showing an example of a method for manufacturing an organic EL device according to the second embodiment.

First, the first insulating layer 50 is formed on a first surface of the conductive substrate 10 (FIG. 21A). As the first insulating film 50, insulating films such as a silicon oxide (SiOx) film, a silicon nitride (SiN) film, a silicon oxide nitride (SiON) film, and a ceramics thin film are used. As a method for forming the first insulating film 50, known techniques may be selected as appropriate. For example, chemical vapor deposition (CVD), sputtering, or the like may be used. It is also possible to use, as the first insulating film 50, an insulating film obtained on a surface of the substrate 10 by performing annealing or anodizing on the conductive substrate 10 in an oxidizing atmosphere. In particular, when a stainless steel substrate is adopted as the substrate 10, a passive film made of chromium oxide formed on the substrate surface also is preferably used as the first insulating film 50.

Figure 21B:
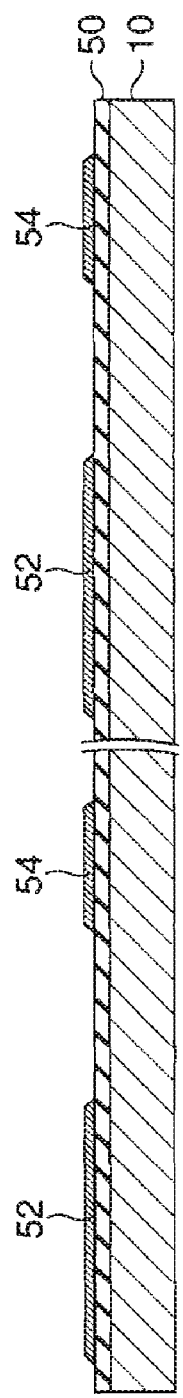

Next, semiconductor films 52 and 54 patterned into predetermined shapes (for example, island-shape) are formed (FIG. 21B). The semiconductor film 52 will become an active layer of the thin film transistor (channel forming region) later. The semiconductor film 54 will become a first electrode of the capacitance electrode later. As the semiconductor films 52 and 54, generally known semiconductor films such as an amorphous silicon film, a poly silicon film, a monocrystal silicon film, an oxide semiconductor film, and an organic semiconductor film are used. A method for forming these semiconductor films may be selected from known techniques as appropriate. For example, chemical vapor deposition (CVD), sputtering, coating, or the like may be used. In this embodiment, the semiconductor films 52 and 54 are formed using, for example, a poly silicon film.

Figure 21C:
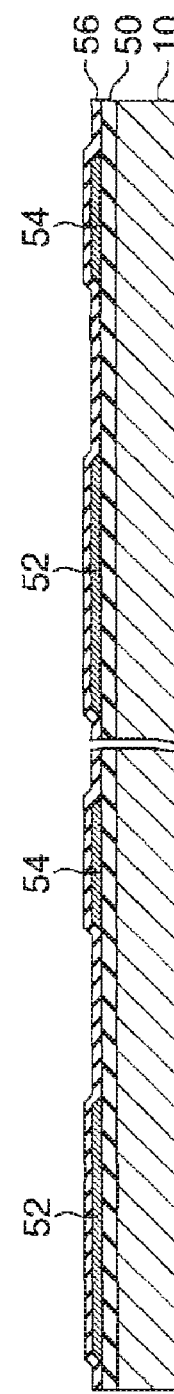

Next, the insulating film 56 for covering the semiconductor films 52 and 54 is formed on the substrate 10 (FIG. 21C). The portion of this insulating film 56 corresponding to the semiconductor film 52 will function as the gate insulating film for the thin film transistor later, and its portion corresponding to the semiconductor film 54 will function as a dielectric material layer that is a component of the capacitance element. As the insulating film 56, insulating films such as a silicon oxide (SiO2) film, a silicon nitride (SiN) film, a silicon oxide nitride (SiON) film, an aluminum oxide (Al2O3) film, a hafnium oxide (HfO) film are used. After the semiconductor films 52 and 54 are formed, the semiconductor film 54 is subjected to ion implantation (FIG. 21C).

Figure 21D:
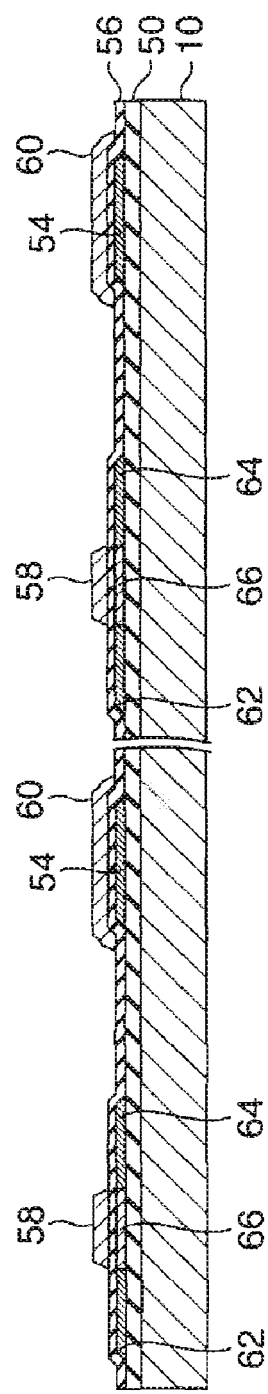

Next, electrodes 58 and 60 are formed (FIG. 21D). The electrode 58 will function as the gate electrode of the thin film transistor, and hereinafter this may be referred to as "gate electrode 58." The electrode 60 will function as a first electrode of the capacitance element later. Moreover, other electrodes and wiring not shown are also formed in this step. Those electrodes and wiring are included in the pixel circuits, scan lines, signal lines, and the like described above. The electrodes 58 and 60 are obtained by making a conductive film such as an aluminum film on the insulating film 56, and then patterning the conductive film. Moreover, after the electrodes 58 and 60 are formed, the semiconductor film 52 is subjected to ion-implantation (so-called "self-aligning ion implantation") with the gate electrode 58 used as a mask. Thus, a self-aligning source/drain region is formed on the semiconductor film 52. Specifically, the channel forming region 66 is formed right below the gate electrode 58 of the semiconductor film 52, and the source/drain regions 62 and 64 are formed on both sides of this channel forming region 66. The source/drain regions may be referred to as a first terminal or second terminal of the transistor. As a result, a coplanar thin film transistor as shown in the drawing is completed. This thin film transistor functions as the transistor DR (see FIG. 3, etc.) described above. Though not shown, other thin film transistors are formed in a similar fashion, and function as the transistors SW1, SW2, SW3, and SW4 described above. Moreover, the semiconductor film 54 that has undergone ion-implantation and thereby enhanced conductivity, electrode 60, and insulating film 56 interposed therebetween make up a capacitance element. This capacitance element functions as the holding capacitance Cs described above.

Figure 22A:
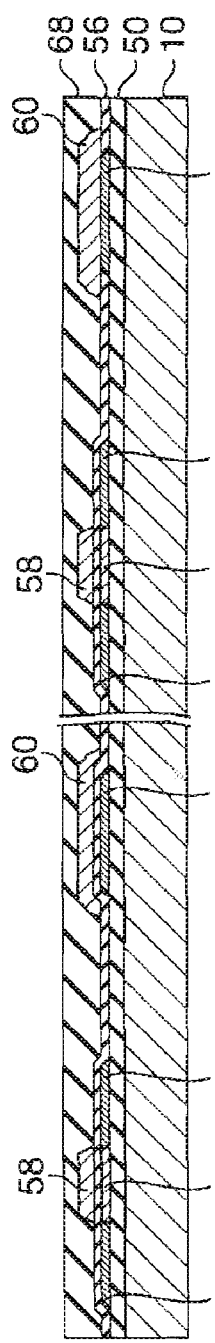
FIGS. 22A to 22D are process step sectional views showing the example of a method for manufacturing an organic EL device according to the second embodiment.

Next, the first intermediate insulating film 68 for forming the electrodes 58 and 60 is formed on the substrate 10 (FIG. 22A). As the first intermediate insulating film 68, it is possible to use an insulating film made of a material similar to the insulating film 50 described above, as well as to use a silicon oxide film (spin on glass film (SOG film)) to be made by coating, an organic insulating film made of polyimide or acrylic, or the like. It is preferable to use these SOG films and organic insulating films because those films can be made by a simple method such as coating.

Figure 22B:
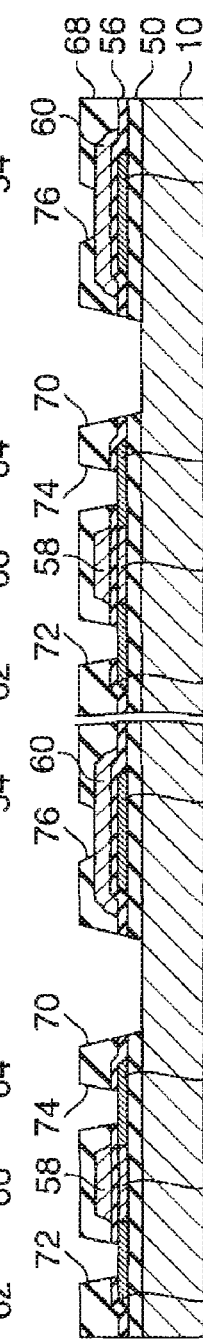

Next, contact holes 70, 72, 74, and 76 are formed at predetermined positions on the substrate 10 (FIG. 22B). More specifically, the contact hole 70 is formed at a position close to the thin film transistor including the gate electrode 58, or the like by removing the first insulating film 50, second insulating film 56, and first intermediate insulating film 68 so as to expose the first surface of the substrate 10. The contact hole 72 is formed by removing the second insulating film 56 and first intermediate insulating film 68 so as to expose the first side of the source/drain region 62. The contact hole 74 is formed by removing the second insulating film 56 and first intermediate insulating film 68 so as to expose the first side of the source/drain region 64. The contact hole 76 is formed by removing the first intermediate insulating film 68 so as to expose the first side of the capacitance electrode 60.

Figure 22C:
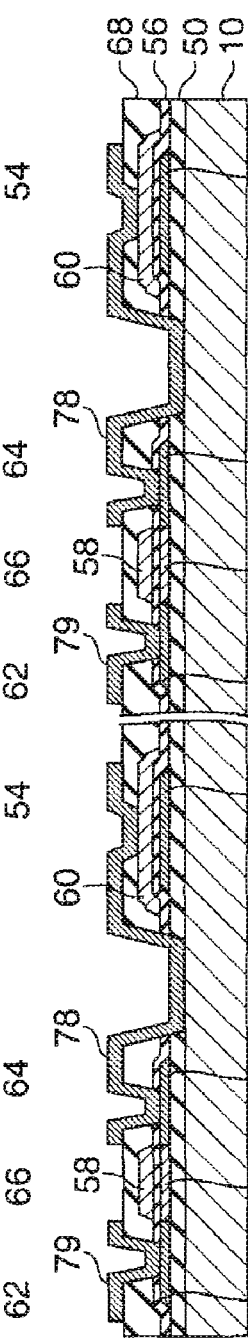

The wiring 78 and 79 and not shown other electrodes and wiring are formed (FIG. 22C). Those electrodes and wiring make up the abovedescribed pixel circuits, scan lines, signal lines, and the like. The wiring 78 and 79, and the like are obtained by making a conductive film such as an aluminum film on the first intermediate insulating film 68, and then patterning the conductive film. As shown in the drawing, the wiring 78 extends to the contact holes 70, 74, and 76, as well as are buried in these contact holes. The wiring 78 is electrically coupled to the substrate 10 via the contact hole 70, to the source/drain region 64 via the contact hole 74, and to the electrode 60 via the contact hole 76. Thus, the pixel circuit including the thin film transistor and capacitance element is electrically coupled to the substrate 10. More specifically, when the thin film transistor is of p-channel type, the source of the thin film transistor and substrate 10 are coupled to each other via the wiring 78, and the electrode 60 of the holding capacitance Cs and substrate 10 are coupled to each other via the wiring 78. Therefore, this configuration (process step) allows connection between the transistor and holding capacitance, and the substrate 10 to be achieved with a simple configuration (process step). When the thin film transistor is of n-channel type, the drain of the thin film transistor and the substrate are coupled to each other via the wiring 78.

As shown in the drawing, the wiring 79 is buried in the contact hole 72 so as to be electrically coupled to the source/drain region 62. When a stainless steel substrate is used as the substrate 10, exposure of the portion of the substrate 10 where the contact hole 70 is made to an atmosphere causes formation of a passive film on the substrate surface. Therefore, caution must be used. Specifically, this passive film may cause loose connection between the substrate 10 and wiring 78. In this case, the passive film is preferably eliminated by exposing the surface of the substrate 10 to plasma in a vacuum prior to forming the wiring 78.

Figure 22D:
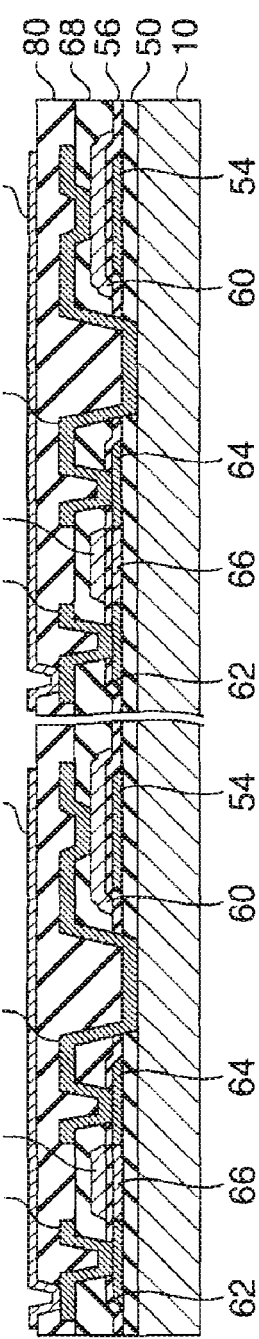

Next, the second intermediate insulating film 80 for covering the wiring 78 and 79 is formed on the substrate 10 (FIG. 22D). The second intermediate insulating film 80 may be formed in a similar fashion to the first intermediate insulating film 68 described above. Then, a contact hole for exposing a part of the wiring 79 is formed. Moreover, the pixel electrode 82 (anode) to be electrically coupled to the wiring 79 via this contact hole is formed on the second intermediate insulating film 80. In this embodiment, the organic EL device is assumed to be of top emission type, so the pixel electrode 82 is formed at a position that overlaps the thin film transistor and capacitance element vertically, in order to obtain a larger aperture ratio. The pixel electrode 82 is obtained by making a conductive film such as an aluminum film on the intermediate insulating film 80, and then patterning the conductive film.

Figure 23A:
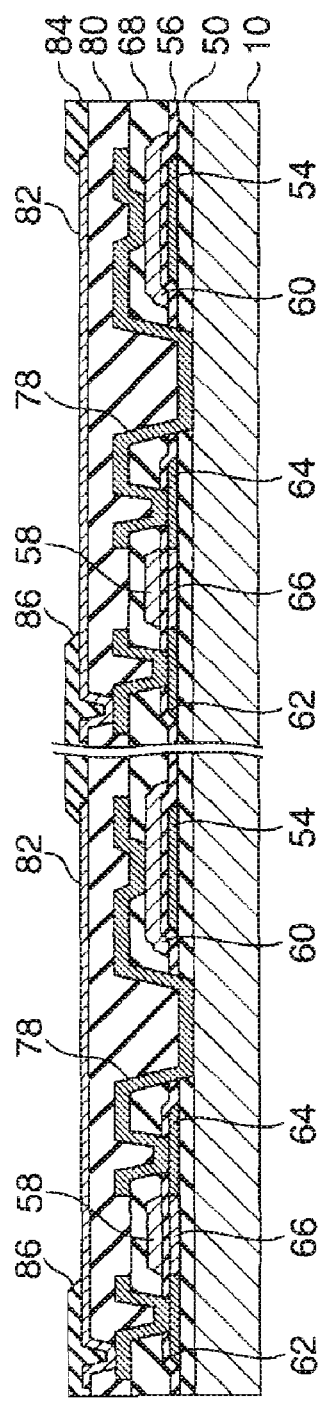
FIGS. 23A to 23C are process step sectional views showing the example of a method for manufacturing an organic EL device according to the second embodiment.

Next, the partition wall layer 84 that has the opening 86 for exposing the pixel electrode 82 is formed on the second intermediate insulating film 80 (FIG. 23A). This partition wall layer 84 is obtained by making a resin film such as a polyimide film or an acrylic film on the second intermediate insulating film 80, and then patterning the resin film.

Figure 23B:
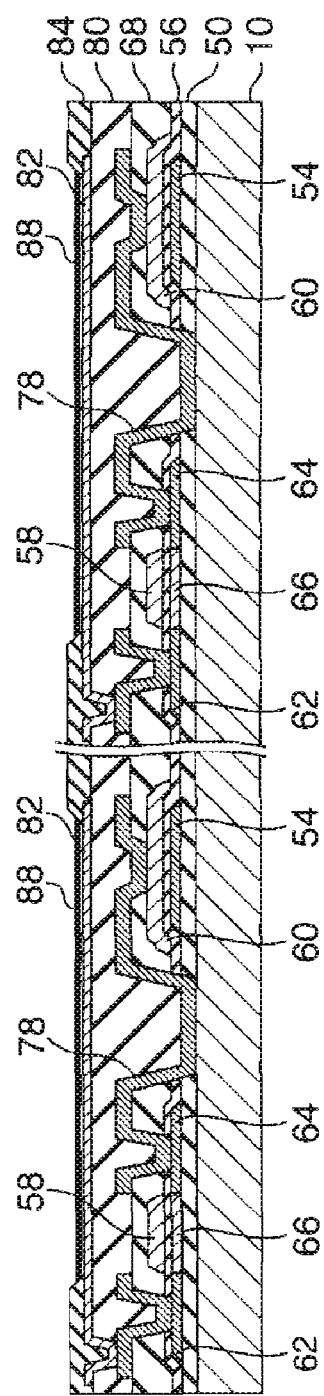

Next, the light-emitting layer 88 is formed on the pixel electrode 82 inside the opening 86 (FIG. 23B). This light-emitting layer 88 may be formed using any of a low molecular material or a high molecular material. Moreover, various known techniques such as vapor deposition, coating, and droplet ejection (inkjet) may be used to form the light-emitting layer 88. The light-emitting layer 88 may also be provided with various functional layers, such as an electron injection layer, an electron carrying layer, a positive hole injection layer, a positive hole carrying layer.

Figure 23C:
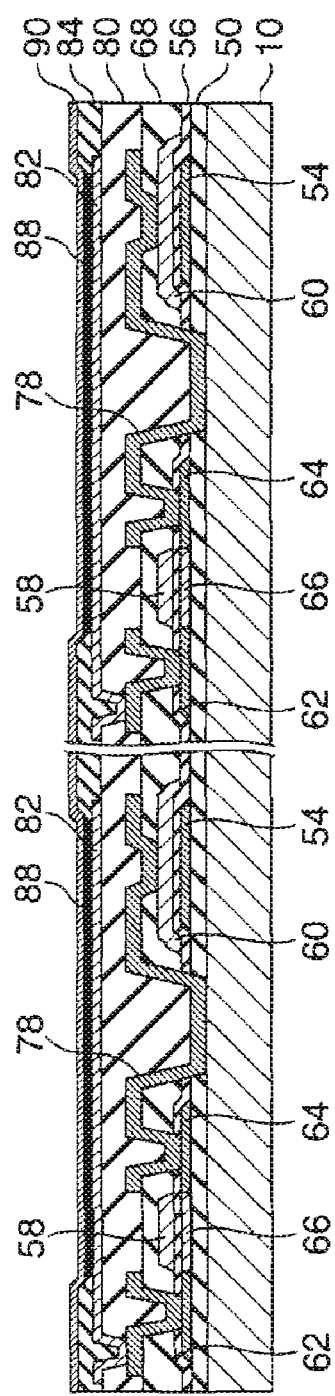

Next, the common electrode (cathode) 90 is formed on the partition wall layer 84 so as to extend to each light-emitting layer 88 (FIG. 23C). In this embodiment, the organic EL device has a top emission structure, so the common electrode 90 is formed using a light-transmissive or semi-light transmissive conductive film so as to take out light emitted from the light-emitting layer 88 toward an upper part of the drawing (direction opposite to the substrate 10). Among such conductive films is an indium tin oxide (ITO) film. The pixel electrode 82, light-emitting layer 88, and common electrode 90 make up the organic EL element. When the thin film transistor DR is of p-channel type, the pixel electrode 82 serving as a first terminal of this organic EL element is coupled to the drain of the thin film transistor DR via the wiring 79, and the common electrode 90 serving as a second terminal of the organic EL element is coupled to a common ground (not shown). When the thin film transistor DR is of n-channel type, the pixel electrode 82 serving as the first terminal of this organic EL element is coupled to the source of the thin film transistor DR via the wiring 79, and the common electrode 90 serving as the second terminal of the organic EL element 32 is coupled to the power supply 16 (not shown).

As described above, it is possible to obtain an organic EL device in which each circuit element (thin film transistor, capacitance element) and the substrate 10 are electrically coupled to each other and each pixel part uses the substrate 10 as a part of a power supply route.

Now, as another example of the method for manufacturing an organic EL device according to this embodiment, a case in which the pixel circuit includes an inverted staggered transistor will be described.

FIGS. 24A to 24D, FIGS. 25A to 25D, and FIGS. 26A to 26C are process step sectional views showing an example of the method for manufacturing an organic EL device.

First, an insulating film 100 is formed on a first surface of the substrate 10 (FIG. 24A). This insulating film 100 is formed in a similar fashion to the first insulating film 50 described above.

Next, the contact hole 101 is formed at a predetermined position of the insulating film 100 (FIG. 24B). As shown in the drawing, this contact hole 101 is formed so as to expose the first surface of the substrate 10.

Next, electrodes 102 and 104 and wiring 106 are formed (FIG. 24C). The electrode 102 will function as the gate electrode of the thin film transistor later, and hereinafter may be referred to as "gate electrode 102." The electrode 104 will function as a first electrode of the capacitance element later. Moreover, the wiring 106 is formed so as to come into contact with the first surface of the substrate 10.

Next, the insulating film 108 for covering the electrodes 102 and 104 and wiring 106 is formed on the substrate 10 (FIG. 24D). The portion of this insulating film 108 corresponding to the electrode (gate electrode) 102 will function as the gate insulating film for the thin film transistor later, and its portion corresponding to the electrode 104 will function as a dielectric material layer that is a component of the capacitance element. The insulating film 108 can be formed in a similar fashion to the insulating film 56 described above.

Figure 25A:
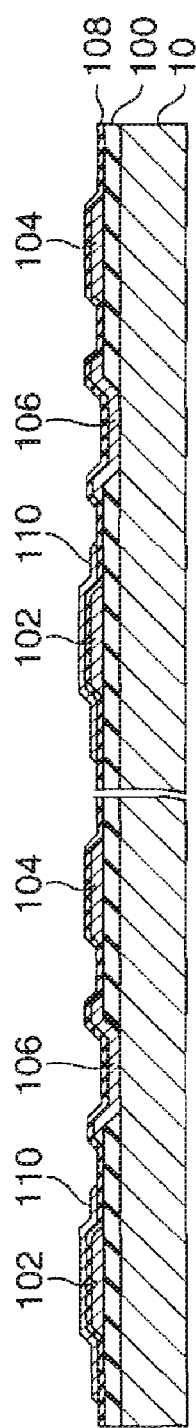
FIGS. 25A to 25D are process step sectional views showing the example of a method for manufacturing an organic EL device according to the second embodiment.

Next, the semiconductor film 110 patterned into a predetermined shape (for example, island-shape) is formed (FIG. 25A). The semiconductor film 110 will become an active layer of the thin film transistor (channel forming region) later. The semiconductor film 110 can be formed in a similar fashion to the semiconductor films 52 and 54 described above.

Figure 25B:
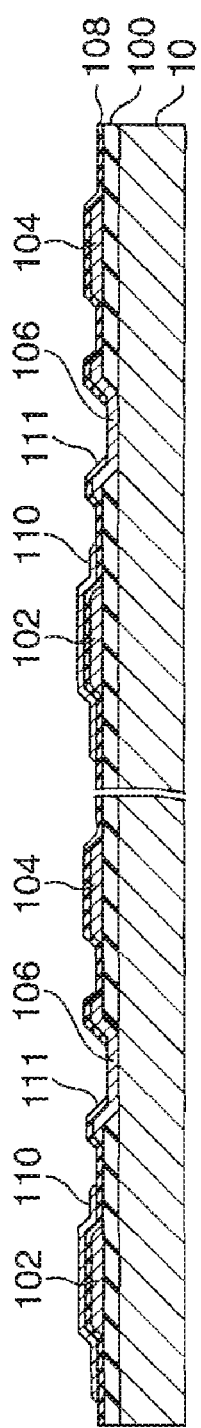

Next, the contact hole 111 is formed at a predetermined position above the substrate 10 (FIG. 25B). More specifically, the contact hole 111 is formed at a position close to the thin film transistor including the gate electrode 102 and the like by removing the second insulating film 108 so as to expose a first side of the wiring 106.

Figure 25C:
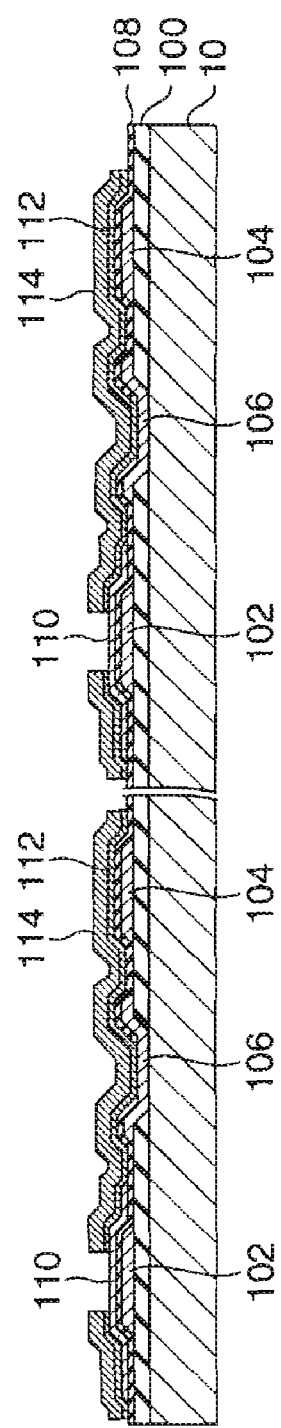

Next, the doped semiconductor film 112 and wiring 114 are continuously formed and patterned into predetermined shapes (FIG. 25C). More specifically, the doped semiconductor film 112 and wiring 114 are formed so as to extend from the electrode 104 to the electrode 102 and to be electrically coupled to the electrode 106. Moreover, a part (region corresponding to an upper part of the gate electrode 102) of the semiconductor film 110 is removed.

Figure 25D:
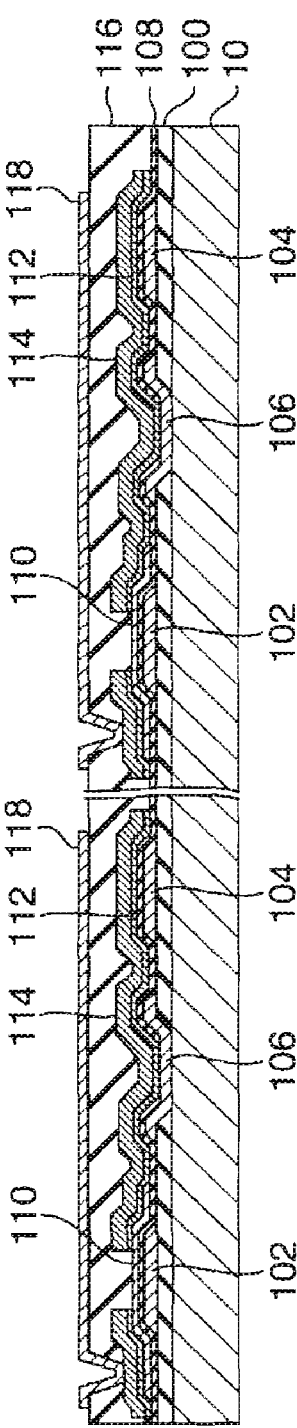

Next, the intermediate insulating film 116 for covering each wiring 114 is formed above the substrate 10 (FIG. 25D). The intermediate insulating film 116 can be formed in a similar fashion to the second intermediate insulating film 80 described above. Then, a contact hole for exposing a part of the wiring 114 is formed. Moreover, the pixel electrode 118 (anode) to be electrically coupled to the wiring 114 via this contact hole is formed on the second intermediate insulating film 116. In this embodiment, the organic EL device is assumed to be of top emission type, so the pixel electrode 118 is formed at a position that overlaps the thin film transistor and capacitance element vertically, in order to obtain a larger aperture ratio.

Figure 26A:
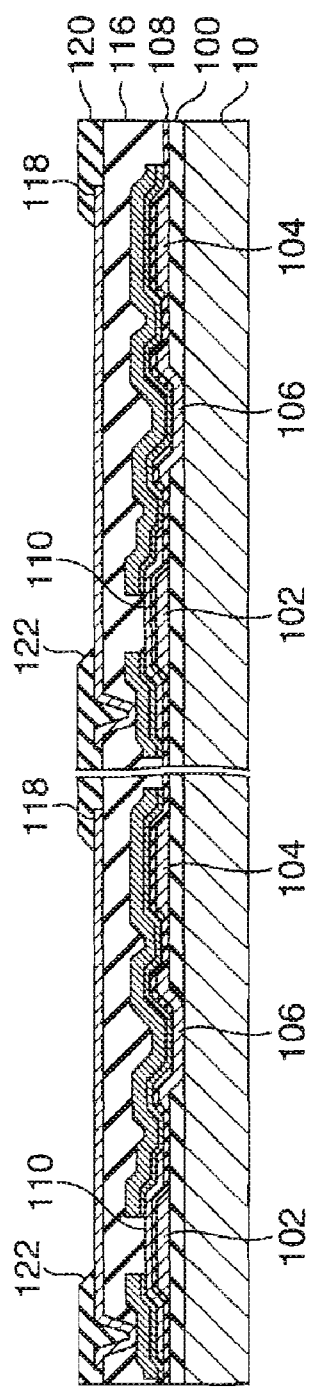
FIGS. 26A to 26C are process step sectional views showing the example of a method for manufacturing an organic EL device according to the second embodiment.

Next, the partition wall layer 120 that has the opening 122 for exposing the pixel electrode 118 is formed on the intermediate insulating film 116 (FIG. 26A). This partition wall layer 120 can be formed in a similar fashion to the partition wall layer 84 described above.

Figure 26B:
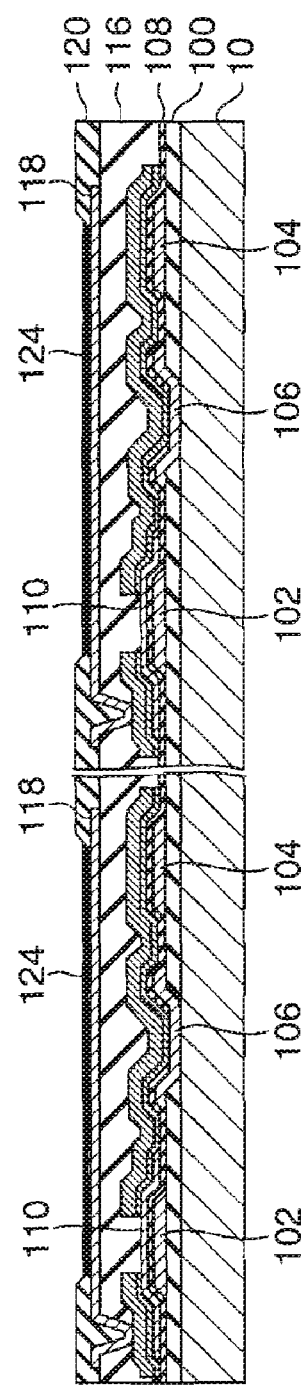

Next, the light-emitting layer 124 is formed on the pixel electrode 118 inside the contact hole 122 (FIG. 26B). This light-emitting layer 124 can be formed in a similar fashion to the light-emitting layer 88 described above.

Figure 26C:
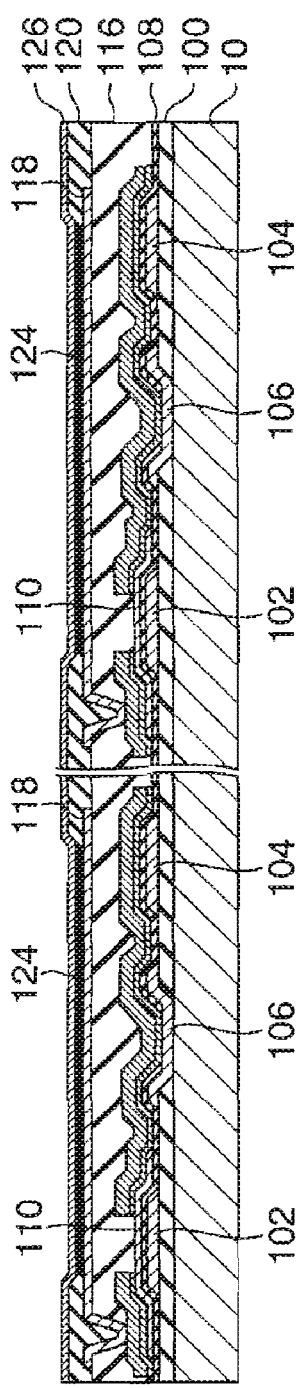

Next, the common electrode 126 is formed on the partition wall layer 120 so as to extend to each light-emitting layer 124 (FIG. 26C). This common electrode 126 can be formed in a similar fashion to the common electrode 90 described above.

As described above, it is possible to obtain an organic EL device in which each circuit element (thin film transistor, capacitance element) and the substrate 10 are electrically coupled to each other and each pixel part uses the substrate 10 as a part of a power supply route.

Now, as another example of the method for manufacturing an organic EL device according to this embodiment, a case in which the pixel circuit includes a staggered transistor will be described.

Figure 27A:
FIGS. 27A to 27D are process step sectional views showing an example of a method for manufacturing an organic EL device according to the second embodiment.

FIGS. 27A to 27D, FIGS. 28A to 28D, and FIGS. 29A to 29D are process step sectional views showing an example of the method for manufacturing an organic EL device. First, an insulating film 150 is formed on a first surface of the conductive substrate 10 (FIG. 27A). This insulating film 150 is formed in a similar fashion to the first insulating film 50 described above.

Figure 27B:
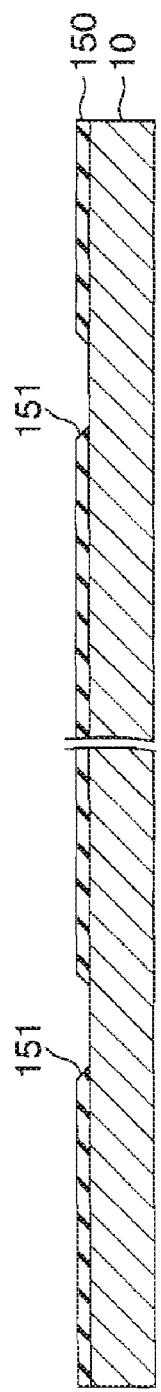

Next, the contact hole 151 is formed at a predetermined position of the insulating film 150 (FIG. 27B). As shown in the drawing, this contact hole 151 is formed so as to expose the first surface of the substrate 10.

Figure 27C:
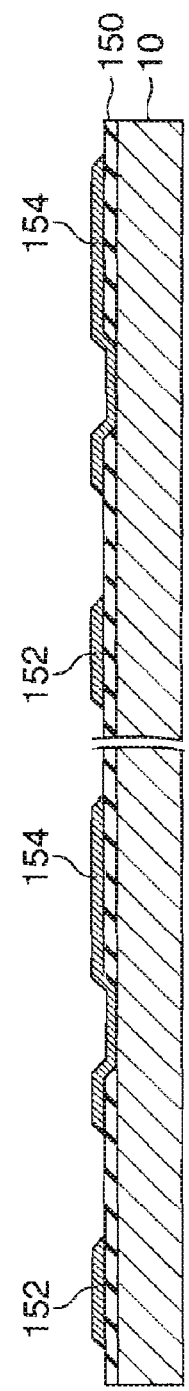

Next, the wiring 152 and 154 are formed (FIG. 27C). The wiring 152 and 154 will function as source/drain electrodes of the thin film transistor later. Moreover, a part of the wiring 154 is formed so as to come into contact with the first surface of the substrate 10 via the contact hole 151.

Figure 27D:
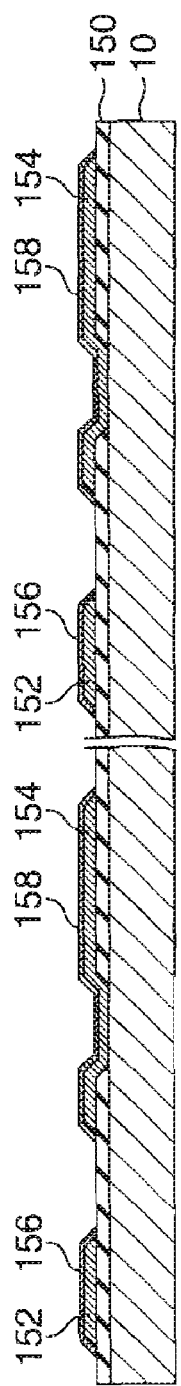

Next, the doped semiconductor films 156 and 158 shaped so as to cover each wiring 152 and 154 are formed (FIG. 27D). Specifically, the doped semiconductor films 156 and 158 are obtained by making a semiconductor film on the substrate 10, for example, by a filmmaking method such as chemical vapor deposition (CVD) or sputtering, and then patterning the semiconductor film to correspond to the shapes of the wiring 152 and 154. It is also possible to make the doped semiconductor films 156 and 158 by applying a liquid material to the surfaces of the wiring 152 and 154 by droplet ejection.

Figure 28A:
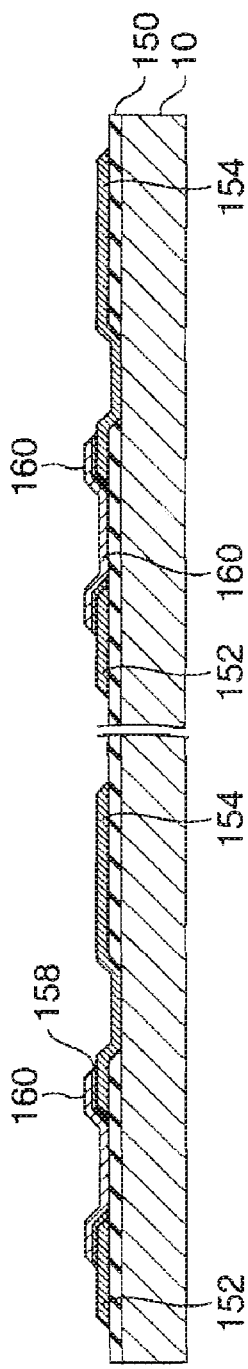
FIGS. 28A to 28D are process step sectional views showing the example of a method for manufacturing an organic EL device according to the second embodiment.

Next, the semiconductor film 160 patterned into a predetermined shape (for example, island-shape) is formed (FIG. 28A). The semiconductor film 160 will become an active layer of the thin film transistor (channel forming region) later. The semiconductor film 160 can be formed in a similar fashion to the semiconductor films 52 and 54 described above. In this embodiment, the semiconductor film 160 is formed so as to extend to the wiring 152 and wiring 154. The doped semiconductor film 156 formed first is eliminated when the semiconductor film 160 is formed (at the time of patterning). There remain portions of the doped semiconductor film 158 covered with the semiconductor film 160, and other portions thereof are removed when the semiconductor film 160 is formed (at the time of patterning). As a result, the doped semiconductor film 158 lies between the semiconductor film 160 and wiring 152 and between the semiconductor film 160 and wiring 154.

Figure 28B:
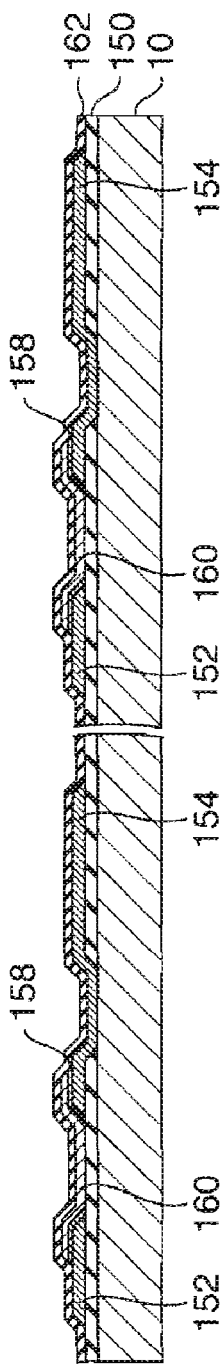

Next, the insulating film 162 for covering the electrodes 152 and 154 and semiconductor film 160 is formed above the substrate 10 (FIG. 28B). As described later, this insulating film 162 will function as the gate insulating film of the thin transistor film and also as a dielectric material layer that is an element of the capacitance element. The insulating film 162 is formed in a similar fashion to the insulating film 56 described above.

Figure 28C:
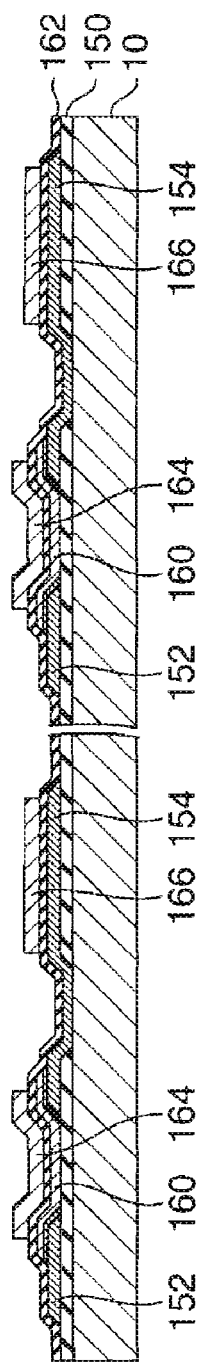

Next, the electrodes 164 and 166 are formed (FIG. 28C). Specifically, the electrode 164 is formed at a position that overlaps the semiconductor film 160 with the insulating film 162 therebetween. The electrode 164 will function as the gate electrode of the thin film transistor, and hereinafter may be referred to as "gate electrode 164." The electrode 166 is formed at a position that overlaps a part of the electrode 154 with the insulating film 162 therebetween. The electrode 166 will function as a first electrode of the capacitance element later.

Figure 28D:
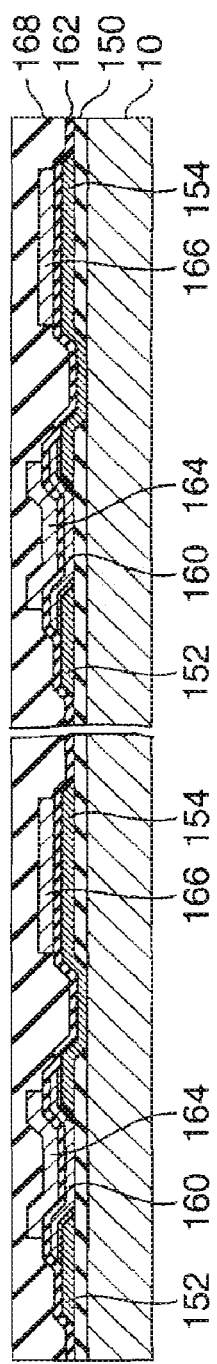

Next, the intermediate insulating film 168 for covering the electrodes 164 and 166 is formed above the substrate 10 (FIG. 28D). The intermediate insulating film 168 can be formed in a similar fashion to the second intermediate insulating film 80 described above.

Next, a contact hole for exposing a part of the wiring 152 is formed. Moreover, the pixel electrode (anode) 170 to be electrically coupled to the wiring 152 via this contact hole is formed on the intermediate insulating film 168 (FIG. 29A). In this embodiment, the organic EL device is assumed to be of so-called "top emission" type, so the pixel electrode 170 is formed at a position that overlaps the thin film transistor and capacitance element vertically, in order to obtain a larger aperture ratio.

Next, the partition wall layer 172 that has an contact hole 174 for exposing pixel the electrode 170 is formed on the intermediate insulating film 168 (FIG. 29B). This partition wall layer 172 can be formed in a similar fashion to the partition wall layer 84 described above.

Next, the light-emitting layer 176 is formed on the pixel electrode 170 inside the contact hole 174 (FIG. 29C). This light-emitting layer 176 can be formed in a similar fashion to the light-emitting layer 88 described above.

Next, the common electrode (cathode) 178 is formed on the partition wall layer 172 so as to extend to each light-emitting layer 176 (FIG. 29D). This common electrode 178 can be formed in a similar fashion to the common electrode 90 described above.

As described above, it is possible to obtain an organic EL device in which each circuit element (thin film transistor, capacitance element) and the substrate 10 are electrically coupled to each other and each pixel part uses the substrate 10 as a part of a power supply route.

As described above, according to this embodiment, it is possible to use the conductive substrate as a part of a route through which power source (power) is supplied to the organic EL element and pixel circuit (drive circuit). As a result, wherever the organic EL element is disposed on the substrate, it is possible to supply power source via the substrate, thereby eliminating unevenness in the power supply potential in the plane of the substrate surface. Therefore, it is possible to obtain an organic EL device that makes the in-plane distribution of the luminescent brightness of an organic EL element more even.

Figure 30:
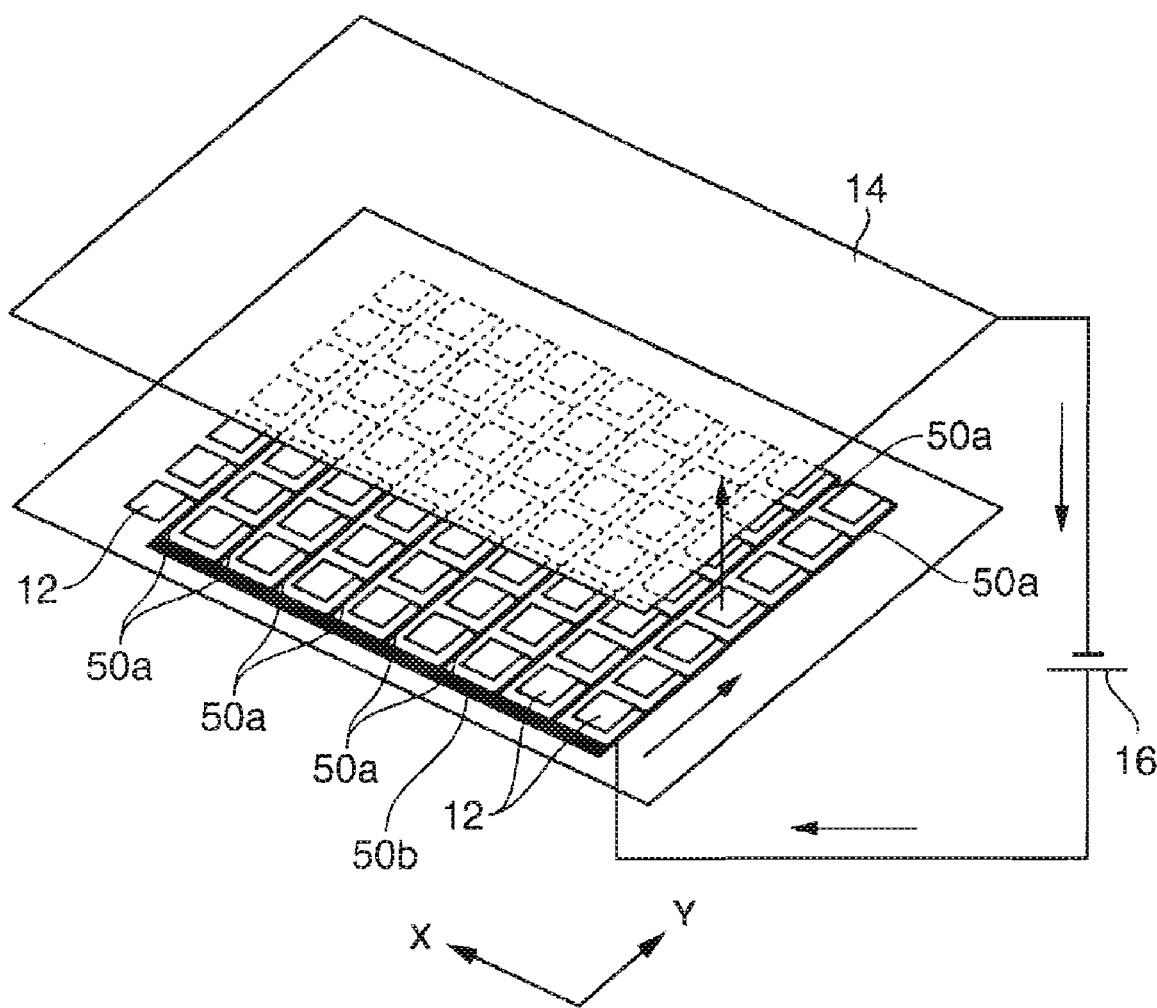
FIG. 30 is a principal part plan view showing an organic EL element as a comparative example to show an advantage of the second embodiment.

FIG. 30 is a principal part plan view of an organic EL element as a comparative example for showing an advantageous effect of this embodiment. As shown in FIG. 30, when a pixel circuit is constructed, for example, using a coplanar transistor, on an insulating substrate such as a glass substrate, a plurality of power supply lines 50a must be disposed between the columns or rows of the pixel parts 12. A common power supply line coupled to the plurality of power supply lines 50a together is defined as 50b. In this case, the position of a power supply line 50a remote from the common power supply line 50b may have a lower potential due to its wiring resistance. Therefore, a lower potential is applied to the EL electrode of a pixel part 12 remote from the common power supply line 50b, thereby reducing the brightness of the pixel part. Moreover, there occurs unevenness in brightness depending on the positions of the pixel (for example, pixels near the common power supply line 50b and those remote from the common power supply line 50b), thereby preventing stable display.

On the other hand, according to this embodiment, power is supplied to each pixel 12 via the conductive substrate described above, thereby allowing unevenness in power supply potential to be eliminated. This makes it possible to make the in-plane distribution of the luminescent brightness of the organic EL element more even as well as to improve the display performance of the device.

Third Embodiment

In the second embodiment, the pixel circuit formed on the conductive substrate and the configuration of the transistor in the pixel circuit have been described in detail. In this embodiment, the position of an EL power supply pad 10P that is an external connection electrode (external terminal, pad) for supplying a power potential to the conductive substrate will be described in detail.

As described in detail in the first and second embodiments, the method for connecting the pixels, the drive circuit provided inside each pixel, the transistors included in the drive circuit, and the like can take various forms also in this embodiment. Therefore, overlapping description will be omitted. In this embodiment, the position of the external connection electrode described above will be described in detail.

Figure 31:
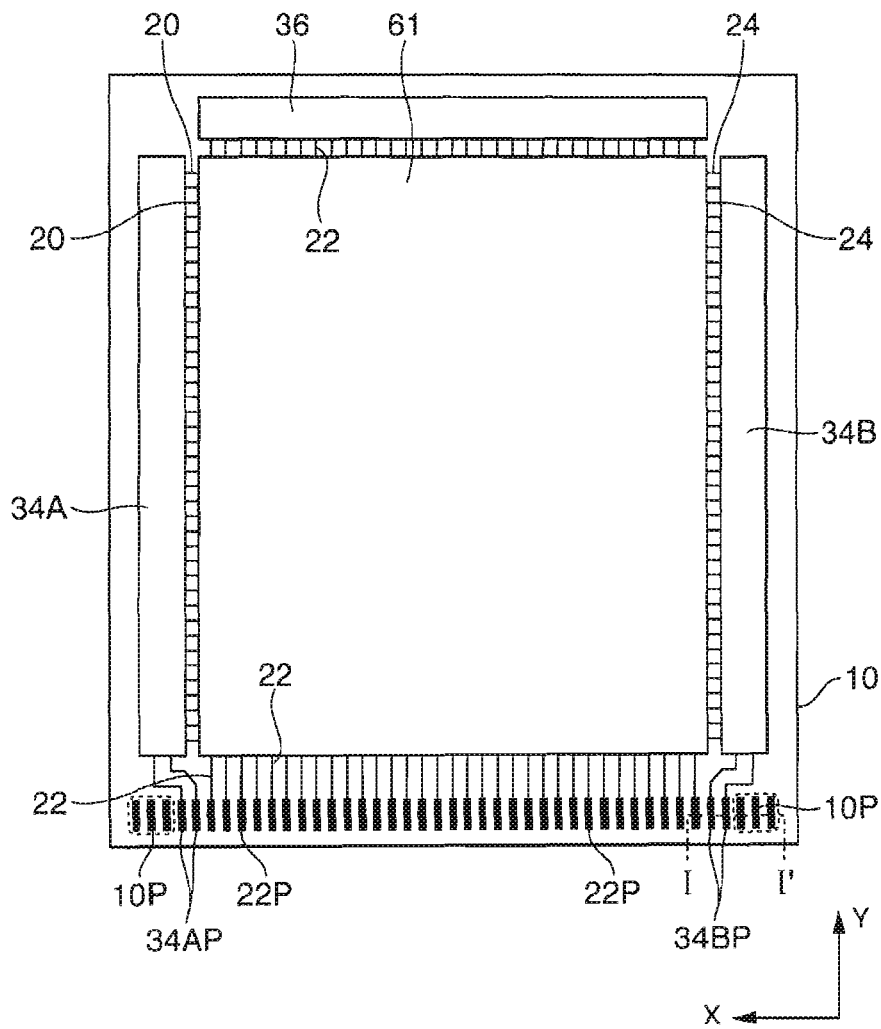
FIG. 31 is a principal part plan view showing the configuration of an organic EL device according to a third embodiment.
Figure 32:
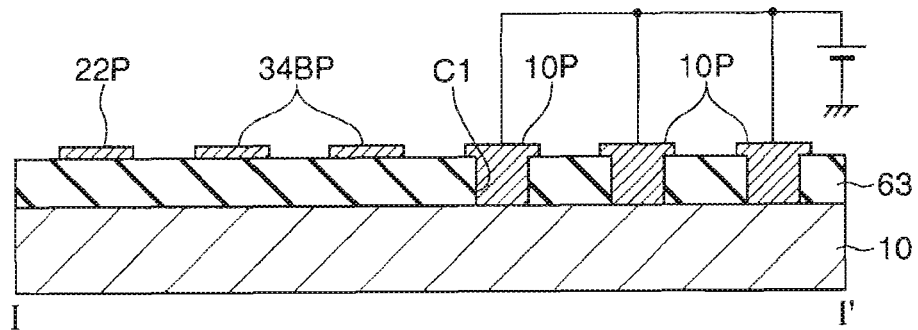
FIG. 32 is a principal part sectional view of I-I' part of FIG. 31.

FIG. 31 is a principal part plan view showing the configuration of an organic EL device according to this embodiment. FIG. 32 is a principal part sectional view of I-I' part of FIG. 31.

As shown in FIG. 31, an approximately rectangular active matrix section 61 is provided on the conductive substrate 10. Provided on this active matrix section are pixels (drive circuits) in a matrix. As described in detail referring to FIGS. 17 and 19 and the like, disposed on the active matrix section 61 are a plurality of scan lines (scan lines for writing) 20 and a plurality of reset lines 24 (scan lines for erasing) that both extend in the horizontal direction (first direction) in the drawing, and a plurality of signal lines 22 (data lines) that are arranged so as to intersect these scan lines 20 and the like. Each pixel (pixel circuit (drive circuit) 30 and organic EL element 32) is disposed at the intersection of each scan line 20 and signal line 22.

In FIG. 31, a write scan driver 34A for supplying a control signal to each scan line 20 and an erase scan driver 34B for supplying a control signal to each reset line 24 are disposed along opposed edges of the active matrix section 61 extending in the y direction. A driver (data driver) 36 for supplying a control signal to each signal line 22 is disposed along an edge of the active matrix 61 extending in the x direction. Disposed in the vicinity of an edge opposed to this edge are signal supply pads 22P each mounted at the end of the signal line 22.

These signal supply pads 22P are disposed side-by-side in the x direction. Disposed on the sides of those signal supply pads 22P are a pad 34AP to be coupled to the write scan driver 34A and a pad 34BP to be coupled to the erase scan driver 34B. Moreover, disposed outside those pads are EL power supply (voltage Vsub) pads 10P. Arranging the signal supply pads 22P, pad 34AP, pad 34BP and the like, and the EL power supply pads 10P side-by-side in this manner allows these pads to be easily coupled to external wiring (for example, external wiring printed on a film). For example, when wiring printed on a film is used as external wiring, the wiring is easily mounted on those pads (including the EL power supply pads 10P) by fixing the wiring and those pads to each other by applying pressure.

As shown in FIG. 32, these pads (22P, 34BP, 10P) are formed of a conductive film. Of these pads, the pads 22P and pad 34BP (also applicable to pad 34AP) are each disposed on the conductive substrate 10 with an insulating film 63 therebetween, and the EL power supply pads 10P are disposed in and on a contact hole C1 that is an opening of the insulating film 63. This insulating film 63 is either one of the plurality of insulating films (50, 56, 68, 80, 84), or a multilayer including these films. Specifically, a film is deposited as necessary around the perimeter of the active matrix section 61; the pads (22P, 34BP, and the like) are formed on the film; the contact hole C1 is formed by removing a part of the film selectively and the pads (10P) are formed by depositing a conductive film in and on the film. As a matter of course, the insulating film 63 may be formed separately from the insulating films (50, 56, 68, 80, 84). Moreover, these pads may be formed of a film in the same layer as the various types of wiring layers or electrode layers (for example, 78 and 82), or may be provided in a different layer independently. As described above, this embodiment includes a process step for forming the EL power supplying pads 10P to be coupled to the conductive substrate 10 around the perimeter of the active matrix section 61 (pixel region) in which the plurality of drive circuits and the plurality of organic EL elements are formed, in addition to the process step for forming a pixel described in detail in the second embodiment and the like.

Thus, when the voltage Vsub is applied to the EL power supply pads 10P, the voltage Vsub is supplied to each pixel (pixel circuit 30, more specifically, one terminal of the holding capacitance Cs or transistor DR included in the pixel circuit 30) via the conductive substrate 10 (see FIG. 3 or the like).

As described above, in this embodiment, power is supplied to each pixel via the conductive substrate 10. Therefore, as described in detail in the second embodiment, unevenness in the power supply potential can be eliminated. This makes it possible to make the in-plane distribution of the luminescent brightness of the organic EL element more even. Moreover, the display performance of the device can be improved.

Further, supplying power to each pixel via the conductive substrate allows the wiring pitch of the signal line 22 to be made smaller. Furthermore, size-reduction or higher integration of the organic EL device can be achieved.

Figure 33:
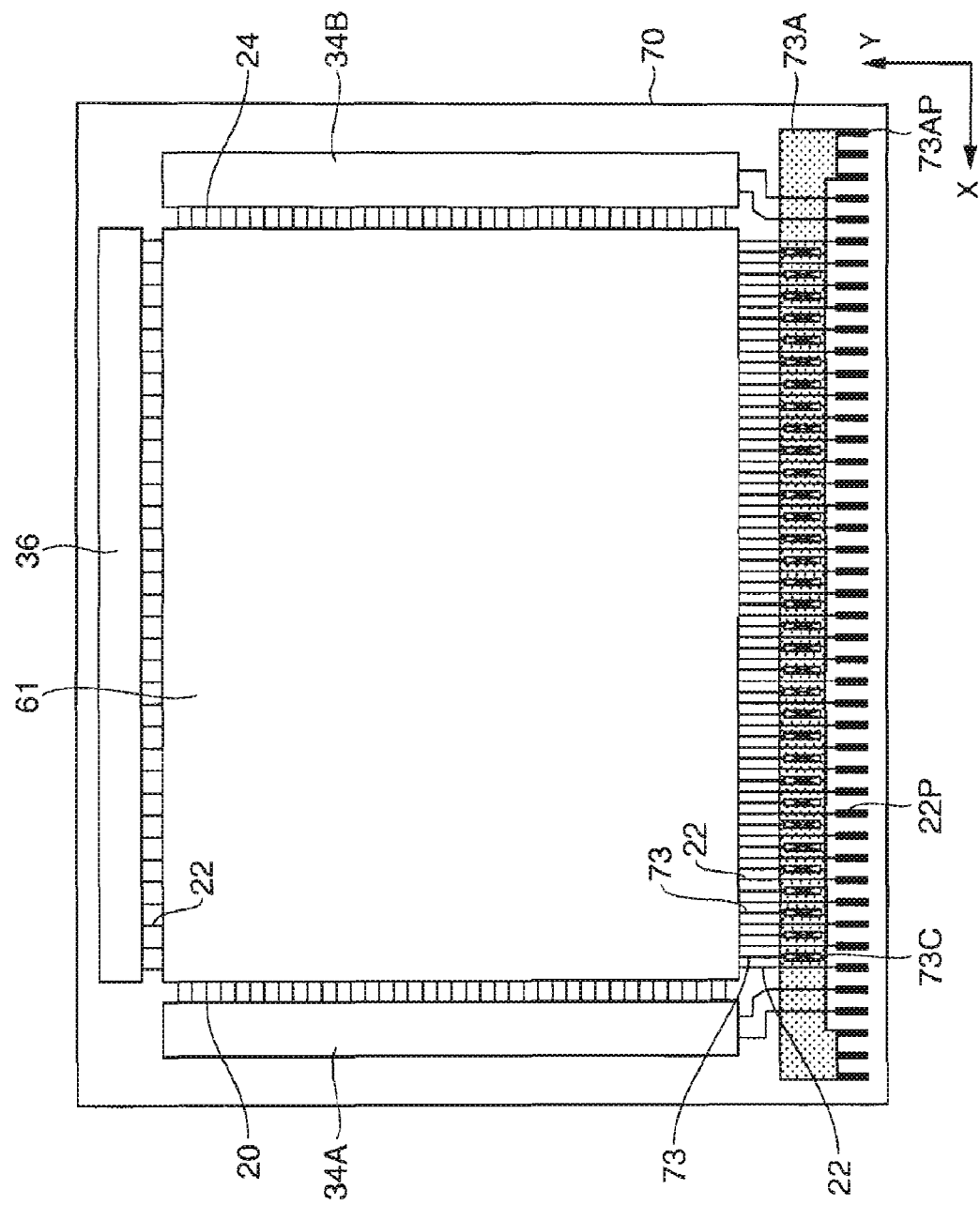
FIG. 33 is a principal part plan view showing the configuration of an organic EL device (comparative example) to show an advantage of the third embodiment.

These matters will be described referring to FIG. 33. FIG. 33 is a principal part plan view showing the configuration of an organic EL device (comparative example) to show an advantage of this embodiment. Like reference numerals are given to the same parts as those in FIG. 31 and the like, and description on those parts will be omitted.

As shown in FIG. 33, when an insulating substrate 70 is used, a power supply line 73 in addition to the signal line 22 need be coupled to each pixel. In an example shown in FIG. 33, the power supply line 73 is disposed between the signal lines 22. Therefore, a predetermined length must be secured as the pitch between these lines. It is possible to make the pitch between these lines smaller by forming these lines in different layers, but those lines must make contact with each pixel. Therefore, even if the multilayer wiring as described above is carried out, there is a limitation in making the wiring pitch smaller. In FIG. 33, in order to reduce unevenness in the power supply potential in each part of the power supply line 73, a common power supply line 73A with a large wiring width is disposed in the x direction, and a power supply line 73 is disposed in the y direction from this common power supply line 73A. Therefore, space in which the common power supply line 73A is to be disposed must be secured, and contact parts 73C for coupling the common power supply line 73A and the common power supply line 73A must be secured. These make it difficult to make the wiring width smaller. Note that 73AP represents a pad for the common power supply line.

On the other hand, this according to this embodiment, power is supplied to each pixel via the conductive substrate 10. Therefore, there is no need to dispose the power supply line 73, thereby allowing the wiring pitch of the signal line 22 to be made smaller. For example, when comparison is made between FIG. 31 and FIG. 33, the width of the active matrix 61 in the x direction in FIG. 61 is smaller than that in FIG. 33. Moreover, since there is no need to dispose the common power supply line 73A, the width of the active matrix 61 in the y direction in FIG. 61 is smaller than that in FIG. 33.

Thus, the size of the organic EL device, particularly, the area of the periphery of the pixel region (display region) can be reduced. In other words, the frame size can be reduced. Moreover, higher integration of the organic EL device can be achieved.

Forth Embodiment

In the third embodiment, the EL power supply pads 10P are disposed at both ends of an edge of the approximately rectangular conductive substrate 10. In this embodiment, the EL power supply pads 10P are disposed at the four corners of the approximately rectangular conductive substrate 10. Description will be made below referring to the drawings. Like reference numerals are given to the same elements as those in the third embodiment, and detailed description on those elements will be omitted. As described in the second embodiment, the method for connecting the pixels, the drive circuit provided inside each pixel, the transistors included in the drive circuit, and the like can take various forms also in this embodiment.

Figure 34:
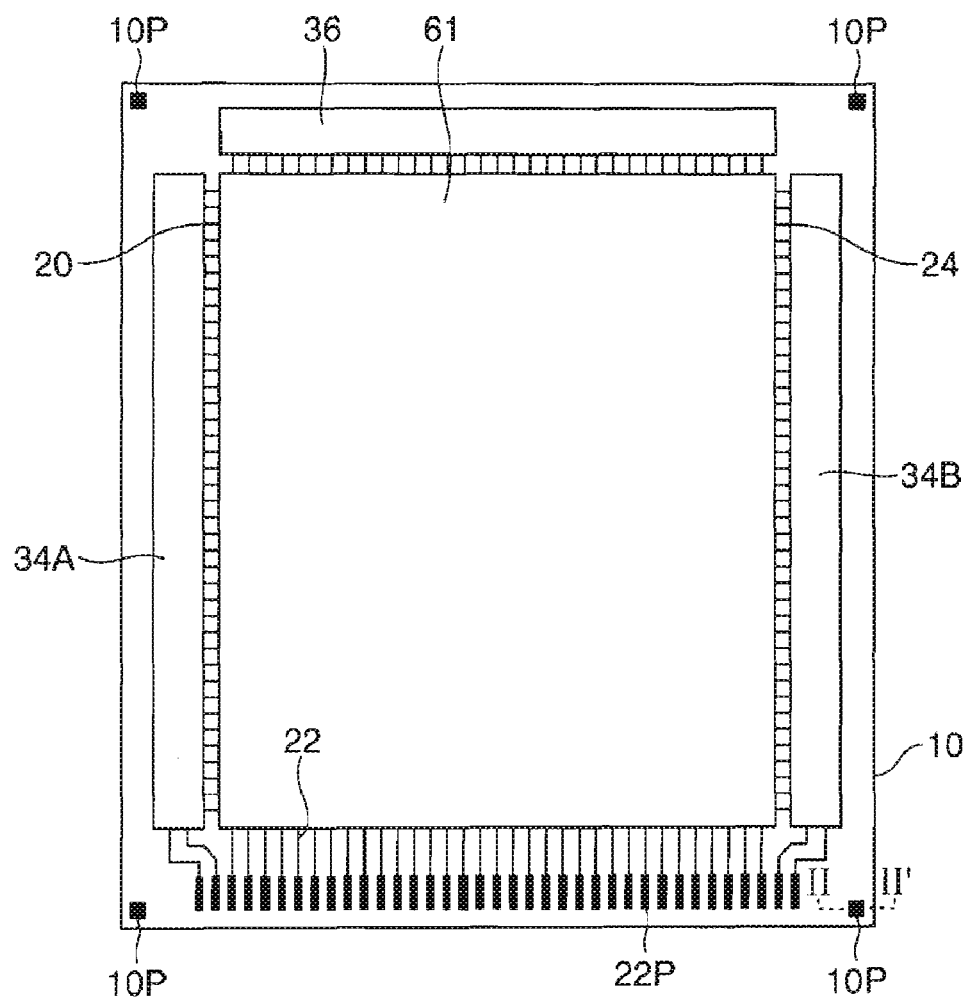
FIG. 34 is a principal part plan view showing the configuration of an organic EL device according to a fourth embodiment.
Figure 35:
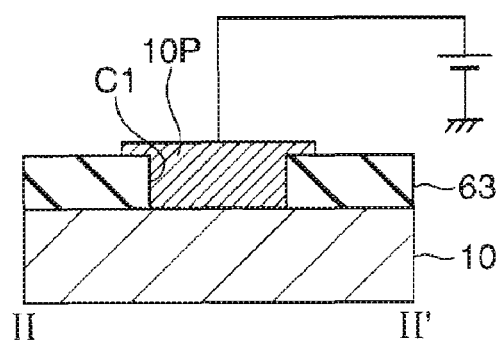
FIG. 35 is a principal part sectional view of II-II' part of FIG. 34.

FIG. 34 is a principal part plan view showing the configuration of an organic EL device according to this embodiment. FIG. 35 is a principal part sectional view taken along II-II' part of FIG. 34.

As shown in FIG. 34, in this embodiment, the EL power supply pads (10P) are formed at the four corners of the approximately rectangular conductive substrate 10. In other words, the EL power supply pads 10P are disposed on the periphery of the active matrix section 61 and in the vicinities of the four corners of the active matrix section 61. Also in this case, as in the third embodiment, the EL power supply pads 10P are disposed in and on the contact holes C1 that are openings of the insulating film 63 (see FIG. 35). Thus, when the voltage Vsub is applied to the EL power supply pads 10P, the voltage Vsub is supplied to each pixel (pixel circuit 30, more specifically, one terminal of the holding capacitance Cs or transistor DR included in the pixel circuit 30) via the conductive substrate 10 (see FIG. 3 or the like).

As described above, in this embodiment, evenness in potential among parts of the conductive substrate 10 is improved in addition to the advantage of the third embodiment because the EL power supply pads (10P) are formed at the four corners of the approximately rectangular conductive substrate 10. This makes it possible to further reduce the in-plane unevenness of the potential of the conductive substrate 10, thereby making the in-plane distribution of the luminescent brightness of the organic EL element more even. Moreover, the display performance of the device can be improved.

Figure 36:
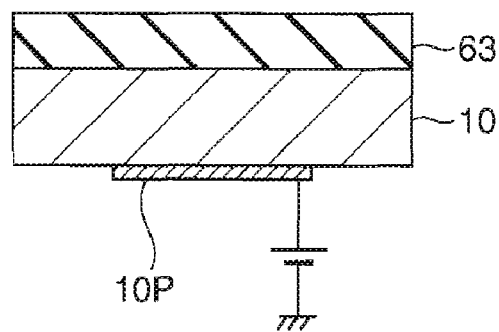
FIG. 36 is a principal part plan view showing another configuration of the organic EL device according to the fourth embodiment.

In FIG. 35, the EL power supply pads 10P are disposed in and on the contact holes C1 that are openings of the insulating film 63 so that the EL power supply pads 10P are taken out of the front surface (on which the pixels are formed) of the conductive substrate 10. As shown in FIG. 36, the EL power supply pads 10P may be formed on the back surface of the conductive substrate 10. FIG. 36 is a principal part sectional view showing another configuration of the organic EL device according to this embodiment, and corresponds to the part II-II' in FIG. 34. In this case, it is possible to omit the process step for forming the contact hole C1, thereby simplifying the manufacturing process of the organic EL device. Moreover, this pad 10P is coupled to wiring for power supply. For example, this power supply wiring is disposed on a mount substrate (printed board, etc.), and then the conductive substrate 10 is disposed and mounted on the mount board so that the wiring and the pad 10P make contact with each other. Alternatively, without forming the pad 10P, the conductive substrate 10 may be disposed and mounted on the mount board so that the power supply wiring and a part of the conductive substrate 10 make contact with each other. As described above, this embodiment includes a process step for coupling a part of the back surface of the conductive substrate and the power supply wiring (external wiring), in addition to the process step for forming a pixel described in detail in the second embodiment and the like. This configuration (process step) allows power to be easily supplied to the conductive substrate.

Fifth Embodiment

In the third and fourth embodiments, the driver 36 for supplying a control signal to each signal line 22 is disposed along an edge of the active matrix section 61 extending in the x direction, and the signal supply line pads 22P are disposed along an edge opposite to this edge. In this embodiment, the driver 36 and pads 36P to be coupled to the driver 36 are disposed on the same side. Moreover, a plurality of EL power supply pads 10P are disposed along each edge of the approximately rectangular conductive substrate 10. Description will be made below referring to the drawings. Like reference numerals are given to the same elements as those in the second embodiment, and detailed description on those elements will be omitted. As described in the second embodiment, the method for connecting the pixels, the drive circuit provided inside each pixel, the transistors included in the drive circuit, and the like can take various forms also in this embodiment.

Figure 37:
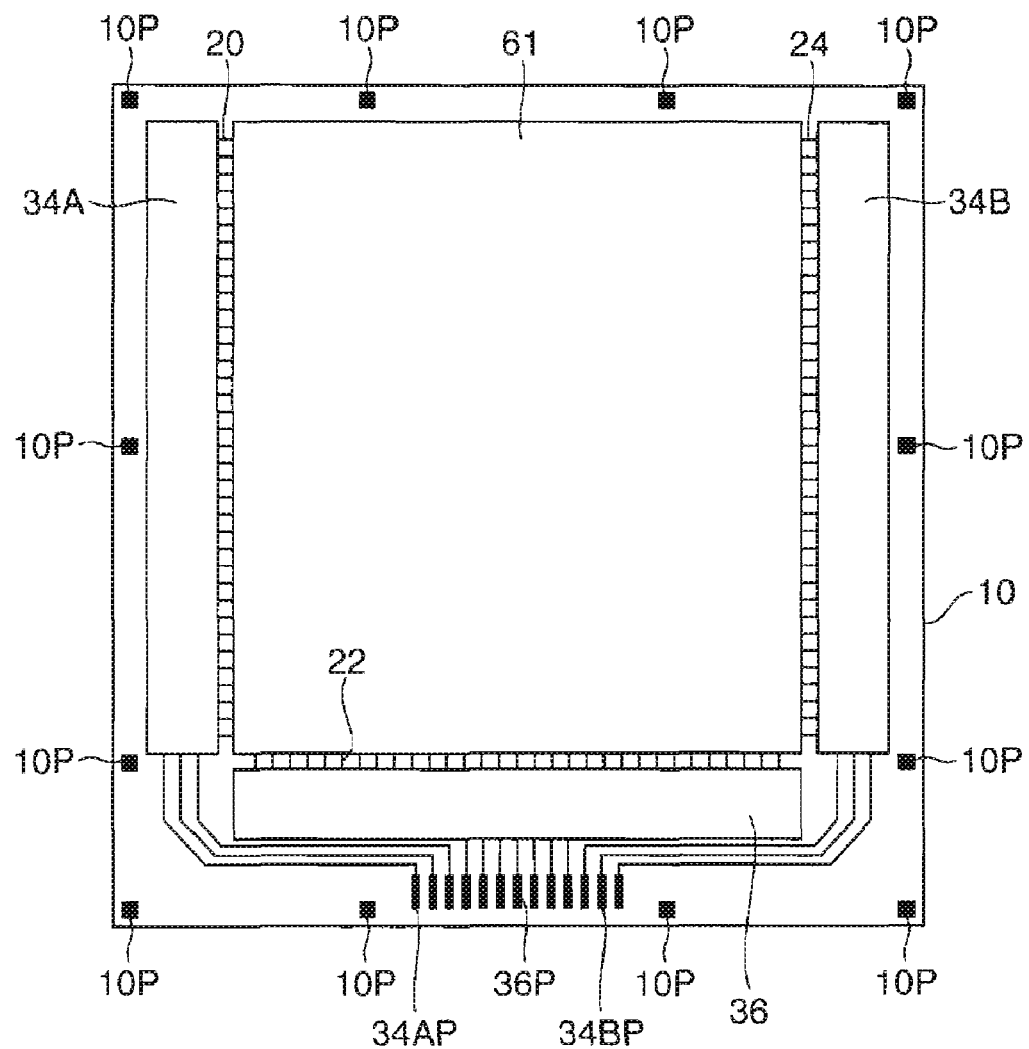
FIG. 37 is a principal part plan view showing the configuration of an organic EL device according to a fifth embodiment.

FIG. 37 is a principal part plan view showing the configuration of the organic EL device according to this embodiment. In this embodiment, as shown in the drawing, a plurality of EL power supply pads 10P are disposed around the perimeter of the approximately rectangular conductive substrate 10. In other words, a plurality of EL power supply pads 10P are disposed along the edges of the conductive substrate 10 between the periphery of the active matrix 61 and the edges of the conductive substrate 10. In this case, the EL power supply pads 10P may be disposed at the four corners of the approximately rectangular conductive substrate 10 and further a plurality of the EL power supply pads 10P (two pieces in the case of FIG. 37) may be disposed between the EL power supply pads 10P disposed at the four corners. The positions of the EL power supply pads 10P may be adjusted so that the EL power supply pads 10P are disposed at equal intervals. As a matter of course, the positions of the EL power supply pads 10P may be adjusted with respect to other pads.

As described above, according to this embodiment, evenness in potential among parts of the conductive substrate 10 is improved in addition to the advantage of the fourth embodiment. This makes it possible to further reduce in-plane unevenness of the potential of the conductive substrate 10, thereby making the in-plane distribution of the luminescent brightness of the organic EL element more even. Moreover, the display performance of the device can be improved.

Moreover, in this embodiment, the driver 36 and pads 36P may be coupled to the driver 36 are disposed on the same side. Specifically the driver 36 is disposed along an edge of the approximately rectangular conductive substrate 10 extending in the x direction, and further the pads 36P to be coupled to the driver 36 are disposed outside the driver 36. These pads 36P are coupled to the signal lines 22 via the driver 36.

As described above, it is possible to optimize the layout and thereby to achieve size-reduction or high integration of the organic EL device, for example, by disposing the driver 36 at the position of the common power supply line 73A described referring to FIG. 33.

Sixth Embodiment

Figure 38:
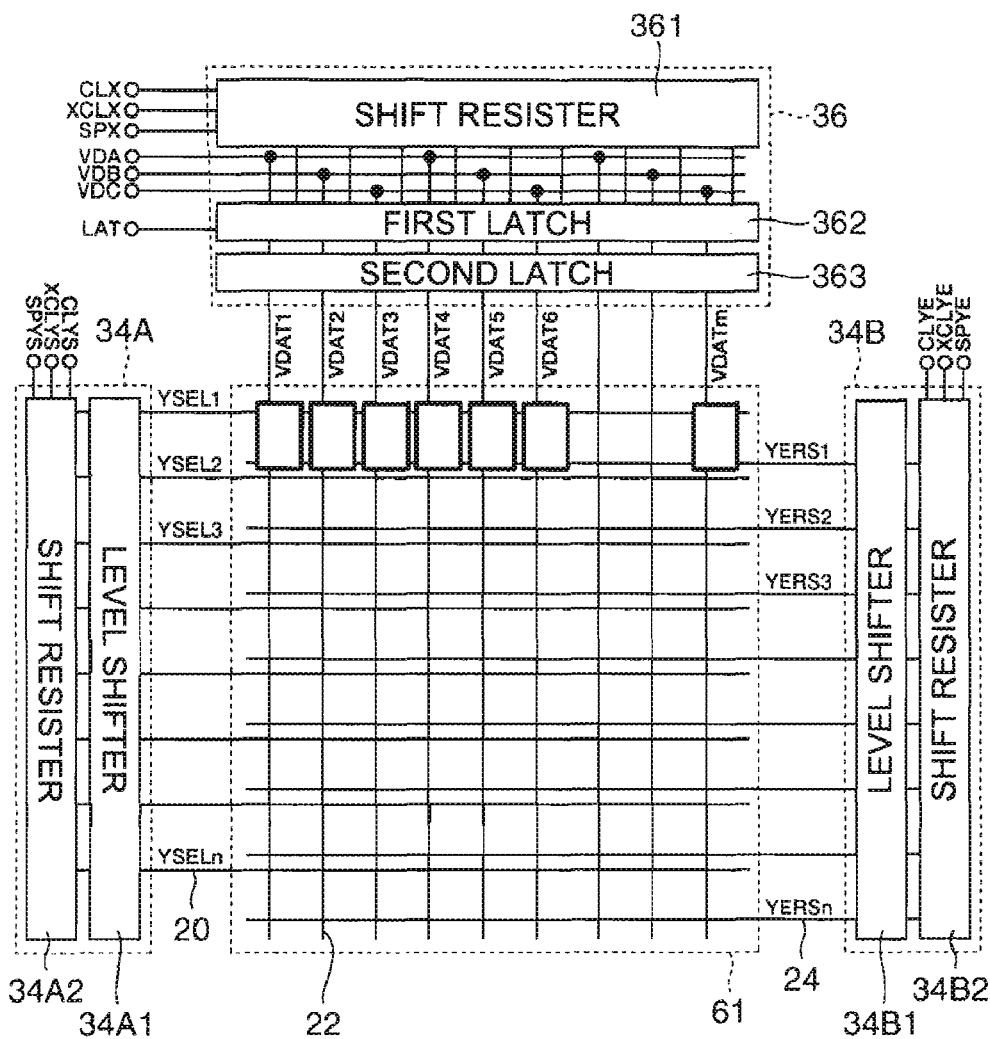
FIG. 38 is an example of a circuit diagram showing the configuration of the organic EL device.
Figure 39:
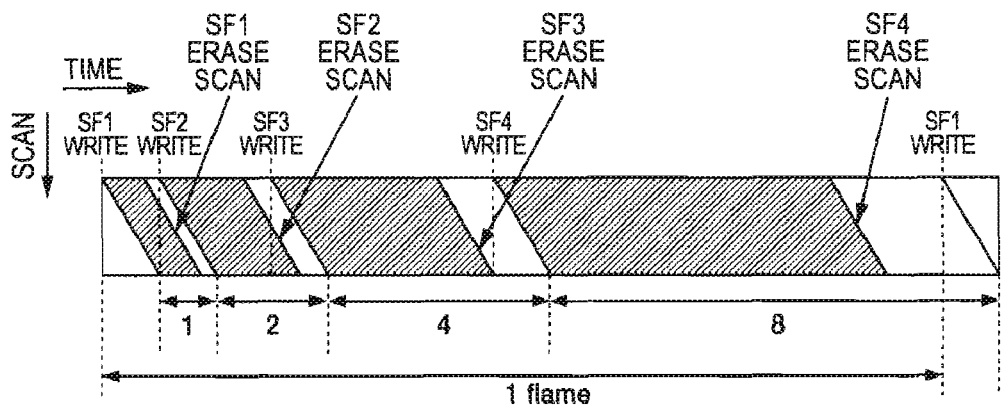
FIG. 39 is an example of a timing chart showing operations of the organic EL device.

Hereafter, a more detailed configuration and operations of the organic EL device will be described. FIG. 38 is an example of the circuit diagram showing the configuration of the organic EL device. FIG. 39 is an example of a timing chart showing operations of the organic EL device.

As shown in FIG. 38, disposed around the active matrix section 61 are the write scan driver 34A for supplying a control signal to each scan line 20, the erase scan driver 34B for supplying a control signal to each reset signal 24, and the driver (data driver) 36 for supplying a control signal to each signal line 22. The connections between these components and each pixel (pixel circuit 30 and organic EL element 32) have been described referring to FIG. 17, FIG. 3 of the first embodiment, and the like.

VDAT1 to VDATm represent output signals from the data driver 36, YSEL1 to YSELn represent output signals from the write scan driver 34A, and YERS1 to YERSn represent output signals from the erase scan driver 34B.

The write scan driver 34A has a level shifter 34A1 and a shift register 34A2, which are coupled to each other by various types of wiring. Inputted to the shift register 34A2 are a clock signal CLYS for write scan driver, a clock inversion signal XCLYS for write scan driver, and a start pulse SPYS for write scan driver. The level shifter 34A1 of the write scan driver 34A sequentially selects the scan lines 20 (YSEL1 to YSELn), and the potential of the scan line 20 selected by the shift register 34B2 rises.

The erase scan driver 34B includes a level shifter 34B1 and a shift register 34B2, which are coupled to each other by various types of wiring. Inputted to the shift register 34B2 are a clock signal CLYE for erase scan driver, a clock inversion signal XCLYE for write scan driver, and a start pulse SPYE for write scan driver. The level shifter 34B1 of the erase scan driver 34B sequentially selects the reset lines 24 (YERS1 to YERSn), and the potential of the reset line 24 selected by the shift register 34A2 rises.

The driver 36 (data driver) has a shift register 361, a first latch circuit 362, and a second latch circuit 363, which are coupled to each other by various types of wiring. Inputted to the shift register 361 are a clock signal CLX for data driver, a clock inversion signal XCLX for data driver, and a start pulse SPX for data driver. Inputted to the first latch circuit 362 are signals from the shift register 361, and various data signals (digital voltage signal) VDA, VDB, and VDC. Also inputted to the first latch circuit 362 is a latch transfer signal LAT. The shift register 361 of the driver 36 (data driver) sequentially drives the signal lines 22 (VDAT1 to VDATm).

Rectangles located at the intersections of the signal lines 20 and scan lines 20 in the diagram represent pixels (pixel circuit 30 and organic EL element 32). A part of the pixels is not shown.

Now, the operations of the abovedescribed organic EL device will be described with reference to FIG. 39. In FIG. 39, the transverse direction represents time, and the vertical direction represents the aspect of selection of the scan line. As shown in the diagram, one frame includes a plurality of subframes SF (four sub-frames in the case of FIG. 39). For example, assigning weights (changes) to the light-emitting periods of sub-frames SF1 to SF4 so that SF1:SF2:SF3:SF4=1:2:4:8 (4 bits) allows halftones be represented. In this case, 4×4=16 halftones can be displayed. If three colors, red (R), green (G), and blue (B), are used for display, 4096 colors, which is the cubic of 16 levels of halftone, can be represented.

Now operations in the sub-frames SF1 to SF4 will be described. First, the selected scan line (YSEL) 20 becomes active, and a data signal (VDAT) that represents light-emission/non-light-emission is written to each pixel via the signal line 22. This determines light-emission/non-light-emission of each color. After a given time, the reset line 24 (YERS) becomes active, and thereby each pixel terminates (lights out) light-emission. Repeating such a series of operations a plurality of times for each frame (four times in SF to SF4 in the case of FIG. 39) and assigning weights to the periods (light-emitting time) of the sub-frames allows halftones to be represented.

Thus, a digital signal ("1" or "0") is supplied to the signal line 22 in the organic EL device described above. Therefore, for example, the transistor DR for current control shown in FIG. 3 of the first embodiment and the like completely becomes on or off. Thus, as apparent also from FIG. 17 and the like, at the time of light emission when the transistor DR becomes on, the potential Vsub is supplied to the organic EL element 32. Therefore, if there is unevenness in the potential Vsub, there occurs a difference in degree of the light emission, thereby failing to secure a predetermined luminescent brightness. Moreover, as described above, when representation of halftones is intended, it will not be possible to represent predetermined color tones in the end if the degree of unevenness in luminescent brightness becomes larger than the difference in halftone level.

Therefore, when using the digital drive organic EL device, particularly, the drive method for representing halftones, it is effective to apply the second to fifth embodiments described above. That is, it is possible to make the in-plane distribution of the luminescent brightness of the organic EL element more even and thereby to represent predetermined color tones by supplying power to each pixel via the conductive substrate 10. Moreover, it is possible to make the in-plane distribution of the luminescent brightness of the organic EL element more even and thereby to represent predetermined color tones, by coming up with the positions of the pads on the substrate 10 and thereby controlling changes in the in-plane potential of the substrate.

While digital drive has been described in this embodiment, it is also effective to apply this embodiment to an analog drive organic EL device. For example, when designing an analog drive organic EL device, the fall of the potential Vsub is considered. That is, the drive circuits and the performance of devices included in these circuits are set so as not to be affected by changes in the potential Vsub, by previously setting the potential Vsub to a high value. However, applying the second to sixth embodiments allows the fall of the potential Vsub to be reduced, so the potential Vsub can previously be set to a lower value. In other words, it is possible to achieve a low potential drive organic EL device. Moreover, energy consumption of the organic EL device can be reduced.

While various examples of the structure and drive of the organic EL element have been described in this embodiment, it is also possible to widely apply this embodiment to organic EL elements in which a common potential is supplied to each pixel. That is, it is possible to supply that potential via the conductive substrate.

Concrete Examples of Electronic Apparatus Including Organic EL Device

Now concrete examples of an electronic apparatus including the organic EL device described above will be explained.

Figure 40A:
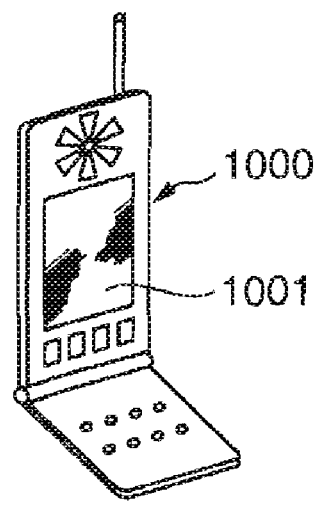
FIGS. 40A to 40C are oblique perspective views showing concrete examples of an electronic apparatus.
Figure 40B:
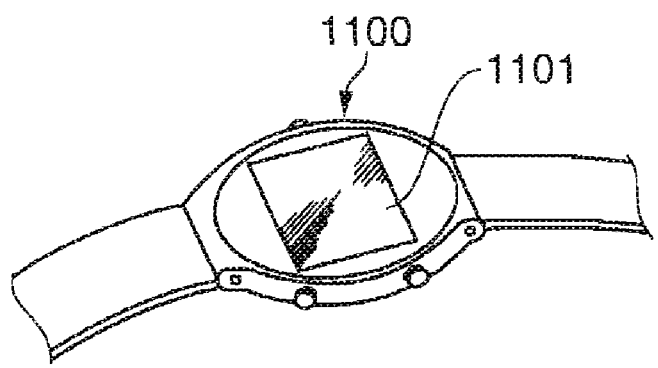
Figure 40C:
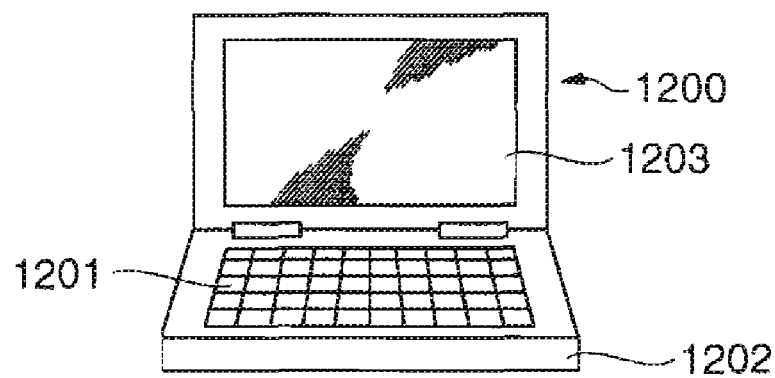

FIGS. 40A and 40C are exploded perspective views showing concrete examples of an electronic apparatus including an organic EL device as a display. FIG. 40A is a perspective view showing a cellular phone that is an example of an electronic apparatus. This cellular phone 1000 includes a display panel 1001 having an organic EL device according to the embodiments. FIG. 40B is an exploded perspective view showing a watch that is an example of an electronic apparatus. This watch 1100 includes a display panel 1101 having an organic EL device according to the embodiments. FIG. 40C is an exploded perspective view showing a portable data processor 1200 that is an example of an electronic apparatus. This portable data processor 1200 includes an input unit 1201 such as a keyboard, a main body 1202 in which an operation means or a storage means is stored, and a display 1203 having an organic EL device according to the embodiments.

The invention is not limited to the embodiments described above, and various modifications can be made to those embodiments without departing from the scope and spirit of the invention.

The entire disclosure of Japanese Patent Application Nos: 2006-072040, filed Mar. 16, 2006, 2006-069827, filed Mar. 14, 2006, 2006-118220, filed Apr. 21, 2006 and 2006-352679, filed Dec. 27, 2006, are expressly incorporated by reference herein.

What is claimed is:

1. An organic electroluminescent device comprising:
a substrate, at least a first surface of the substrate having conductivity;
a common electrode;
a first insulating film interposed between the substrate and the common electrode, the first insulating film including a portion of a first opening, a portion of a second opening;
a semiconductor film interposed between the first insulating film and the common electrode, the semiconductor film receiving a current from the first surface of the substrate via the portion of a first opening;
a second insulating film interposed between the semiconductor film and the common electrode, at least a part of the second insulating film being in contact with the first surface of the substrate via the portion of a second opening;

a capacitance electrode interposed between the second insulating film and the common electrode, the capacitance electrode sandwiching the part of the second insulating film with the first surface of the substrate via the portion of a second opening;

a gate electrode interposed between the second insulating film and the common electrode, the gate electrode overlapping the semiconductor film;

an intermediate insulating film interposed between the capacitance electrode and the common electrode, the intermediate insulating film interposed between the gate electrode and the common electrode;

a pixel electrode interposed between the intermediate insulating film and the common electrode, the pixel electrode receiving a current via the semiconductor film;

a light-emitting layer interposed between the pixel electrode and the common electrode; and a power supply section supplying a current to the first surface of the substrate, the first insulating film interposed between the substrate and the power supply section.

2. The organic electroluminescent device according to claim 1, further comprising:

an active matrix section provided on the substrate, the active matrix section including:
a scan line;
a signal line intersecting the scan line; and
the semiconductor film located so as to correspond to an intersection of the scan line and the signal line;

a scan driver located in a region between a perimeter of the substrate and a perimeter of the active matrix section, the scan driver supplying a control signal to the scan line; and a data driver located in the region between the perimeter of the substrate and the perimeter of the active matrix section, the data driver supplying a control signal to the signal line, the power supply section being located in the region between the perimeter of the substrate and the perimeter of the active matrix section.

3. The organic electroluminescent device according to claim 2, wherein the power supply section is located between the perimeter of the substrate and the scan driver.

4. The organic electroluminescent device according to claim 2, wherein:
the power supply section includes a plurality of power supply sections; and
the plurality of power supply sections are located at four corners of the substrate.

5. The organic electroluminescent device according to claim 2, wherein:
the power supply section includes a plurality of power supply sections; and
the plurality of power supply sections are located at equal intervals.

6. An organic electroluminescent device comprising:
a substrate, the substrate being conductive at least on a first surface;
a first insulating film located on the first surface of the substrate, the first insulating film including a portion of a second opening;
a semiconductor film located on the first insulating film;
a second insulating film located on the semiconductor film, the second insulating film being in contact with the substrate via the portion of a second opening;
a capacitance electrode located on the second insulating film;
a gate electrode located on the second insulating film, the gate electrode overlapping the semiconductor film;
an intermediate insulating film located on the gate electrode and capacitance electrode;
a pixel electrode located on the intermediate insulating film, the pixel electrode receiving a current via the semiconductor film;
a light-emitting layer located on the pixel electrode; and
a common electrode located on the light-emitting layer,
the second insulating film being interposed between the capacitance electrode and the substrate via the portion of a second opening.

7. The organic electroluminescent device according to claim 1, wherein the substrate is a conductive substrate.

8. The organic electroluminescent device according to claim 1, wherein the substrate is made of stainless steel.

9. The organic electroluminescent device according to claim 1, wherein:
the substrate includes an insulating substrate and a conductive film; and
the conductive film is located on the first surface of the substrate.

10. An organic electroluminescent device comprising:
a substrate, the substrate being conductive at least on a first surface;
a first insulating film located on a first surface of the substrate, the first insulating film including a portion of a first opening;
a semiconductor film located on the first insulating film, the semiconductor film receiving a current from the first surface of the substrate via the portion of a first opening;
a second insulating film located on the semiconductor film;
a gate electrode located on the second insulating film, the gate electrode overlapping the semiconductor film;
an intermediate insulating film located on the gate electrode;
a pixel electrode located on the intermediate insulating film, the pixel electrode receiving a current via the semiconductor film;
a light-emitting layer located on the pixel electrode; and
a common electrode located on the light-emitting layer,
a power supply section, the power supply section supplying a current to a plurality of positions on a second surface of the substrate.

11. The organic electroluminescent device according to claim 10, further comprising:
a capacitance electrode located between the second insulating film and the intermediate insulating film, wherein:
the first insulating film further includes a portion of a second opening;
the second insulating film is in contact with the substrate via the portion of a second opening; and
the second insulating film is interposed between the capacitance electrode and the substrate via the portion of a second opening so as to form a capacitor.

12. The organic electroluminescent device according to claim 10, further comprising:
an active matrix section provided on the substrate, the active matrix section including:
a scan line;
a signal line intersecting the scan line; and
the semiconductor film located so as to correspond to an intersection of the scan line and the signal line;
a scan driver disposed at a position overlapping a region between a perimeter of the substrate and a perimeter of the active matrix section, the scan driver supplying a control signal to the scan line; and a data driver disposed at a position overlapping the region between the perimeter of the substrate and the perimeter of the active matrix section, the data driver supplying a control signal to the signal line, the power supply section being disposed at a position overlapping the region between the perimeter of the substrate and the perimeter of the active matrix section.

13. The organic electroluminescent device according to claim 12, wherein the power supply section is disposed so as to overlap a region located between the perimeter of the substrate and the scan driver.

14. The organic electroluminescent device according to claim 12, wherein:

the power supply section includes a plurality of power supply sections; and the plurality of power supply sections are located at four corners of the substrate.

15. The organic electroluminescent device according to claim 12, wherein:

the power supply section includes a plurality of power supply sections; and the plurality of power supply sections are located at equal intervals.

16. An electronic apparatus comprising the organic electroluminescent device according to claim 1.

* * * * *